(12) United States Patent
Hirasawa et al.

(10) Patent No.: US 10,094,522 B2
(45) Date of Patent: Oct. 9, 2018

(54) LIGHT-EMITTING DEVICE HAVING PHOTOLUMINESCENT LAYER

(71) Applicant: Panasonic Intellectual Property Management Co., Ltd., Osaka (JP)

(72) Inventors: Taku Hirasawa, Kyoto (JP); Yasuhisa Inada, Osaka (JP); Akira Hashiya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 77 days.

(21) Appl. No.: 15/446,453

(22) Filed: Mar. 1, 2017

(65) Prior Publication Data
US 2017/0284609 A1 Oct. 5, 2017

(30) Foreign Application Priority Data

Mar. 30, 2016 (JP) .................. 2016-067153

(51) Int. Cl.
*F21V 9/30* (2018.01)
*F21K 9/64* (2016.01)
(Continued)

(52) U.S. Cl.
CPC .................. *F21K 9/64* (2016.08); *F21V 9/14* (2013.01); *F21V 9/30* (2018.02); *H01L 33/505* (2013.01);
(Continued)

(58) Field of Classification Search
CPC ..... F21K 9/64; F21V 9/30; F21V 9/14; F21V 9/32; F21V 1/17; F21V 3/08;
(Continued)

(56) References Cited

U.S. PATENT DOCUMENTS

| 5,517,039 A | 5/1996 | Holonyak, Jr. et al. |
| 5,732,102 A | 3/1998 | Bouadma |

(Continued)

FOREIGN PATENT DOCUMENTS

| JP | 9-073807 | 3/1997 |
| JP | 11-283751 | 10/1999 |

(Continued)

OTHER PUBLICATIONS

Non-Final Office Action issued in U.S. Appl. No. 15/169,771, dated Aug. 16, 2017.

(Continued)

*Primary Examiner* — Bao Q Truong
(74) *Attorney, Agent, or Firm* — McDermott Will & Emery LLP

(57) ABSTRACT

A light-emitting device comprises a layered structure between a first layer and a second layer. The first layer has a refractive index n1 for first light having a wavelength $\lambda_a$ in air. The second layer has a refractive index n2 for the first light. The layered structure comprises: a photoluminescent layer having a first surface facing the first layer and a second surface facing the second layer; and a surface structure disposed on at least one selected from the group consisting of the first surface and the second surface of the photoluminescent layer. The refractive index n1 and the refractive index n2 are lower than a refractive index $n_{wav-a}$ of the photoluminescent layer for the first light. The layered structure has an effective thickness to more strongly emit TE polarized light than TM polarized light.

22 Claims, 59 Drawing Sheets

(51) Int. Cl.
- *F21V 9/14* (2006.01)
- *H01L 33/50* (2010.01)
- *H01L 33/54* (2010.01)
- *H01L 33/58* (2010.01)
- *F21Y 115/10* (2016.01)

(52) U.S. Cl.
CPC .......... *H01L 33/507* (2013.01); *H01L 33/508* (2013.01); *H01L 33/54* (2013.01); *H01L 33/58* (2013.01); *F21Y 2115/10* (2016.08)

(58) Field of Classification Search
CPC ... H01L 33/505; H01L 33/507; H01L 33/508; H01L 33/54; H01L 33/58; F21Y 2115/10; G02B 6/0035; G02B 6/0036; G02B 6/0038; G02B 6/0056; G02B 27/283; G02F 1/133; G02F 1/13362

See application file for complete search history.

(56) References Cited

U.S. PATENT DOCUMENTS

| | | | |
|---|---|---|---|
| 6,728,034 B1 | 4/2004 | Nakanishi et al. | |
| 7,619,357 B2 | 11/2009 | Onishi et al. | |
| 7,699,482 B2 | 4/2010 | Noguchi | |
| 8,227,966 B2 | 7/2012 | Wakabayashi et al. | |
| 8,619,363 B1 | 12/2013 | Coleman | |
| 9,158,215 B2 | 10/2015 | Yu | |
| 9,515,239 B2 | 12/2016 | Inada et al. | |
| 9,618,697 B2 * | 4/2017 | Inada | G02B 6/1225 |
| 9,890,912 B2 * | 2/2018 | Hashiya | F21K 9/64 |
| 2002/0180348 A1 | 12/2002 | Oda et al. | |
| 2003/0021314 A1 | 1/2003 | Yoshida et al. | |
| 2003/0169792 A1 | 9/2003 | Kim | |
| 2004/0141108 A1 | 7/2004 | Tanaka et al. | |
| 2004/0233534 A1 | 11/2004 | Nakanishi et al. | |
| 2006/0039433 A1 | 2/2006 | Simpson | |
| 2006/0088066 A1 | 4/2006 | He | |
| 2007/0031097 A1 | 2/2007 | Heikenfeld et al. | |
| 2007/0103931 A1 | 5/2007 | Lee et al. | |
| 2007/0138479 A1 | 6/2007 | Yamazaki et al. | |
| 2007/0153860 A1 | 7/2007 | Chang-Hasnain et al. | |
| 2008/0069497 A1 | 3/2008 | Tissot et al. | |
| 2008/0089089 A1 | 4/2008 | Hama et al. | |
| 2008/0149916 A1 | 6/2008 | Baba et al. | |
| 2008/0258160 A1 | 10/2008 | Do | |
| 2008/0303419 A1 | 12/2008 | Fukuda | |
| 2009/0021153 A1 | 1/2009 | Lee et al. | |
| 2009/0040598 A1 | 2/2009 | Ito | |
| 2009/0040745 A1 | 2/2009 | Nemchuk | |
| 2009/0066241 A1 | 3/2009 | Yokoyama | |
| 2009/0129115 A1 | 5/2009 | Fine et al. | |
| 2009/0190068 A1 | 7/2009 | Kawamura | |
| 2009/0206325 A1 | 8/2009 | Biwa et al. | |
| 2009/0267092 A1 | 10/2009 | Fukshima et al. | |
| 2009/0286337 A1 | 11/2009 | Lee et al. | |
| 2010/0074284 A1 | 3/2010 | Aizawa et al. | |
| 2010/0142189 A1 | 6/2010 | Hong et al. | |
| 2010/0164365 A1 | 7/2010 | Yoshino et al. | |
| 2010/0246210 A1 | 9/2010 | Yashiro | |
| 2010/0277887 A1 | 11/2010 | Su et al. | |
| 2011/0101359 A1 | 5/2011 | Kim et al. | |
| 2011/0198563 A1 | 8/2011 | Kim et al. | |
| 2011/0198645 A1 | 8/2011 | Jo et al. | |
| 2012/0018705 A1 | 1/2012 | Takazoe et al. | |
| 2012/0106127 A1 | 5/2012 | Hattori et al. | |
| 2012/0119638 A1 | 5/2012 | Sato et al. | |
| 2012/0176766 A1 | 7/2012 | Natsumeda | |
| 2012/0224378 A1 | 9/2012 | Koike et al. | |
| 2012/0286258 A1 | 11/2012 | Naraoka et al. | |
| 2012/0292652 A1 | 11/2012 | Yamae et al. | |
| 2013/0069046 A1 | 3/2013 | Ishizuya | |
| 2013/0181195 A1 | 7/2013 | Cho et al. | |
| 2013/0208327 A1 | 8/2013 | Bolle et al. | |
| 2013/0277703 A1 | 10/2013 | Matsuzaki | |
| 2013/0308102 A1 | 11/2013 | Natsumeda et al. | |
| 2014/0022818 A1 | 1/2014 | Natsumeda et al. | |
| 2014/0071683 A1 | 3/2014 | Hamada et al. | |
| 2014/0092620 A1 | 4/2014 | Tissot | |
| 2014/0185316 A1 | 7/2014 | Kim et al. | |
| 2014/0306176 A1 | 10/2014 | Chiu et al. | |
| 2014/0362604 A1 | 12/2014 | Masuda | |
| 2015/0249183 A1 | 9/2015 | Hirasawa et al. | |
| 2015/0249186 A1 | 9/2015 | Inada et al. | |
| 2015/0249187 A1 | 9/2015 | Inada et al. | |
| 2015/0252964 A1 | 9/2015 | Takahashi et al. | |
| 2016/0265746 A1 | 9/2016 | Hirasawa et al. | |
| 2016/0265747 A1 | 9/2016 | Nagao et al. | |
| 2016/0265749 A1 | 9/2016 | Inada | |
| 2017/0012232 A1 | 1/2017 | Kataishi et al. | |
| 2017/0075169 A1 | 3/2017 | Hayama | |

FOREIGN PATENT DOCUMENTS

| | | |
|---|---|---|
| JP | 2001-059905 | 3/2001 |
| JP | 2001-155520 | 6/2001 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-097178 | 4/2010 |
| JP | 2010-199357 | 9/2010 |
| JP | 2010-210824 | 9/2010 |
| JP | 2010-231941 | 10/2010 |
| JP | 2010-237311 | 10/2010 |
| JP | 2011-166148 | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-092645 | 5/2014 |
| JP | 2014-523603 | 9/2014 |
| WO | 2007/034827 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2014/024218 | 2/2014 |
| WO | 2014/119783 | 8/2014 |
| WO | 2015/045886 | 4/2015 |

OTHER PUBLICATIONS

Non-Final Office Action issued in U.S. Appl. No. 15/214,803, dated Aug. 8, 2017.
Non-Final Office Action issued in U.S. Appl. No. 15/214,837, dated Sep. 12, 2017.
Non-Final Office Action issued in U.S. Appl. No. 15/215,595, dated Jul. 28, 2017.
Notice of Allowance issued in U.S. Appl. No. 15/215,595, dated Sep. 22, 2017.
Non-Final Office Action issued in U.S. Appl. No. 15/215,599, dated Aug. 25, 2017.
Non-Final Office Action issued in U.S. Appl. No. 15/219,462, dated Sep. 26, 2017.
Notice of Allowance issued in U.S. Appl. No. 15/169,771, dated Oct. 24, 2017.
Notice of Allowance issued in U.S. Appl. No. 15/060,564, dated Mar. 21, 2018.

(56) References Cited

OTHER PUBLICATIONS

Notice of Allowance issued in U.S. Appl. No. 15/216,686, dated Mar. 26, 2018.
Final Office Action issued in U.S. Appl. No. 15/215,592, dated Apr. 9, 2018.
Non-Final Office Action issued in U.S. Appl. No. 15/219,462, dated Feb. 28, 2018.
Non-final Office Action issued in U.S. Appl. No. 14/618,591, dated Nov. 9, 2015.
Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
International Search Report of PCT application No. PCT/JP2014/004324 dated Nov. 25, 2014.
Specification of U.S. Appl. No. 15/166,123, filed May 26, 2016.
Specification of U.S. Appl. No. 15/169,771, filed Jun. 1, 2016.
Specification of U.S. Appl. No. 15/206,273, filed Jul. 10, 2016.
Specification of U.S. Appl. No. 15/214,523, filed Jul. 20, 2016.
Specification of U.S. Appl. No. 15/214,803, filed Jul. 20, 2016.
Specification of U.S. Appl. No. 15/214,837, filed Jul. 20, 2016.
Specification of U.S. Appl. No. 15/215,592, filed Jul. 21, 2016.
Specification of U.S. Appl. No. 15/215,595, filed Jul. 21, 2016.
Specification of U.S. Appl. No. 15/215,599, filed Jul. 21, 2016.
Specification of U.S. Appl. No. 15/216,669, filed Jul. 21, 2016.
Specification of U.S. Appl. No. 15/216,686, filed Jul. 21, 2016.
Specification of U.S. Appl. No. 15/219,462, filed Jul. 26, 2016.
The Extended European Search Report dated Dec. 16, 2016 for the related European Patent Application No. 14883764.4.
Non-Final Office Action issued in U.S. Appl. No. 15/216,669, dated Apr. 14, 2017.
Non-Final Office Action issued in U.S. Appl. No. 15/060,574, dated Jan. 16, 2018.
Final Office Action issued in U.S. Appl. No. 15/214,803, dated Feb. 5, 2018.

* cited by examiner

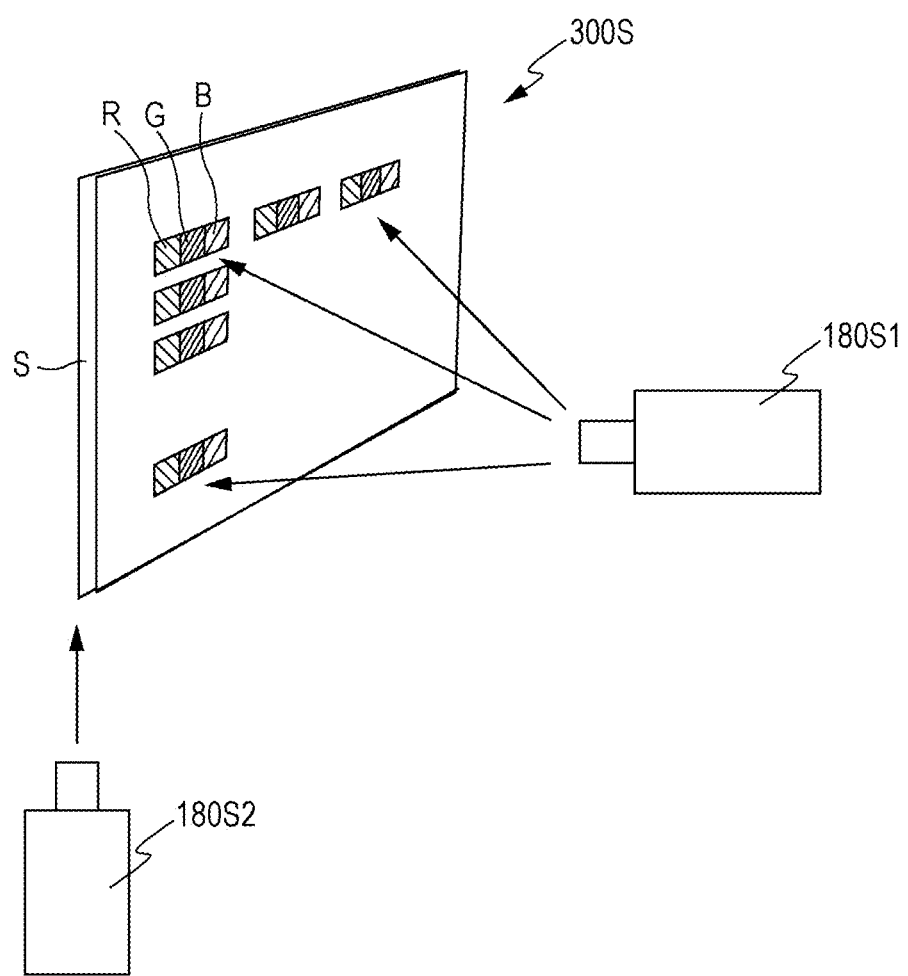

LIGHT-EMITTING DEVICE HAVING PHOTOLUMINESCENT LAYER

BACKGROUND

1. Technical Field

The present disclosure relates to a light-emitting device and more particularly to a light-emitting device having a photoluminescent layer.

2. Description of the Related Art

Optical devices, such as lighting fixtures, displays, and projectors, that emit light in a necessary direction are required for many applications. Photoluminescent materials, such as those used for fluorescent lamps and white light-emitting diodes (LEDs), emit light in all directions. Thus, such materials are generally used in combination with an optical element, such as a reflector or lens, to emit light only in a particular direction. For example, Japanese Unexamined Patent Application Publication No. 2010-231941 discloses a lighting system including a light distributor and an auxiliary reflector to provide sufficient directionality.

SUMMARY

In one general aspect, the techniques disclosed here feature a light-emitting device comprises a layered structure between a first layer and a second layer. The first layer has a refractive index n1 for first light having a wavelength $\lambda_a$ in air. The second layer has a refractive index n2 for the first light. The layered structure comprises: a photoluminescent layer having a first surface facing the first layer and a second surface facing the second layer; and a surface structure disposed on at least one selected from the group consisting of the first surface and the second surface of the photoluminescent layer. The photoluminescent layer emits the first light upon receiving excitation light. The surface structure has projections and recesses. The refractive index n1 and the refractive index n2 are lower than a refractive index $n_{wav-a}$ of the photoluminescent layer for the first light and satisfy a relationship n1>n2. The layered structure has an effective thickness to more strongly emit TE polarized light than TM polarized light.

It should be noted that general or specific embodiments may be implemented as a device, an apparatus, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 56D is a schematic cross-sectional view of still another light-emitting apparatus having improved heat dissipation characteristics;

FIG. 57A is a schematic cross-sectional view of a light-emitting device including a thermally conductive member;

FIG. 57B is a plan view of the light-emitting device illustrated in FIG. 57A;

FIG. 57C is a schematic cross-sectional view of another light-emitting device including a thermally conductive member;

FIG. 57D is a plan view of the light-emitting device illustrated in FIG. 57C;

FIG. 58A is a schematic cross-sectional view of an arrangement of thermally conductive members in tiled light-emitting devices;

FIG. 58B is a plan view of the light-emitting device illustrated in FIG. 58A;

FIG. 59A is a schematic view of a light-emitting apparatus including an interlock circuit;

FIG. 59B is a schematic view of the configuration of a light-emitting apparatus including an interlock circuit;

FIG. 60A is an explanatory view of a method for forming a submicron structure with beads;

FIG. 60B is a second figure illustrating a method for forming a submicron structure with beads;

FIG. 60C is a schematic view of an example of packing of beads and a light scattering pattern of the packed beads;

Figure 60A:
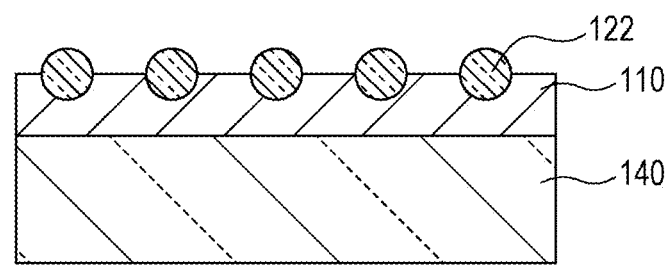
Figure 60B:
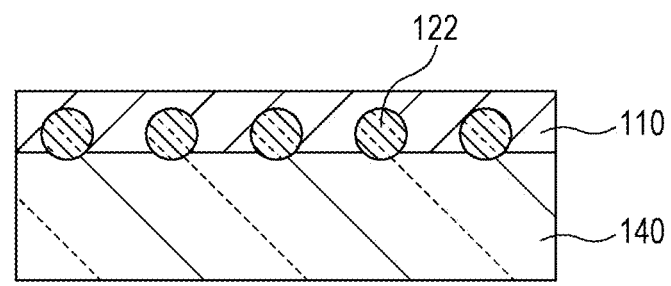
Figure 60C:
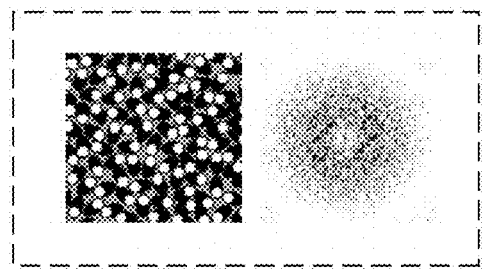
Figure 60D:
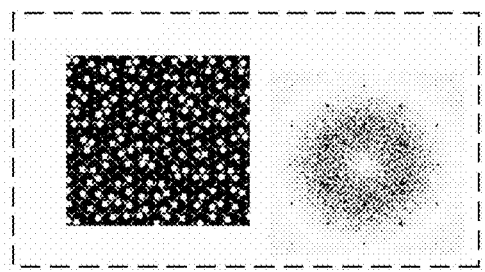
Figure 60E:
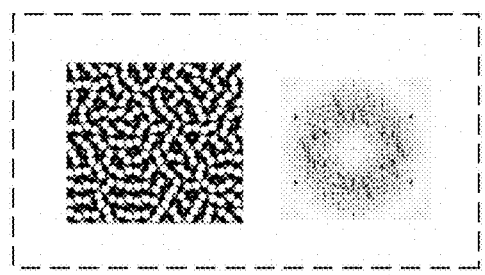
Figure 60F:
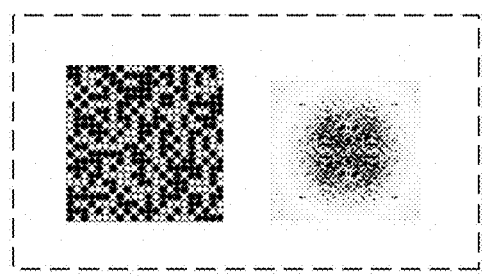

FIG. 60D is a schematic view of another example of packing of beads and a light scattering pattern of the packed beads;

FIG. 60E is a schematic view of still another example of packing of beads and a light scattering pattern of the packed beads;

FIG. 60F is a schematic view of still another example of packing of beads and a light scattering pattern of the packed beads; and FIG. 61 is a schematic view of the structure of a transparent display unit that includes a light-emitting device according to the present disclosure as a screen.

DETAILED DESCRIPTION

A light-emitting device according to an embodiment of the present disclosure has a layered structure that includes a photoluminescent layer and a surface structure. The photoluminescent layer is disposed between a first layer having a refractive index n1 for first light having a wavelength $\lambda_a$ in air and a second layer having a refractive index n2 for the first light and has a first surface facing the first layer and a second surface facing the second layer. The photoluminescent layer emits the first light upon receiving excitation light. The surface structure is disposed on at least one selected from the group consisting of the first surface and the second surface of the photoluminescent layer and has projections and recesses. The refractive index n1 and the refractive index n2 are lower than the refractive index $n_{wav-a}$ of the photoluminescent layer for the first light and satisfy the relationship n1>n2. The layered structure has an effective thickness to more strongly emit TE polarized light than TM polarized light. According to the forementioned structure, the directivity can be improved because TM polarized light can be selectively strongly emitted.

A portion of the first layer and/or a portion of the second layer may be disposed in the recesses. The effective thickness $t_{eff}$ may satisfy the following relational expressions (1) and (2), wherein $t_{wav}$ denotes the thickness of the photoluminescent layer, h denotes the thickness of the surface structure, $n_p$ denotes the refractive index of the surface structure for the first light, $R_v$ denotes the ratio of the volume of the recesses to the volume of the projections and the volume of the recesses, and m is an integer.

$$\frac{\lambda_a}{2\pi\sqrt{n_{wav-a}^2 - n1^2}}\left[\tan^{-1}\left(\sqrt{\frac{n1^2 - n2^2}{n_{wav-a}^2 - n1^2}}\right) + m\pi\right] < t_{eff} < \qquad (1)$$

$$\frac{\lambda_a}{2\pi\sqrt{n_{wav-a}^2 - n1^2}}\left[\tan^{-1}\left(\frac{n_{wav-a}^2}{n2^2}\sqrt{\frac{n1^2 - n2^2}{n_{wav-a}^2 - n1^2}}\right) + m\pi\right]$$

-continued $$t_{\textit{eff}} = t_{wav} + (1 - R_v) \cdot h \cdot \frac{n_p}{n_{wav-a}} \qquad (2)$$

A portion of the first layer and/or a portion of the second layer may be disposed in the recesses. The photoluminescent layer may include discrete belt-like portions. The surface structure may be disposed on the belt-like portions. The effective thickness $t_{\textit{eff}}$ may satisfy the following relational expressions (3) and (4), wherein $t_{wav}$ denotes the thickness of the belt-like portions, h denotes the thickness of the surface structure, $n_p$ denotes the refractive index of the surface structure for the first light, $R_v$ denotes the ratio of the volume of the recesses to the volume of the projections and the volume of the recesses, and m is an integer.

$$\frac{\lambda_a}{2\pi\sqrt{n_{wav-a}^2 - n1^2}} \left[ \tan^{-1}\left( \sqrt{\frac{n1^2 - n2^2}{n_{wav-a}^2 - n1^2}} \right) + m\pi \right] < t_{\textit{eff}} < \qquad (3)$$

$$\frac{\lambda_a}{2\pi\sqrt{n_{wav-a}^2 - n1^2}} \left[ \tan^{-1}\left( \frac{n_{wav-a}^2}{n2^2} \sqrt{\frac{n1^2 - n2^2}{n_{wav-a}^2 - n1^2}} \right) + m\pi \right]$$

$$t_{\textit{eff}} = t_{wav} + (1 - R_v) \cdot h \cdot \frac{n_p}{n_{wav-a}} \qquad (4)$$

According to the forementioned structure, it is possible to provide a light-emitting device that has a high directivity in a plane having a normal perpendicular to the direction in which a projection of the surface structure extends.

A light-emitting device according to another embodiment of the present disclosure has a layered structure that includes a light guiding layer and a surface structure. The light guiding layer is disposed between a first layer having a refractive index n1 for first light having a wavelength $\lambda_a$ in air and a second layer having a refractive index n2 for the first light and has a first surface facing the first layer and a second surface facing the second layer. The surface structure is disposed on at least one selected from the group consisting of the first surface and the second surface of the light guiding layer and has projections and recesses. The light guiding layer includes a photoluminescent layer that emits the first light upon receiving excitation light and an intermediate layer disposed between the surface structure and the photoluminescent layer. The photoluminescent layer has a refractive index $n_{wav-a}$ for the first light. The intermediate layer has a refractive index $n_m$ for the first light. The refractive index n1 and the refractive index n2 are lower than the refractive index of the light guiding layer for the first light and satisfy the relationship n1>n2. The layered structure has an effective thickness to more strongly emit TE polarized light than TM polarized light. According to the forementioned structure, the directivity can be improved because TM polarized light can be selectively strongly emitted.

A portion of the first layer and/or a portion of the second layer may be disposed in the recesses. The effective thickness $t_{\textit{eff}}$ may satisfy the following relational expressions (5) and (6), wherein $t_{wav}$ denotes the thickness of the photoluminescent layer, h denotes the thickness of the surface structure, $t_m$ denotes the thickness of the intermediate layer, $n_p$ denotes the refractive index of the surface structure for the first light, $R_v$ denotes the ratio of the volume of the recesses to the volume of the projections and the volume of the recesses, and m is an integer.

$$\frac{\lambda_a}{2\pi\sqrt{n_{wav-a}^2 - n1^2}} \left[ \tan^{-1}\left( \sqrt{\frac{n1^2 - n2^2}{n_{wav-a}^2 - n1^2}} \right) + m\pi \right] < t_{\textit{eff}} < \qquad (5)$$

$$\frac{\lambda_a}{2\pi\sqrt{n_{wav-a}^2 - n1^2}} \left[ \tan^{-1}\left( \frac{n_{wav-a}^2}{n2^2} \sqrt{\frac{n1^2 - n2^2}{n_{wav-a}^2 - n1^2}} \right) + m\pi \right]$$

$$t_{\textit{eff}} = t_{wav} + (1 - R_v) \cdot h \cdot \frac{n_p}{n_{wav-a}} + t_m \cdot \frac{n_m}{n_{wav-a}} \qquad (6)$$

A portion of the first layer and/or a portion of the second layer may be disposed in the recesses. The photoluminescent layer may include discrete belt-like portions. The surface structure may be disposed on the belt-like portions. The effective thickness $t_{\textit{eff}}$ may satisfy the following relational expressions (7) and (8), wherein $t_{wav}$ denotes the thickness of the belt-like portions, h denotes the thickness of the surface structure, $t_m$ denotes the thickness of the intermediate layer, $n_p$ denotes the refractive index of the surface structure for the first light, $R_v$ denotes the ratio of the volume of the recesses to the volume of the projections and the recesses, and m is an integer.

$$\frac{\lambda_a}{2\pi\sqrt{n_{wav-a}^2 - n1^2}} \left[ \tan^{-1}\left( \sqrt{\frac{n1^2 - n2^2}{n_{wav-a}^2 - n1^2}} \right) + m\pi \right] < t_{\textit{eff}} < \qquad (7)$$

$$\frac{\lambda_a}{2\pi\sqrt{n_{wav-a}^2 - n1^2}} \left[ \tan^{-1}\left( \frac{n_{wav-a}^2}{n2^2} \sqrt{\frac{n1^2 - n2^2}{n_{wav-a}^2 - n1^2}} \right) + m\pi \right]$$

$$t_{\textit{eff}} = t_{wav} + (1 - R_v) \cdot h \cdot \frac{n_p}{n_{wav-a}} + t_m \cdot \frac{n_m}{n_{wav-a}} \qquad (8)$$

According to the forementioned structure, it is possible to provide a light-emitting device that has a high directivity in a plane having a normal perpendicular to the direction in which a projection of the surface structure extends.

The belt-like portions may be separately arranged in a first direction. The projections and the recesses may extend in the first direction.

The projections and the recesses may be arranged perpendicularly to the first direction.

The length of the belt-like portions in the first direction may be not more than four times the distance $D_{int}$ between two adjacent projections or between two adjacent recesses. According to the forementioned structure, it is possible to more efficiently suppress light emission in directions apart from the desired direction.

The length of the belt-like portions in the first direction may be 2 µm or less. According to the forementioned structure, it is possible to more efficiently suppress light emission in directions apart from the desired direction.

The first layer or the second layer may be a substrate that supports the photoluminescent layer. According to the forementioned structure, the refractivity of the medium on one surface side of the photoluminescent layer can easily be made different from the refractivity of the medium on the other surface side of the photoluminescent layer by selection of the material of the substrate.

The photoluminescent layer may be in direct contact with the substrate.

The first layer or the second layer may be air.

The distance $D_{int}$ between two adjacent projections or between two adjacent recesses in the surface structure may satisfy the relationship $(\lambda_a/n_{wav-a}) < D_{int} < \lambda_a$.

The projections or the recesses may constitute at least one periodic structure. The at least one periodic structure may have a period p that satisfies the relationship $(\lambda_a/n_{wav-a}) < p < \lambda_a$.

The photoluminescent layer and the surface structure may be integrated. For example, the photoluminescent layer and the surface structure can be integrated by forming projections and recesses on the photoluminescent layer. In this case, the projections and recesses constitute the surface structure, and the portion other than the surface structure is the photoluminescent layer. The term "projections and recesses", as used herein, refers to a portion between a plane including the top surfaces of the projections and a plane including the bottoms of the recesses, for example.

A light-emitting device according to an embodiment of the present disclosure includes a photoluminescent layer that emits light having a wavelength $\lambda_a$ in air upon receiving excitation light (the subscript "a" denotes the wavelength of light in air). The wavelength $\lambda_a$ may be in the visible wavelength range (for example, 380 to 780 nm). However, the wavelength $\lambda_a$ is not limited in the visible wavelength range and may be outside the visible wavelength range. For example, when infrared light is used, the wavelength $\lambda_a$ may be more than 780 nm. For example, when ultraviolet light is used, the wavelength $\lambda_a$ may be less than 380 nm. In the present disclosure, all electromagnetic waves, including infrared light and ultraviolet light, are referred to as "light" for convenience.

The photoluminescent layer contains a photoluminescent material. The term "photoluminescent material" refers to a material that emits light upon receiving excitation light. The term "photoluminescent material" encompasses fluorescent materials and phosphorescent materials in a narrow sense, encompasses inorganic materials and organic materials (for example, dyes), and encompasses quantum dots (for example, tiny semiconductor particles). The photoluminescent layer may contain a matrix material (host material) in addition to the photoluminescent material. Examples of matrix materials include resins and inorganic materials, such as glasses and oxides.

In some embodiments, the photoluminescent layer has a surface structure having projections and recesses on at least one selected from the group consisting of its surfaces. The surface structure may be referred to as a "textured structure". The projections on the surface structure can have a structure projecting outward from a photoluminescent layer (or a light guiding layer described later), and the recesses in the surface structure are formed between two adjacent projections. The surface structure may be formed of a material (for example, an inorganic material or resin) having high transmittance to light emitted from the photoluminescent layer. For example, the surface structure can be formed of a dielectric material (particularly an insulator having low light absorptivity). The material of the surface structure may be the same as or different from the material of the photoluminescent layer.

In a light-emitting device according to an embodiment of the present disclosure, a unique electric field distribution is formed within a photoluminescent layer or within a light guiding layer including a photoluminescent layer, as described in detail later with reference to the calculation and experimental results. Such an electric field distribution is formed by an interaction between guided light and a surface structure. Such an electric field distribution is formed in an optical mode referred to as a "quasi-guided mode". A quasi-guided mode can be utilized to improve at least one selected from the group consisting of the luminous efficiency, directionality, and polarization selectivity of photoluminescence, as described later. The term "quasi-guided mode" may be used in the following description to describe novel structures and/or mechanisms contemplated by the present inventors. Such a description is for illustrative purposes only and is not intended to limit the present disclosure in any way.

For example, when a quasi-guided mode is formed within a photoluminescent layer, light in the quasi-guided mode can be transmitted through the photoluminescent layer by total reflection at an incident angle θ. The effective refractive index $n_{eff}$ of the medium for light in the quasi-guided mode can be represented by $n_{eff} = n_{wav} \sin \theta$, wherein $n_{wav}$ denotes the refractive index of a photoluminescent layer for light having a wavelength $\lambda_a$. The effective refractive index $n_{eff}$ also satisfies the relationship $n_{air} < n_{eff} < n_{wav}$, wherein $n_{air}$ denotes the refractive index of air. Although it is desirable to use the symbol $n_{wav-a}$ to refer to the refractive index for light having a wavelength $\lambda_a$ because the refractive index generally depends on the wavelength, "$n_{wav-a}$" is sometimes abbreviated to "$n_{wav}$" for simplicity in the present specification.

The effective refractive index $n_{eff}$ depends on the refractive index of the medium present in the region where the electric field of the quasi-guided mode is distributed. Thus, in the case where another medium is present between a surface structure and a photoluminescent layer, the effective refractive index $n_{eff}$ depends not only on the refractive index of the photoluminescent layer but also on the refractive index of the medium. Because the electric field distribution varies with the polarization of the quasi-guided mode (TE mode or TM mode), the effective refractive index $n_{eff}$ can differ between the TE mode and the TM mode. If the photoluminescent layer is formed of a medium containing a mixture of materials, the refractive index $n_{wav}$ is the average of the refractive indices of the materials weighted by their respective volume fractions.

The photoluminescent layer is disposed between two media having different refractive indices for light having a wavelength $\lambda_a$ that are lower than the refractive index $n_{wav-a}$ of the photoluminescent layer. For example, the photoluminescent layer can be disposed between a first layer having a refractive index n1 for light having a wavelength $\lambda_a$ and a second layer having a refractive index n2 for light having a wavelength $\lambda_a$, n2 being smaller than n1. In this case, $n_{wav-a} > n1 > n2$, and the surface structure is typically disposed on a surface of the photoluminescent layer facing the second layer. The first layer or the second layer may be an air layer. The first layer or the second layer may be a substrate that supports the photoluminescent layer (typically a transparent substrate).

An intermediate layer, such as a protective layer, may be disposed between the photoluminescent layer and the surface structure. In this case, a layered structure composed of the photoluminescent layer and the intermediate layer can be considered to be an optically single photoluminescent layer and can therefore be referred to as a light guiding layer. When an intermediate layer is disposed between the photoluminescent layer and the surface structure, the light guiding layer is disposed between the first layer and the second layer. The refractive index $n_{cmp}$ of the light guiding layer for light having a wavelength $\lambda_a$ in air satisfies the relationship $n_{cmp} > n1 > n2$.

When an intermediate layer is disposed between the photoluminescent layer and the surface structure, the surface structure is disposed on the light guiding layer. The surface structure may be disposed on the intermediate layer or on a main surface of the photoluminescent layer opposite the intermediate layer. Alternatively, the surface structure may be formed on the main surfaces of the light guiding layer, that is, on both the intermediate layer and the photoluminescent layer. When the surface structure is located on or near the photoluminescent layer, an electric field of the guided mode reaches the surface structure, and a quasi-guided mode is formed within the light guiding layer or the photoluminescent layer. The phrase "the surface structure is located on or near the photoluminescent layer", as used herein, typically means that the distance between these is less than half the wavelength $\lambda_a$. Thus, when an intermediate layer is disposed between the surface structure and the photoluminescent layer, the thickness of the intermediate layer is typically less than half the wavelength $\lambda_a$. However, when the refractive index $n_m$ of the intermediate layer for light having a wavelength $\lambda_a$ in air is higher than the refractive index $n_{wav}$ of the photoluminescent layer, light can reach the surface structure disposed on the light guiding layer even if the above relationship is not satisfied, and the thickness of the intermediate layer (or the distance between the surface structure and the photoluminescent layer) may be more than half the wavelength $\lambda_a$.

The distance $D_{int}$ between the centers of two adjacent projections or two adjacent recesses of a surface structure on the photoluminescent layer or the light guiding layer (hereinafter also referred to as the "center distance") is typically shorter than the wavelength $\lambda_a$ in air of light emitted from the photoluminescent layer. For example, the center-to-center distance $D_{int}$ between adjacent projections can satisfy the relationship $(\lambda_a/n_{wav-a}) < D_{int} < \lambda_a$. If the surface structure satisfies the relationship $(\lambda_a/n_{wav-a}) < D_{int} < \lambda_a$, when visible light is utilized, the surface structure is characterized on the order of submicrometers, which is shorter than the order of micrometers. In other words, if the light emitted from the photoluminescent layer is visible light, near-infrared light having a short wavelength, or ultraviolet light, the distance $D_{int}$ is shorter than the order of micrometers, and such a surface structure may be referred to as a "submicron structure".

Thus, the surface structure may be an in-plane submicron structure on the photoluminescent layer. The "submicron structure" may partly have a center distance or period of more than 1 micrometer (μm). In the following description, it is assumed that the photoluminescent layer principally emits visible light, and the surface structure may be a "submicron structure". However, the following description can also be applied to a surface structure having a microstructure on the order of micrometers or more (for example, a microstructure on the order of micrometers used in combination with infrared light).

As in a light-emitting device according to an embodiment described in detail below, the surface structure typically has projections or recesses periodically arranged in one or two dimensions. In other words, the surface structure can have at least one periodic structure. The projections and recesses in the surface structure are formed at the boundary between two adjoining members (or media) having different refractive indices. Thus, the "periodic structure" has a refractive index that varies periodically in a certain direction. The term "periodically" refers not only to periodically in the strict sense but also to approximately periodically. In the present specification, the distance between any two adjacent centers of continuous projections or recesses of a periodic structure having a period p varies within ±15% of p.

The period p of the periodic structure (or the center distance of the surface structure) is typically shorter than the wavelength $\lambda_a$ in air of light emitted from the photoluminescent layer and satisfies the relationship $(\lambda_a/n_{wav-a}) < p < \lambda_a$. Thus, the surface structure can include a periodic structure in which the distance $D_{int}$ between adjacent projections (or between adjacent recesses) is a constant p. If the surface structure includes such a periodic structure, light in a quasi-guided mode propagates while repeatedly interacting with the surface structure and is diffracted by the surface structure. Unlike the phenomenon in which light propagating through free space is diffracted by a periodic structure, this is the phenomenon in which light is guided (that is, repeatedly totally reflected) while interacting with the periodic structure. This can efficiently diffract light even if the periodic structure causes a small phase shift (that is, even if the periodic structure has a small height).

The above mechanism can be utilized to improve the luminous efficiency of photoluminescence by the enhancement of the electric field due to a quasi-guided mode and can also be utilized to couple output light to the quasi-guided mode. The angle of travel of light in a quasi-guided mode is changed by the angle of diffraction determined by the periodic structure. This can be utilized to emit light of a particular wavelength in a particular direction. This can significantly improve directionality compared with submicron structures including no periodic structure. Furthermore, high polarization selectivity can be simultaneously achieved because the effective refractive index $n_{eff}$ ($=n_{wav} \sin \theta$) differs between the TE mode and the TM mode. For example, as demonstrated by the experimental examples below, a light-emitting device can be provided that emits intense linearly polarized light (for example, TM polarized light) of a particular wavelength (for example, 610 nm) in the front direction. The directional angle of light emitted in the front direction is less than 15 degrees, for example. The term "directional angle", as used herein, refers to the angle between the direction of maximum intensity and the direction of 50% of the maximum intensity of linearly polarized light having a particular wavelength to be emitted. In other words, the term "directional angle" refers to the angle of one side with respect to the direction of maximum intensity, which is assumed to be 0 degrees.

Thus, the surface structure (typically the periodic structure) in an embodiment of the present disclosure limits the directional angle of light having a particular wavelength $\lambda_a$. In other words, the distribution of light having the wavelength $\lambda_a$ is narrowed compared with submicron structures including no surface structure. Such a light distribution in which the directional angle is narrowed compared with submicron structures including no surface structure is sometimes referred to as a "narrow-angle light distribution". Although the surface structure in an embodiment of the present disclosure limits the directional angle of light having the wavelength $\lambda_a$, the surface structure does not necessarily emit the entire light having the wavelength $\lambda_a$ at narrow angles. For example, in an embodiment illustrated in FIG. 23, light having the wavelength $\lambda_a$ is slightly emitted in a direction (for example, at an angle in the range of 20 to 70 degrees) away from the direction of maximum intensity. However, as a whole, output light having the wavelength $\lambda_a$ mostly has an angle in the range of 0 to 20 degrees and has limited directional angles.

Unlike general diffraction gratings, the periodic structure in a typical embodiment of the present disclosure has a shorter period than the light wavelength $\lambda_a$. General diffraction gratings have a sufficiently longer period than the light wavelength $\lambda_a$, and consequently light of a particular wavelength is divided into diffracted light emissions, such as zero-order light (that is, transmitted light) and ±1-order diffracted light. In such diffraction gratings, higher-order diffracted light is generated on both sides of zero-order light. Higher-order diffracted light generated on both sides of zero-order light in diffraction gratings makes it difficult to provide a narrow-angle light distribution. In other words, known diffraction gratings do not have the effect of limiting the directional angle of light to a predetermined angle (for example, approximately 15 degrees), which is a characteristic effect of an embodiment of the present disclosure. In this regard, the periodic structure according to an embodiment of the present disclosure is significantly different from known diffraction gratings.

As described later, in a typical embodiment of the present disclosure, a layered structure of the photoluminescent layer and the surface structure or a layered structure of the light guiding layer and the surface structure also has an effective thickness in a predetermined range. In this effective thickness range, the layered structure allows the TE mode rather than the TM mode. When the layered structure has an effective thickness in a predetermined range, the light-emitting device can more strongly emit TE polarized light than TM polarized light. This can improve polarization selectivity and provide a light-emitting device having higher directionality.

1-1. Underlying Knowledge Forming Basis of the Present Disclosure

The underlying knowledge forming the basis of the present disclosure will be described before describing specific embodiments of the present disclosure. As described above, photoluminescent materials, such as those used for fluorescent lamps and white LEDs, emit light in all directions and thus require an optical element, such as a reflector or lens, to emit light in a particular direction. These optical elements, however, can be eliminated (or the size thereof can be reduced) if the photoluminescent layer itself emits directional light. This results in a significant reduction in the size of optical devices and equipment. With this idea in mind, the present inventors have conducted a detailed study on the photoluminescent layer to generate directional light emission.

The present inventors have investigated the possibility of inducing light emission with particular directionality so that light from the photoluminescent layer is localized in a particular direction. Based on Fermi's golden rule, the emission rate Γ, which is a measure characterizing light emission, is represented by the formula (9):

$$\Gamma(r) = \frac{2\pi}{\hbar} \langle (d \cdot E(r)) \rangle^2 \rho(\lambda) \tag{9}$$

In the formula (9), r denotes the vector indicating the position, λ denotes the wavelength of light, d denotes the dipole vector, E denotes the electric field vector, and ρ denotes the density of states. In many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ is independent of the direction. Accordingly, the emission rate Γ is constant irrespective of the direction. Thus, in most cases, the photoluminescent layer emits light in all directions.

As can be seen from the formula (9), to achieve anisotropic light emission, it is necessary to align the dipole vectors d in a particular direction or to enhance a component of the electric field vector in a particular direction. One of these approaches can be employed to generate directional light emission. Embodiments of the present disclosure utilize a quasi-guided mode in which an electric field component in a particular direction is enhanced by confinement of light in a photoluminescent layer. Structures for utilizing a quasi-guided mode have been studied and analyzed in detail as described below.

1-2. Structure for Enhancing Electric Field Only in Particular Direction

The present inventors have investigated the possibility of controlling light emission using a guided mode with an intense electric field. Light can be coupled to a guided mode using a waveguide structure that itself contains a photoluminescent material. However, a waveguide structure simply formed from a photoluminescent material emits little or no light in the front direction because the output light is coupled to a guided mode. Accordingly, the present inventors have investigated the possibility of combining a waveguide containing a photoluminescent material with a periodic structure. When the electric field of light is guided in a waveguide while overlapping a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure and undergoes diffraction, so that light in this mode is converted into light propagating in a particular direction and can be emitted from the waveguide. The electric field of light other than quasi-guided modes is not enhanced because little or no such light is confined in the waveguide. Thus, most light is coupled to a quasi-guided mode with a large electric field component. More specifically, the present inventors have investigated the possibility of using a photoluminescent layer containing a photoluminescent material as a waveguide (or a waveguide layer including a photoluminescent layer) in combination with a periodic structure located on or near the waveguide to couple light to a quasi-guided mode in which the light is converted into light propagating in a particular direction, thereby providing a directional light source.

Figure 42A:
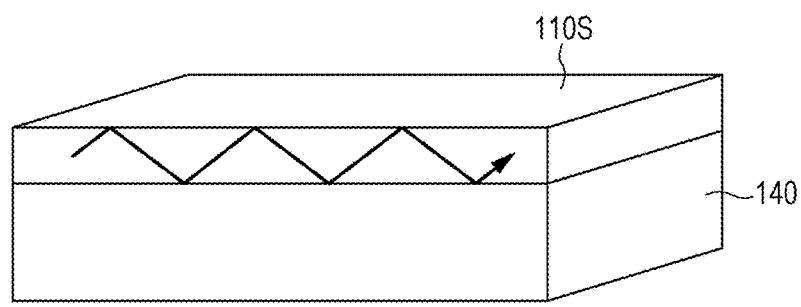
FIG. 42A is a schematic perspective view of a slab waveguide.

As a simple waveguide structure, the present inventors have studied slab waveguides. Slab waveguides have a planar structure in which light is guided. FIG. 42A is a schematic perspective view of a slab waveguide 110S. There is a mode of light propagating through the waveguide 110S if the waveguide 110S has a higher refractive index than a substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled to the guided mode. If the photoluminescent layer has a thickness close to the wavelength of light, a situation can be created where there is only a guided mode with a large electric field amplitude.

If a periodic structure is located on or near the photoluminescent layer, the electric field of the guided mode interacts with the periodic structure to form a quasi-guided mode.

Even if the photoluminescent layer is composed of multiple layers, a quasi-guided mode can be formed as long as the electric field of the guided mode reaches the periodic structure. Not all of the photoluminescent layer needs to be formed of a photoluminescent material, provided that at least a portion of the photoluminescent layer functions to emit light.

If the periodic structure is made of a metal, a mode due to a guided mode and plasmon resonance is formed. This mode has different properties from the quasi-guided mode described above. This mode is less effective in enhancing emission because a large loss occurs due to high absorption by the metal. Thus, it is advantageous to form the periodic structure using a dielectric material having low absorptivity.

Figure 1A:
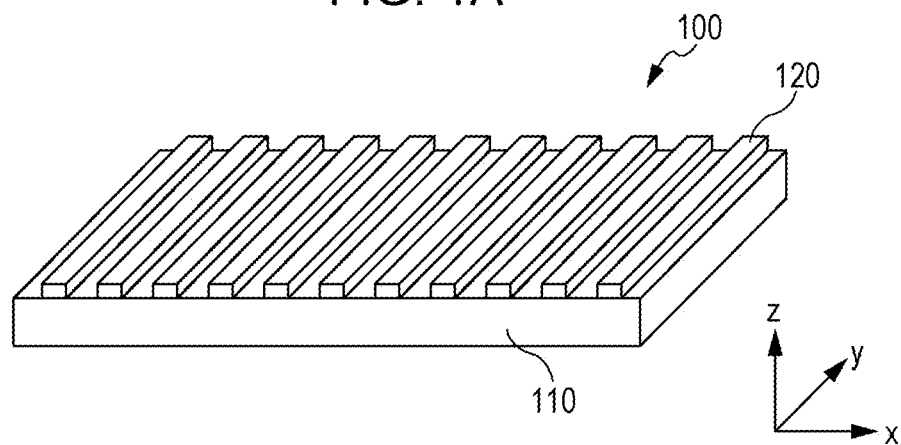
FIG. 1A is a perspective view of an exemplary structure of a light-emitting device according to an embodiment.

The present inventors have studied coupling of light to a quasi-guided mode that can be emitted as light propagating in a particular angular direction using a periodic structure formed on a waveguide. FIG. 1A is a schematic perspective view of a light-emitting device 100 that includes a waveguide 110 and a surface structure 120. For reference, FIG. 1A shows x-, y-, and z-axes intersecting at right angles. Another figure may also show the x-, y-, and z-axes intersecting at right angles. In the embodiment illustrated in FIG. 1A, the waveguide 110 extends in the xy plane.

In this embodiment, the surface structure 120 is a one-dimensional periodic structure in which stripe-shaped projections extending in the y direction are arranged at regular intervals in the x direction. Thus, in the following description, the surface structure 120 is sometimes referred to as a periodic structure 120. In this embodiment, the waveguide 110 is a photoluminescent layer. Thus, the waveguide 110 is hereinafter also referred to as a photoluminescent layer 110.

Figure 1B:
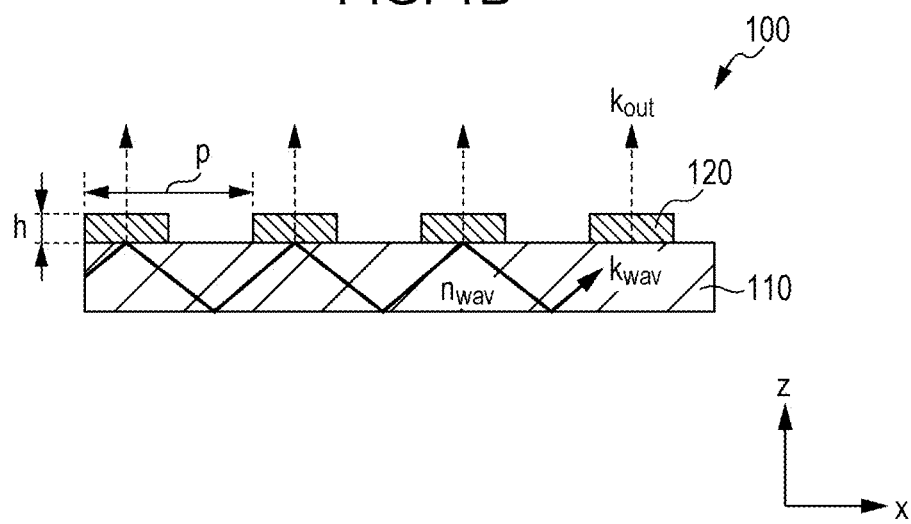
FIG. 1B is a schematic fragmentary cross-sectional view of the light-emitting device illustrated in FIG. 1A.

FIG. 1B is a schematic cross-sectional view of the light-emitting device 100 taken along a plane parallel to the xz plane. If the periodic structure 120 having a period p is provided in contact with the waveguide 110, a quasi-guided mode having a wave number $k_{wav}$ in the in-plane direction is converted into light propagating outside the waveguide 110. The wave number $k_{out}$ of the light can be represented by the formula (10):

$$k_{out} = k_{wav} - m\frac{2\pi}{p} \quad (10)$$

In the formula (10), m is an integer indicating the diffraction order.

For simplicity, light guided in the waveguide 110 is assumed to be a ray of light propagating at an angle $\theta_{wav}$. This approximation gives the formulae (11) and (12):

$$\frac{k_{wav}\lambda_0}{2\pi} = n_{wav}\sin\theta_{wav} \quad (11)$$

$$\frac{k_{out}\lambda_0}{2\pi} = n_{out}\sin\theta_{out} \quad (12)$$

In these formulae, $\lambda_0$ denotes the wavelength of light in air, $n_{wav}$ denotes the refractive index of the waveguide 110, $n_{out}$ denotes the refractive index of the medium on the light emission side, and $\theta_{out}$ denotes the angle at which light is emitted from the waveguide 110 to a substrate or to the air. From the formulae (10) to (12), the output angle $\theta_{out}$ can be represented by the equation (13):

$$n_{out}\sin\theta_{out} = n_{wav}\sin\theta_{wav} - m\lambda_0/p \quad (13)$$

If $n_{wav}\sin\theta_{wav} = m\lambda_0/p$ in the formula (13), this results in $\theta_{out}=0$, meaning that light can be emitted in the direction perpendicular to the plane of the waveguide 110 (that is, in the front direction).

Based on this principle, light can be coupled to a particular quasi-guided mode and be converted into light having a particular output angle using the periodic structure to emit intense light in that direction.

There are some constraints to achieving the above situation. First, to form a quasi-guided mode, light propagating through the waveguide 110 has to be totally reflected. The conditions therefor are represented by the formula (14):

$$n_{out} < n_{wav}\sin\theta_{wav} \quad (14)$$

In order to diffract light in a quasi-guided mode using the periodic structure and thereby emit light from the waveguide 110, $-1 < \sin\theta_{out} < 1$ has to be satisfied in the formula (13). Hence, the following formula (15) has to be satisfied:

$$-1 < \frac{n_{wav}}{n_{out}}\sin\theta_{wav} - \frac{m\lambda_0}{n_{out}p} < 1 \quad (15)$$

Taking into account the formula (14), the formula (16) has to be satisfied:

$$\frac{m\lambda_0}{2n_{out}} < p \quad (16)$$

Furthermore, in order to emit light from the waveguide 110 in the front direction ($\theta_{out}=0$), as can be seen from the formula (13), the following formula (17) has to be satisfied:

$$p = m\lambda_0/(n_{wav}\sin\theta_{wav}) \quad (17)$$

As can be seen from the formulae (17) and (14), the required conditions are represented by the formula (18):

$$\frac{m\lambda_0}{n_{wav}} < p < \frac{m\lambda_0}{n_{out}} \quad (18)$$

The periodic structure as illustrated in FIGS. 1A and 1B may be designed based on first-order diffracted light (that is, m=1) because higher-order diffracted light having m of 2 or more has low diffraction efficiency. In this case, the period p of the periodic structure 120 is determined so as to satisfy the formula (19), which is given by substituting m=1 into the formula (18):

$$\frac{\lambda_0}{n_{wav}} < p < \frac{\lambda_0}{n_{out}} \quad (19)$$

In the case where the waveguide (photoluminescent layer) 110 is not in contact with a substrate, as illustrated in FIGS. 1A and 1B, $n_{out}$ denotes the refractive index of air (approximately 1.0). Thus, the period p is determined so as to satisfy the following formula (20):

$$\frac{\lambda_0}{n_{wav}} < p < \lambda_0 \quad (20)$$

Figure 1C:
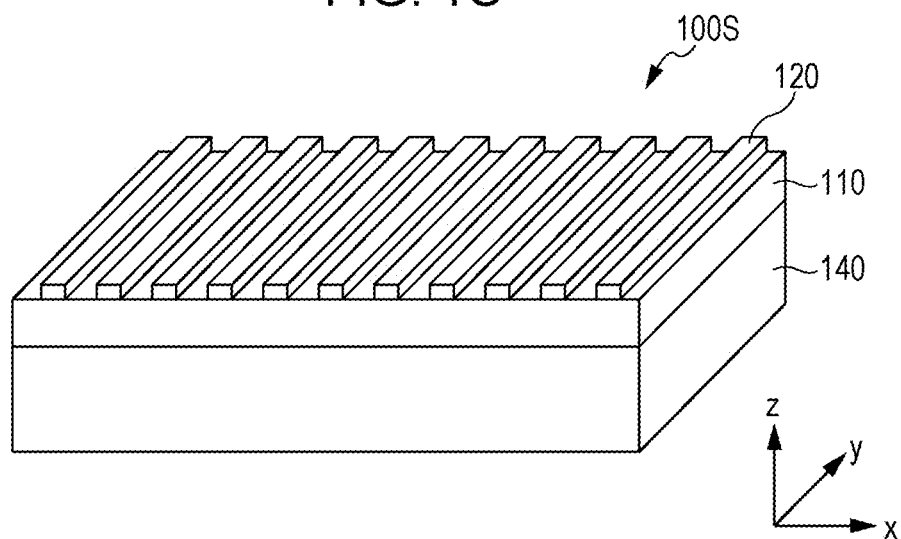
FIG. 1C is a schematic perspective view of the structure of a light-emitting device including a substrate for supporting a photoluminescent layer.
Figure 1D:
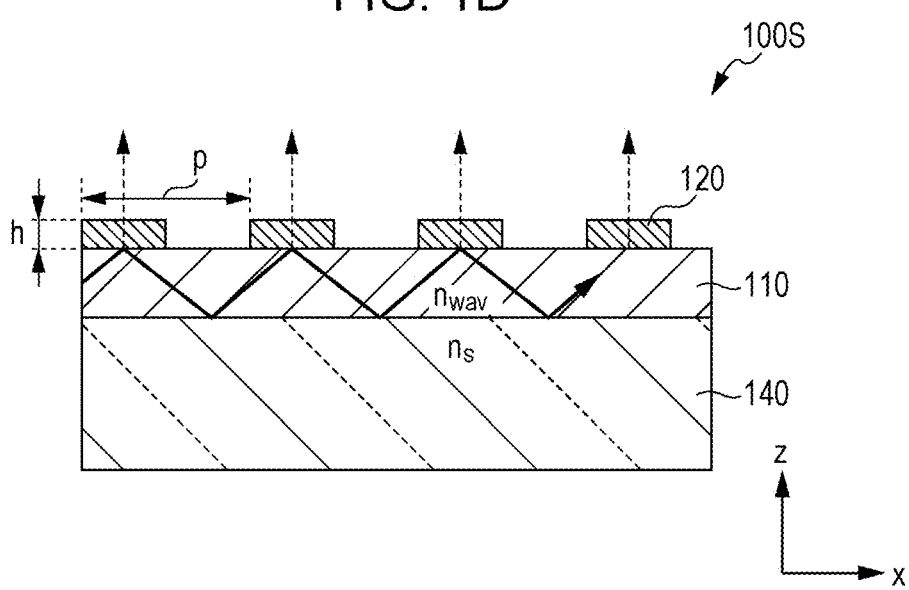
FIG. 1D is a schematic fragmentary cross-sectional view of the light-emitting device illustrated in FIG. 1C.

Alternatively, a structure as illustrated in FIGS. 1C and 1D may be employed in which the photoluminescent layer 110 and the periodic structure 120 are formed on a substrate 140. In a light-emitting device 100S illustrated in FIGS. 1C and 1D, the photoluminescent layer 110 is in contact with the substrate 140. The substrate 140 is typically a transparent substrate. The substrate generally has a higher refractive index than air. Thus, when the substrate 140 supports the photoluminescent layer 110, the period p is determined so as to satisfy the following formula (21), which is given by substituting $n_{out}=n_s$ into the formula (19), wherein $n_s$ denotes the refractive index of the substrate 140.

$$\frac{\lambda_0}{n_{wav}} < p < \frac{\lambda_0}{n_s} \quad (21)$$

Although m=1 is assumed in the formula (18) to give the formulae (20) and (21), m may be 2 or more. That is, if both surfaces of the light-emitting device 100 are in contact with an air layer, as shown in FIGS. 1A and 1B, the period p is determined so as to satisfy the formula (22), wherein m is an integer of 1 or more.

$$\frac{m\lambda_0}{n_{wav}} < p < m\lambda_0 \quad (22)$$

Likewise, as in the light-emitting device 100S illustrated in FIGS. 1C and 1D, when the photoluminescent layer 110 is formed on the substrate 140, the period p is determined so as to satisfy the following formula (23):

$$\frac{m\lambda_0}{n_{wav}} < p < \frac{m\lambda_0}{n_s} \quad (23)$$

If the period p of the periodic structure is determined so as to satisfy these inequalities, light emitted from the photoluminescent layer 110 can be output in the front direction. Thus, a light-emitting apparatus having high directionality can be provided.

2. Calculational Verification

2-1. Period and Wavelength Dependence

The present inventors verified, by optical analysis, whether light emission in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine an enhancement of light emitted perpendicularly to the light-emitting device. The process by which external incident light is coupled to a quasi-guided mode and is absorbed by the photoluminescent layer corresponds to a process opposite to the process by which light emitted from the photoluminescent layer is coupled to a quasi-guided mode and is converted into propagating light emitted perpendicularly to the light-emitting device. Similarly, the electric field distribution of a quasi-guided mode was calculated from the electric field of external incident light.

Figure 2:
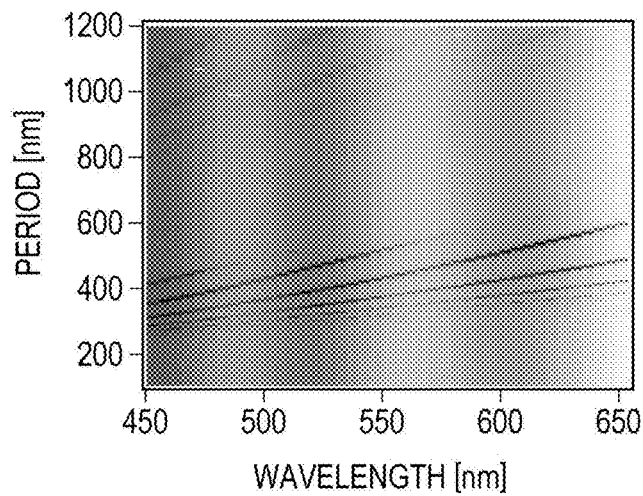
FIG. 2 is a graph showing the calculation results of enhancement of light emitted in the front direction with varying emission wavelengths and varying periods of a periodic structure.

FIG. 2 shows the calculation results of enhancement of light emitted in the front direction with varying emission wavelengths and varying periods of the periodic structure. The photoluminescent layer had a thickness of 1 µm and a refractive index $n_{wav}$ of 1.8, and the periodic structure had a height of 50 nm and a refractive index of 1.5. The calculation model had a one-dimensional periodic structure uniform in the y direction, as illustrated in FIG. 1A. TE polarized light having an electric field component in the y direction was used.

When the material of the periodic structure is different from the material of the photoluminescent layer, the height of the periodic structure is the length from the top surface of the photoluminescent layer to the top surface of the periodic structure in the direction normal to the photoluminescent layer (in the z direction). In FIGS. 1B and 1D, the arrow h indicates the height of the periodic structure. As described later, when projections and recesses are formed in the photoluminescent layer to form the periodic structure, the height of the periodic structure is the length from the base of a projection (or the bottom of a recess) projecting outward from the photoluminescent layer to the top surface of the projection in the direction normal to the photoluminescent layer.

The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
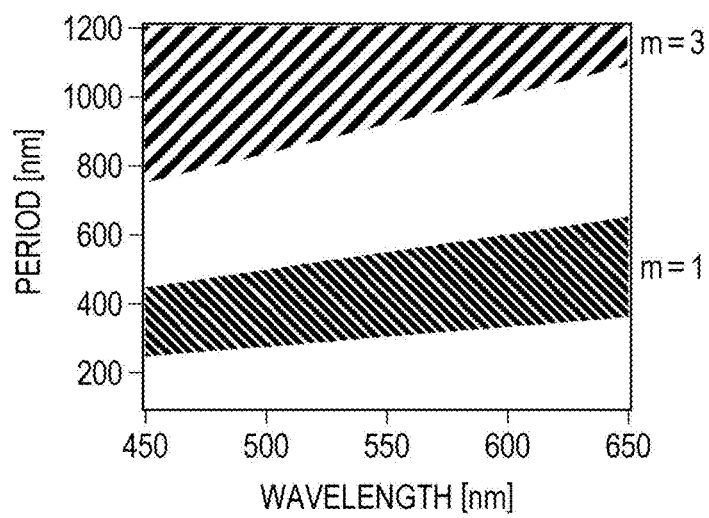
FIG. 3 is a graph illustrating the conditions for m=1 and m=3 in the formula (18)

In the above calculations, the periodic structure had a rectangular cross-section, as illustrated in FIG. 1B. FIG. 3 is a graph illustrating the conditions for m=1 and m=3 in the formula (18). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, a plurality of lines are observed in each of the regions corresponding to m=1 and m=3 in FIG. 3. This indicates the presence of a plurality of quasi-guided modes.

2-2. Thickness Dependence

Figure 4:
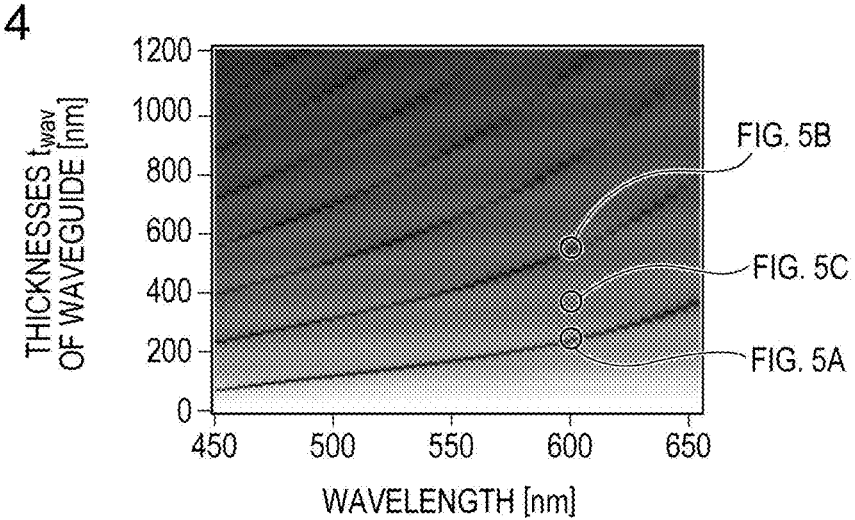
FIG. 4 is a graph showing the calculation results of the enhancement of light emitted in the front direction with varying emission wavelengths and varying thicknesses $t_{wav}$ of a photoluminescent layer.

FIG. 4 shows the calculation results of enhancement of light emitted in the front direction with varying emission wavelengths and varying thicknesses $t_{wav}$ of the photoluminescent layer. The photoluminescent layer had a refractive index $n_{wav}$ of 1.8, and the periodic structure had a period of 400 nm, a height of 50 nm, and a refractive index of 1.5. The enhancement of light is highest at a particular thickness $t_{wav}$ of the photoluminescent layer serving as a waveguide.

Figure 5A:
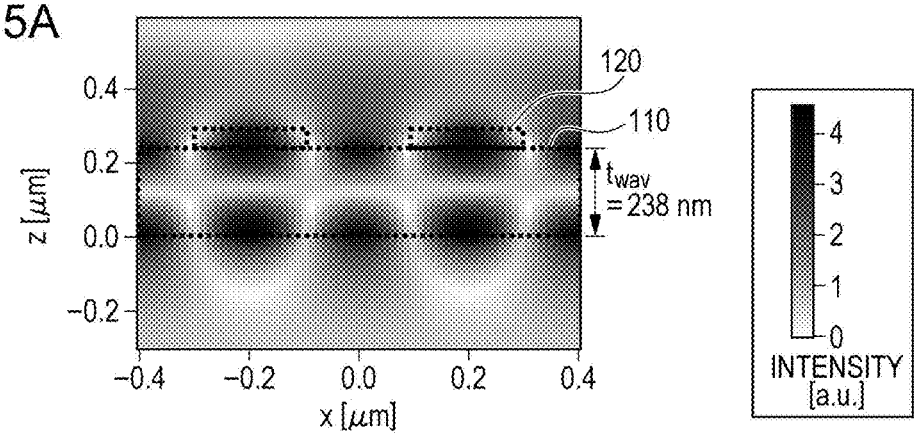
FIG. 5A is a graph showing the calculation results of the electric field distribution of a mode to guide light in the x direction for a thickness $t_{wav}$ of 238 nm.
Figure 5B:
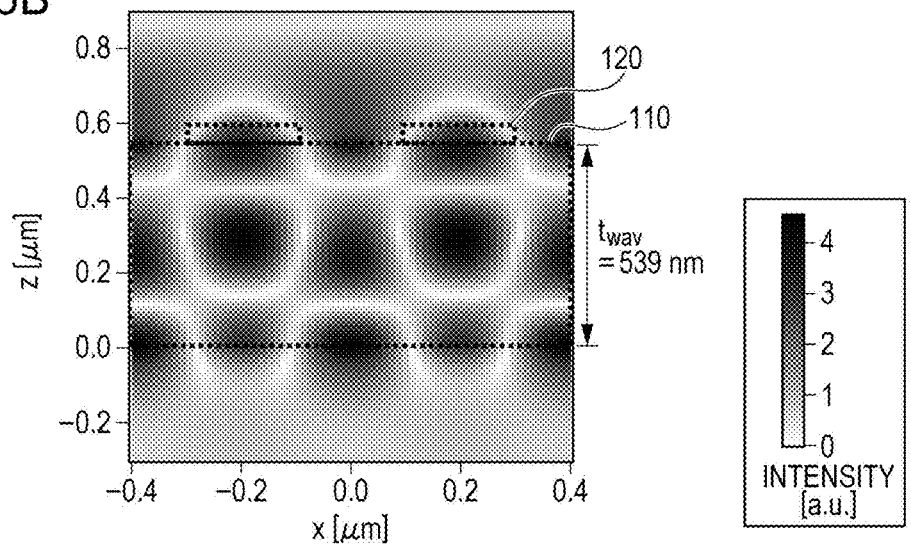
FIG. 5B is a graph showing the calculation results of the electric field distribution of a mode to guide light in the x direction for a thickness $t_{wav}$ of 539 nm.
Figure 5C:
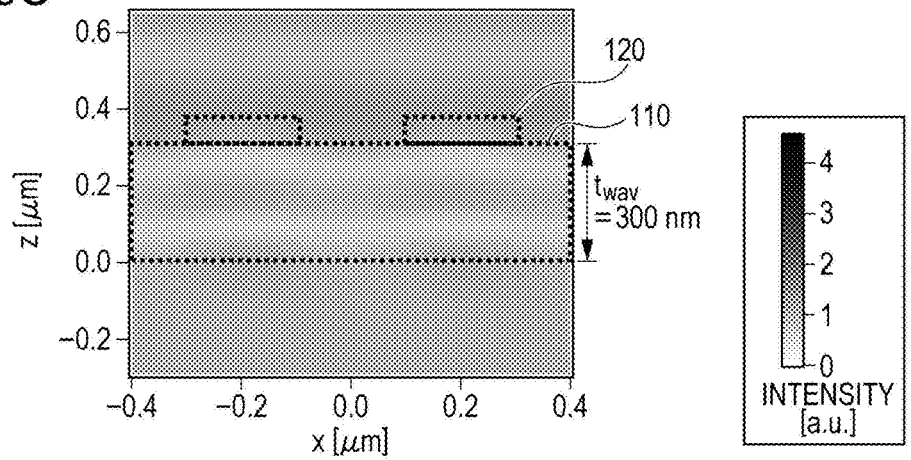
FIG. 5C is a graph showing the calculation results of the electric field distribution of a mode to guide light in the x direction for a thickness $t_{wav}$ of 300 nm.

As illustrated in FIG. 4, an enhancement peak at a wavelength of 600 nm appears when the thickness $t_{wav}$ is 238 or 539 nm. FIGS. 5A and 5B show the calculation results of the electric field distributions in a mode to guide light in the x direction for a wavelength of 600 nm and thicknesses $t_{wav}$ of 238 and 539 nm, respectively, at which the enhancement peaks appear. For comparison, FIG. 5C shows the results of similar calculations for a thickness $t_{wav}$ of 300 nm at which there is no peak. The calculation model had a one-dimensional periodic structure uniform in the y direction, as described above. In each figure, a darker region has higher electric field strength, and a lighter region has lower electric field strength. Whereas the results for $t_{wav}$=238 or 539 nm show high electric field strength, the results for $t_{wav}$=300 nm show low electric field strength as a whole. This is because there is a guided mode in the case of $t_{wav}$=238 or 539 nm, so that light is strongly confined. Furthermore, regions with the highest electric field intensity (antinodes) are necessarily present in or directly below the projections in the periodic structure 120, indicating the correlation between the electric field and the periodic structure 120. Thus, the resulting guided mode depends on the arrangement of the periodic structure 120. A comparison between the results for $t_{wav}$=238 nm and $t_{wav}$=539 nm shows that these modes differ by one in the number of nodes (white regions) of the electric field in the z direction.

2-3. Polarization Dependence

Figure 6:
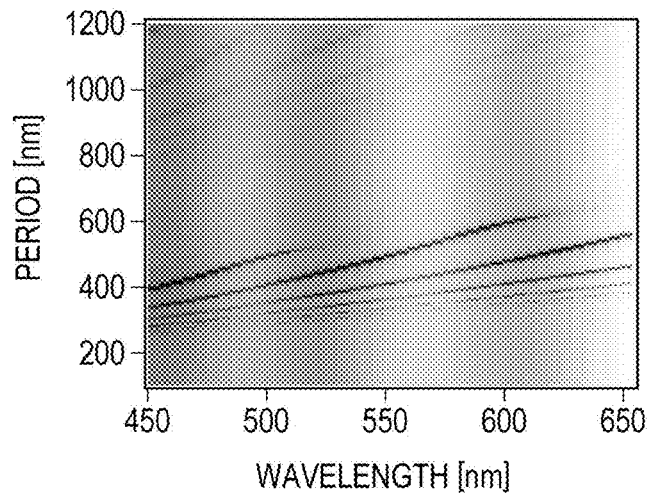
FIG. 6 is a graph showing the calculation results of the enhancement of light under the same conditions as in FIG. 2 except that the polarization of light is TM polarization, which has an electric field component perpendicular to the y direction.

In order to examine the polarization dependence, enhancement of light was calculated under the same conditions as in FIG. 2 except that the polarized light was TM polarized light, which has an electric field component perpendicular to the y direction. FIG. 6 shows the calculation results. Although the peaks in the figure differ slightly in position from the peaks for TE polarized light (FIG. 2), they are located within the regions shown in FIG. 3. Thus, the structure according to the present embodiment in which the surface structure is coupled to the waveguide is effective for both TE polarized light and TM polarized light.

In this embodiment of the present disclosure, as described above, light in a characteristic quasi-guided mode formed by the periodic structure and the photoluminescent layer can be selectively emitted only in the front direction through diffraction by the periodic structure. With this structure, the photoluminescent layer can be excited with excitation light, such as ultraviolet light or blue light, to emit directional light.

3. Study on Constructions of Periodic Structure and Photoluminescent Layer

The effects of changes in various conditions such as the constructions and refractive indices of the periodic structure and the photoluminescent layer will now be described.

3-1. Refractive Index of Periodic Structure

Figure 7:
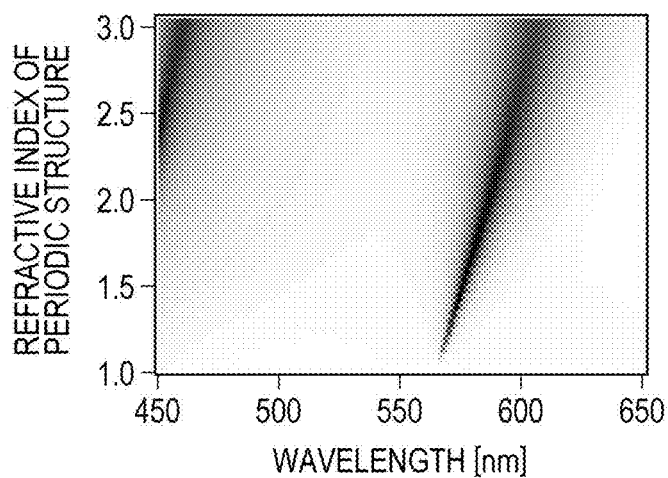
FIG. 7 is a graph showing the calculation results of the enhancement of light emitted in the front direction with varying emission wavelengths and varying refractive indices of the periodic structure.
Figure 8:
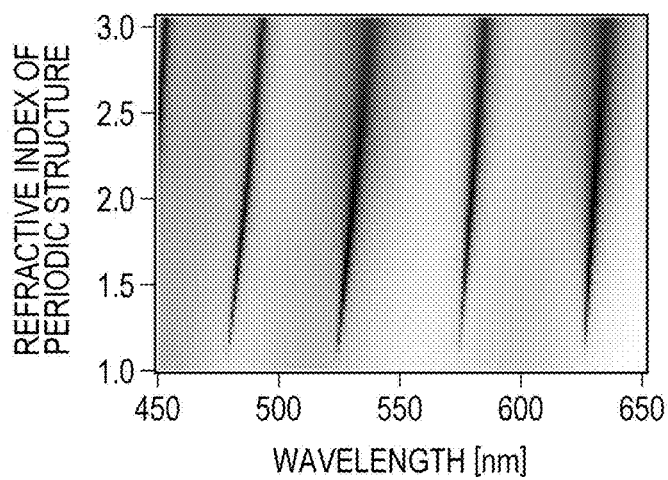
FIG. 8 is a graph showing the results obtained under the same conditions as in FIG. 7 except that the photoluminescent layer has a thickness of 1,000 nm.

The refractive index of the periodic structure has been studied. In the calculations performed herein, the photoluminescent layer had a thickness of 200 nm and a refractive index $n_{wav}$ of 1.8, the periodic structure was a one-dimensional periodic structure uniform in the y direction, as illustrated in FIG. 1A, and had a height of 50 nm and a period of 400 nm, and the polarized light was TE polarized light, which has an electric field component parallel to the y direction. FIG. 7 shows the calculation results of enhancement of light emitted in the front direction with varying emission wavelengths and varying refractive indices of the periodic structure. FIG. 8 shows the results obtained under the same conditions except that the photoluminescent layer had a thickness of 1,000 nm.

Focusing on the thickness of the photoluminescent layer, the shift in the wavelength at which the light intensity is highest (the wavelength is hereinafter sometimes referred to as a "peak wavelength") caused by the change in the refractive index of the periodic structure is smaller in the photoluminescent layer having a thickness of 1,000 nm (FIG. 8) than in the photoluminescent layer having a thickness of 200 nm (FIG. 7). This is because the quasi-guided mode is increasingly affected by the refractive index of the periodic structure as the thickness of the photoluminescent layer decreases. More specifically, a higher refractive index of the periodic structure results in a higher effective refractive index and a corresponding shift of the peak wavelength to a longer wavelength. The effects of the refractive index of the periodic structure on the peak wavelength increase as the thickness of the photoluminescent layer decreases. The effective refractive index depends on the refractive index of the medium present in the region where the electric field of the quasi-guided mode is distributed.

Focusing on the changes of peaks with changes in the refractive index of the periodic structure, a higher refractive index results in a broader peak and lower intensity. This is because a periodic structure having a higher refractive index emits light in a quasi-guided mode at a higher rate and is therefore less effective in confining light, that is, has a lower Q value. In order to maintain high peak intensity, a structure may be employed in which light is moderately emitted using a quasi-guided mode that is effective in confining light (that is, has a high Q value). In order to achieve this, the material of the periodic structure advantageously has a moderately higher refractive index than the photoluminescent layer. Thus, in order to increase the peak intensity and Q value, the refractive index of a dielectric material constituting the periodic structure can be lower than or similar to the refractive index of the photoluminescent layer. This is also true if the photoluminescent layer contains a material other than photoluminescent materials.

3-2. Height of Periodic Structure

Figure 9:
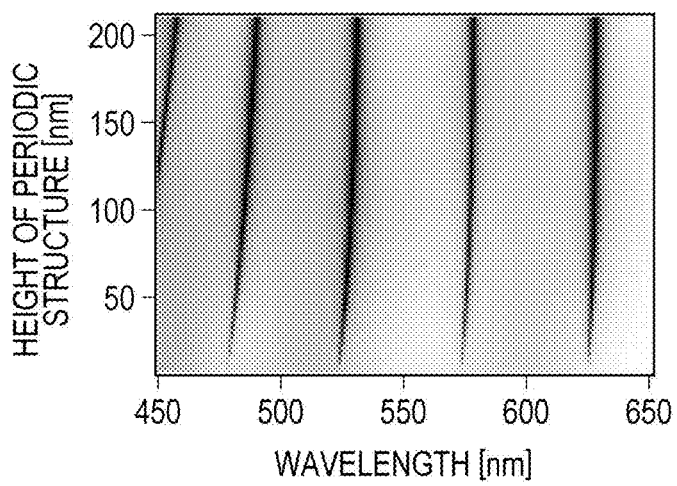
FIG. 9 is a graph showing the calculation results of the enhancement of light emitted in the front direction with varying emission wavelengths and varying heights of the periodic structure.
Figure 10:
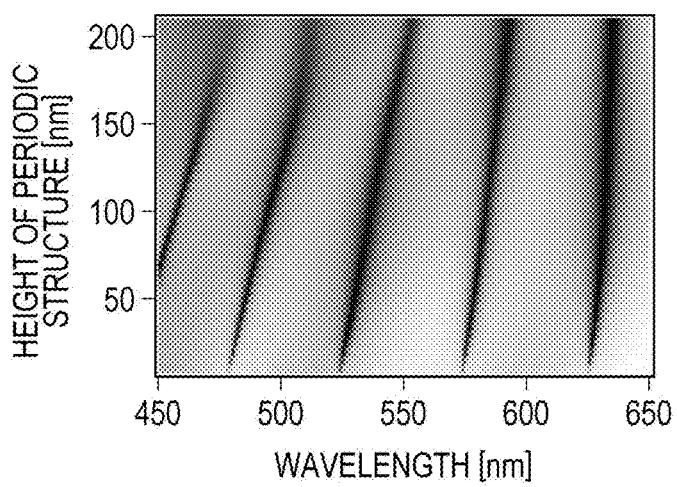
FIG. 10 is a graph showing the results of calculations performed under the same conditions as in FIG. 9 except that the periodic structure has a refractive index $n_p$ of 2.0.

The height of the periodic structure has been studied. In the calculations performed herein, the photoluminescent layer had a thickness of 1,000 nm and a refractive index $n_{wav}$ of 1.8, the periodic structure was a one-dimensional periodic structure uniform in the y direction, as illustrated in FIG. 1A, and had a refractive index $n_p$ of 1.5 and a period of 400 nm, and the polarized light was TE polarized light, which has an electric field component parallel to the y direction. FIG. 9 shows the calculation results of enhancement of light emitted in the front direction with varying emission wavelengths and varying heights of the periodic structure. FIG. 10 shows the results of calculations performed under the same conditions except that the periodic structure has a refractive index $n_p$ of 2.0. Whereas the results in FIG. 9 show that the peak intensity and the Q value (that is, the peak line width) do not change when the periodic structure has at least a certain height, the results in FIG. 10 show that the peak intensity and the Q value decrease as the height of the periodic structure increases. If the refractive index $n_{wav}$ of the photoluminescent layer is higher than the refractive index $n_p$ of the periodic structure (FIG. 9), light is totally reflected, and only a leaking (evanescent) portion of the electric field of a quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 10), light reaches the surface of the periodic structure without being totally reflected and is therefore more influenced by the periodic structure with a larger height. As shown in FIG. 10, the adequate height of the periodic structure is approximately 100 nm, and the peak intensity and the Q value decrease when the height exceeds 150 nm. Thus, if the refractive index $n_{wav}$ of the photoluminescent layer is lower than the refractive index $n_p$ of the periodic structure, the periodic structure has a height of 150 nm or less to achieve a moderately high peak intensity and Q value.

3-3. Polarization Direction

Figure 11:
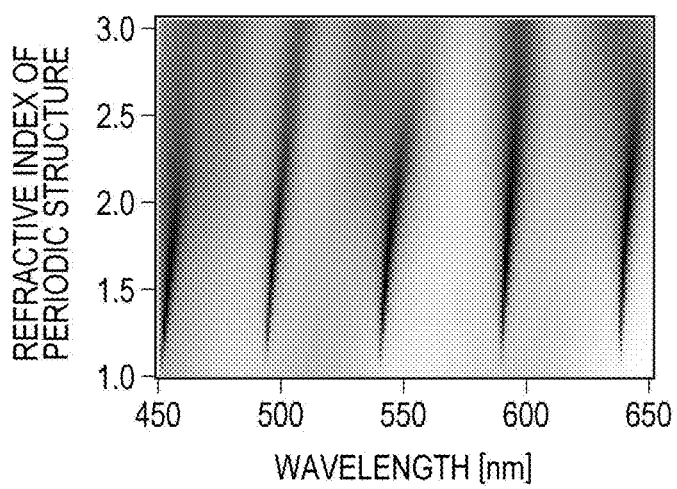
FIG. 11 is a graph showing the results of calculations performed under the same conditions as in FIG. 8 except that the polarization of light is TM polarization, which has an electric field component perpendicular to the y direction.

The polarization direction has been studied. FIG. 11 shows the results of calculations performed under the same conditions as in FIG. 8 except that the polarized light was TM polarized light, which has an electric field component perpendicular to the y direction. TM polarized light is more influenced by the periodic structure than TE polarized light because the electric field of a quasi-guided mode leaks more largely in the TM polarized light than in the TE polarized light. Thus, the peak intensity and the Q value decrease more significantly in TM polarized light than in TE polarized light if the refractive index $n_p$ of the periodic structure is higher than the refractive index $n_{wav}$ of the photoluminescent layer.

3-4. Refractive Index of Photoluminescent Layer

Figure 12:
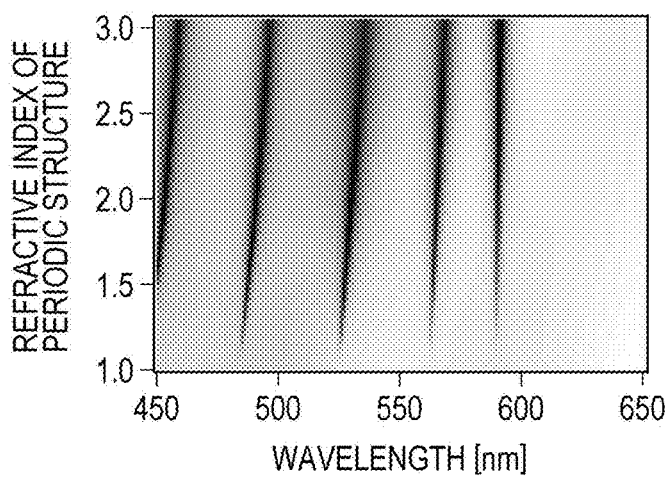
FIG. 12 is a graph showing the results of calculations performed under the same conditions as in FIG. 8 except that the photoluminescent layer has a refractive index $n_{wav}$ of 1.5.

The refractive index of the photoluminescent layer has been studied. FIG. 12 shows the results of calculations performed under the same conditions as in FIG. 8 except that the photoluminescent layer had a refractive index $n_{wav}$ of 1.5. The results for the photoluminescent layer having a refractive index $n_{wav}$ of 1.5 are similar to the results shown in FIG. 8. However, light having a wavelength of 600 nm or more was not emitted in the front direction. This is because, from the formula (18), $\lambda_0 < n_{wav} \times p/m = 1.5 \times 400$ nm/1=600 nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

4. Modified Examples

Modified examples of a light-emitting device according to an embodiment of the present disclosure will be described below.

4-1. Structure Including Substrate

As described above, the light-emitting device may have a structure in which the photoluminescent layer 110 and the periodic structure 120 are formed on the substrate 140 (see FIGS. 1C and 1D). The light-emitting device 100S illustrated in FIGS. 1C and 1D may be produced by forming a thin film of a photoluminescent material constituting the photoluminescent layer 110 (optionally containing a matrix material; the same applies hereinafter) on the substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to emit light in a particular direction. If the substrate 140 is provided in contact with the photoluminescent layer 110, the period p is set to satisfy the formula (23), which is given by replacing the refractive index $n_{out}$ of the output medium in the formula (18) by $n_s$.

Figure 13:
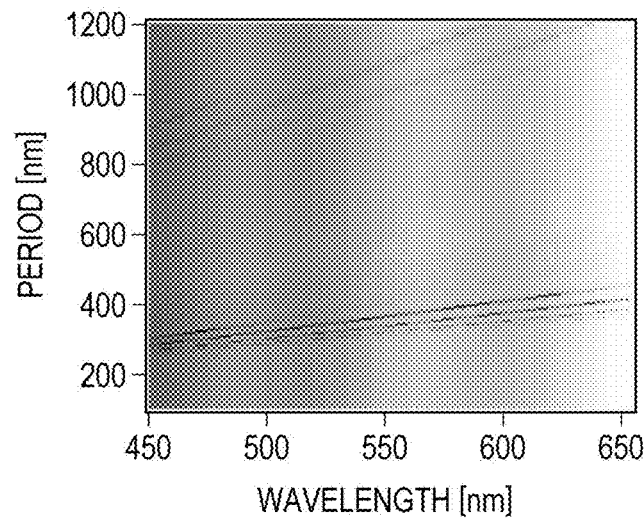
FIG. 13 is a graph showing the results of calculations performed under the same conditions as in FIG. 2 except that the photoluminescent layer and the periodic structure are disposed on a substrate having a refractive index of 1.5.
Figure 14:
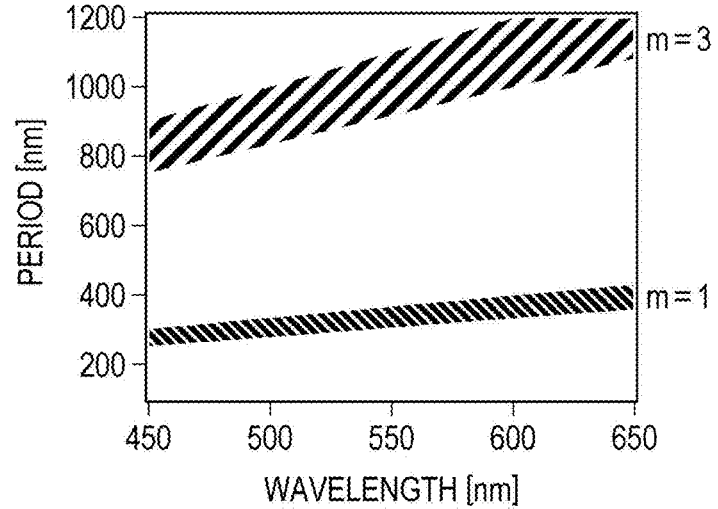
FIG. 14 is a graph illustrating the condition represented by the formula (23)

In order to demonstrate this, calculations were performed under the same conditions as in FIG. 2 except that the photoluminescent layer 110 and the periodic structure 120 were disposed on the substrate 140 having a refractive index of 1.5. FIG. 13 shows the calculation results. Similar to the results shown in FIG. 2, a light intensity peak appears at a particular period for each wavelength. A comparison between FIGS. 13 and 2 shows that the period of peaks is different from FIG. 2. FIG. 14 illustrates the condition represented by the formula (23), which is given by substituting $n_{out} = n_s$ into the formula (18). In FIG. 13, light intensity peaks are observed in the regions corresponding to the ranges shown in FIG. 14.

Thus, for the light-emitting device 100S, in which the photoluminescent layer 110 and the periodic structure 120 are disposed on the substrate 140, a period p that satisfies the formula (23) is effective, and a period p that satisfies the formula (21) is significantly effective.

Figure 15:
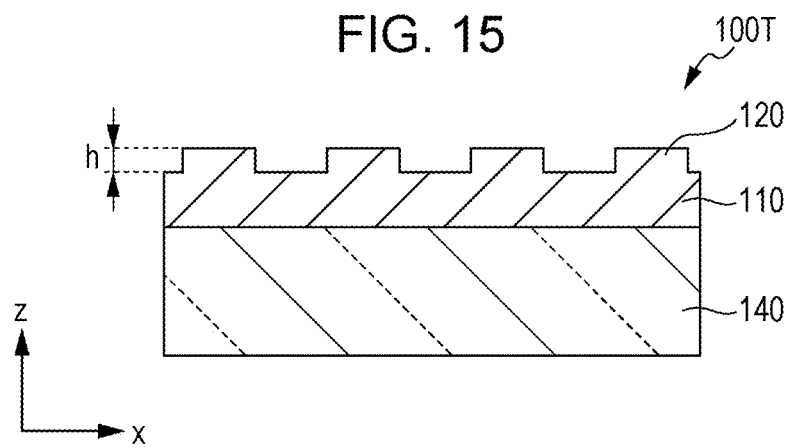
FIG. 15 is a schematic cross-sectional view of a structure including a periodic structure formed by processing a portion of a photoluminescent layer.

4-2. Structure Including Surface Structure Formed of Photoluminescent Material FIG. 15 illustrates a light-emitting device having a periodic structure formed of the material of a photoluminescent layer 110. In a light-emitting device 100T illustrated in FIG. 15, the material of a periodic structure 120 is the same as the material of the photoluminescent layer 110. For example, the periodic structure 120 may be formed by placing a film of a material for forming the photoluminescent layer 110 on a substrate 140 and processing the surface of the film.

In the structure illustrated in FIG. 15, portions projecting outward from the photoluminescent layer 110 correspond to projections constituting the periodic structure 120. Alternatively, a portion between two adjacent projections can correspond to one of the recesses constituting the periodic structure 120. In this structure, the height of the periodic structure 120 indicated by the arrow h in FIG. 15 is defined as the length from the bottom between two adjacent projections to the top surface of the projections in the direction normal to the photoluminescent layer 110 (in the z direction).

4-3. Structure Including Protective Layer

Figure 16:
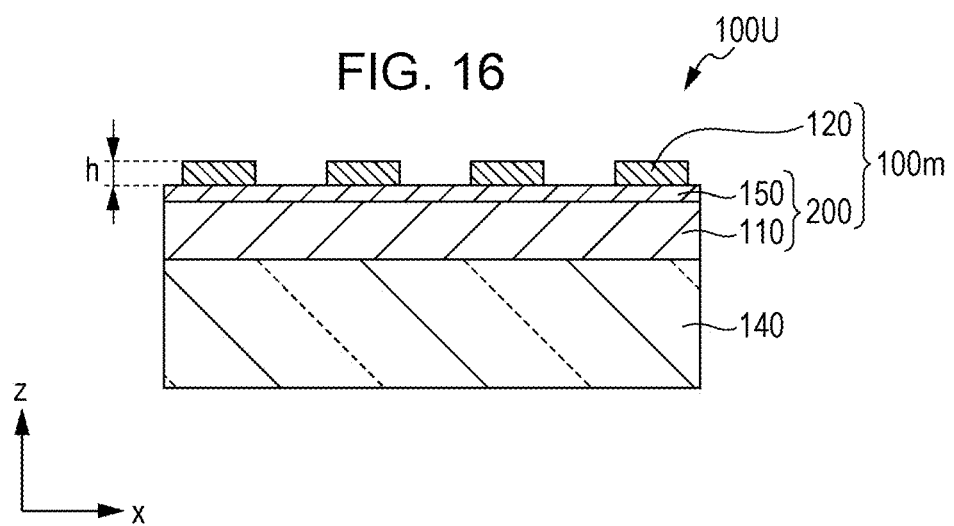
FIG. 16 is a schematic cross-sectional view of a structure including a protective layer between a photoluminescent layer and a periodic structure.

FIG. 16 illustrates a structure including a protective layer 150 between a photoluminescent layer 110 and a periodic structure 120. In the structure illustrated in FIG. 16, a light-emitting device 100m includes the protective layer 150 between the photoluminescent layer 110 and the periodic structure 120. In this embodiment, a substrate 140 is disposed on a main surface of the photoluminescent layer 110 opposite the periodic structure 120. Viewed from another angle, the light-emitting device 100m supported by the substrate 140 constitutes a light-emitting device 100U.

In the illustrated embodiment, a layered body of the photoluminescent layer 110 and the protective layer 150 constitutes a light guiding layer 200 of the light-emitting device 100m. The layered body of the photoluminescent layer 110 and the protective layer 150 is disposed between an air layer and the substrate 140. Thus, the layered body constituting the light guiding layer 200 of the light-emitting device 100m is disposed between two media having different refractive indices.

In the embodiment illustrated in FIG. 16, the periodic structure 120 is disposed on the protective layer 150. In this structure, the height of the periodic structure 120 is defined as the length (indicated by the arrow h in FIG. 16) from the top surface of the protective layer 150 to the top surface of the periodic structure 120 in the direction normal to the photoluminescent layer (in the z direction).

In this way, the protective layer 150 may be provided to protect the photoluminescent layer 110. However, if the protective layer 150 has a lower refractive index than the photoluminescent layer 110, the electric field of guided light leaks into the protective layer 150 only by about half the wavelength $\lambda_a$. Thus, if the protective layer 150 has a thickness greater than the wavelength $\lambda_a$, no light reaches the periodic structure 120. This may result in no quasi-guided mode and eliminate the function of emitting light in a particular direction. If the protective layer 150 has a refractive index higher than or similar to that of the photoluminescent layer 110, light emitted from the photoluminescent layer 110 reaches the interior of the protective layer 150. Consequently, there is no limitation on the thickness of the protective layer 150. Even in this case, higher light output can be produced when the light guiding layer 200 through which light is guided is mostly formed of a photoluminescent material. Thus, also in this case, the protective layer 150 advantageously has a smaller thickness. The protective layer 150 may be formed of the material of the periodic structure 120.

4-4. Periodic Structure on Substrate

Figure 17A:
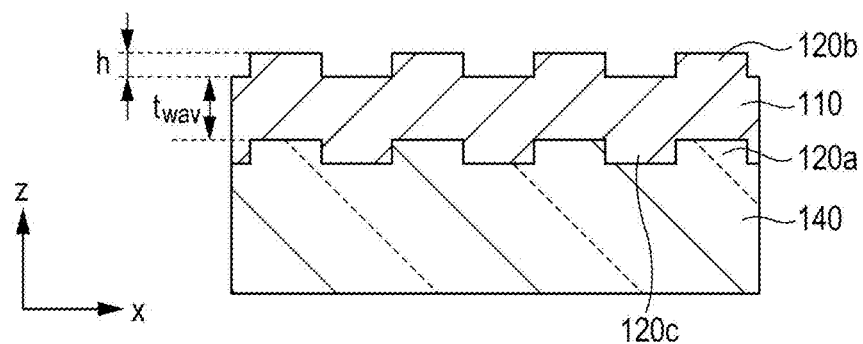
FIG. 17A is a schematic cross-sectional view of a modified example having a periodic structure on a substrate.
Figure 17B:
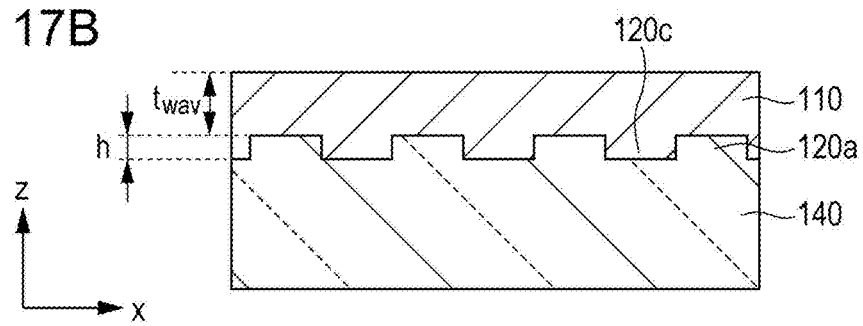
FIG. 17B is a schematic cross-sectional view of another modified example having a periodic structure on a substrate.

As illustrated in FIGS. 17A and 17B, a periodic structure 120a may be formed on a substrate 140, and a photoluminescent layer 110 may be disposed on the periodic structure 120a. In the embodiment illustrated in FIG. 17A, the photoluminescent layer 110 is formed along the texture of the periodic structure 120a on the transparent substrate 140. Consequently, a periodic structure 120b with the same period as the periodic structure 120a is formed on the photoluminescent layer 110.

In the structure illustrated in FIG. 17A, the space between the projections of the periodic structure 120a is filled with the material of the photoluminescent layer 110. Thus, in this structure, when viewed from another angle, a periodic structure 120c is disposed on a surface of the photoluminescent layer 110 facing the substrate 140. Viewed from still another angle, the projections projecting from the substrate 140 toward the photoluminescent layer 110 constitute a periodic structure in a light-emitting device including the photoluminescent layer 110. It goes without saying that the period of the periodic structure 120c is identical with the period of the periodic structure 120a on the substrate 140.

As schematically illustrated in FIG. 17A, the periodic structure 120c includes projections projecting from the photoluminescent layer 110 toward the substrate 140. In the structure illustrated in FIG. 17A, the thickness between these periodic structures (the periodic structures 120b and 120c) disposed on both surfaces of the photoluminescent layer 110 corresponds to the thickness of the photoluminescent layer 110. In other words, as indicated by the arrow $t_{wav}$ in FIG. 17A, the thickness of the photoluminescent layer 110 is the distance from the bottom between two adjacent projections of the periodic structure 120b to the bottom between two adjacent projections of the periodic structure 120c in the direction normal to the photoluminescent layer 110 (or in the direction normal to the substrate 140).

In the embodiment illustrated in FIG. 17B, the photoluminescent layer 110 has a flat surface opposite the substrate 140. Also in this embodiment, when viewed from another angle, a periodic structure 120c including projections projecting from the photoluminescent layer 110 toward the substrate 140 is disposed on a surface of the photoluminescent layer 110 facing the substrate 140. In the structure illustrated in FIG. 17B, the height of the periodic structure 120c (indicated by the arrow h in FIG. 17B) is the length from the bottom between two adjacent projections of the periodic structure 120c to the top surface of the projections in the direction normal to the photoluminescent layer 110 (in the z direction). The thickness of the photoluminescent layer 110 (indicated by the arrow $t_{wav}$ in FIG. 17B) is the distance from the bottom between two adjacent projections of the periodic structure 120c to a surface of the photoluminescent layer 110 facing an air layer in the direction normal to the photoluminescent layer 110 (in the z direction). In these embodiments illustrated in FIGS. 17A and 17B, directional light emission can be generated by setting the period p of the periodic structure 120a so as to satisfy the formula (23).

Figure 17C:
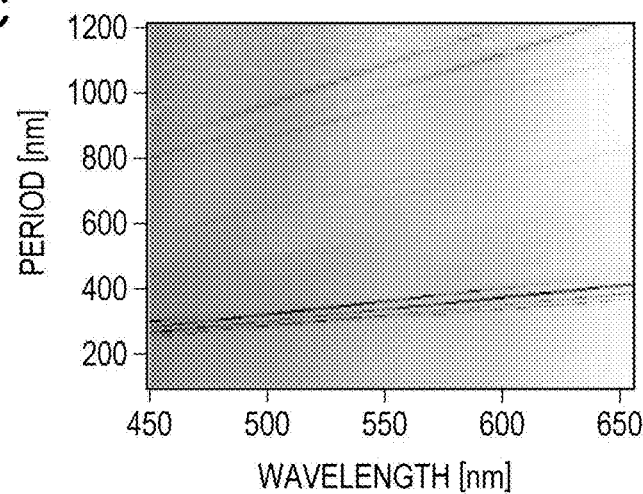
FIG. 17C is a graph showing the calculation results of the enhancement of light emitted from the structure illustrated in FIG. 17A in the front direction with varying emission wavelengths and varying periods of the periodic structure.

In order to verify the effect of these structures, enhancement of light emitted from the structure illustrated in FIG. 17A in the front direction was calculated with varying emission wavelengths and varying periods of the periodic structure. In these calculations, the photoluminescent layer 110 had a thickness of 1,000 nm and a refractive index $n_{wav}$ of 1.8, the periodic structure 120a was a one-dimensional periodic structure uniform in the y direction and had a height of 50 nm, a refractive index $n_p$ of 1.5, and a period of 400 nm, and the polarized light was TE polarized light, which has an electric field component parallel to the y direction. FIG. 17C shows the calculation results. Also in these calculations, light intensity peaks were observed at the periods that satisfy the condition represented by the formula (23).

4-5. Two-Dimensional Periodic Structure

Figure 18A:
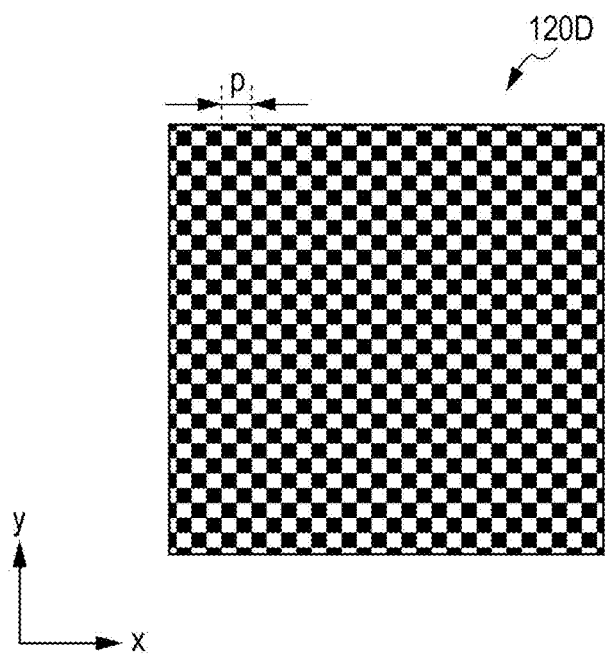
FIG. 18A is a plan view of a two-dimensional periodic structure.
Figure 18B:
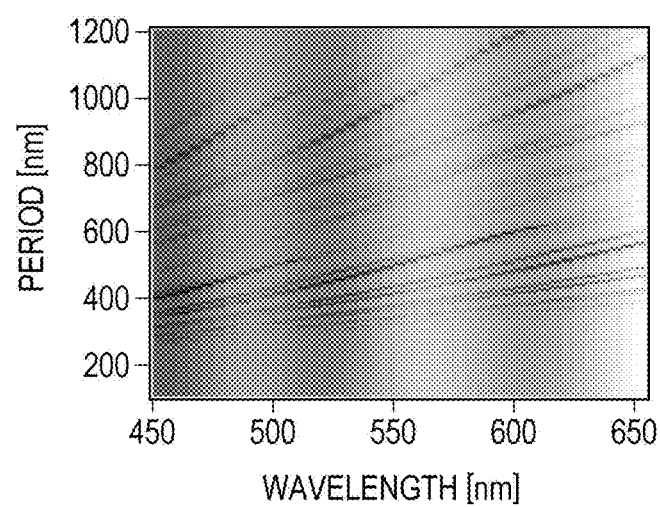
FIG. 18B is a graph showing the results of calculations performed as in FIG. 2 for the two-dimensional periodic structure.

The effects of a two-dimensional periodic structure have also been studied. FIG. 18A is a partial plan view of a two-dimensional periodic structure 120D including projections and recesses arranged in both the x direction and the y direction. In the figure, black regions represent projections, and white regions represent recesses. In such a two-dimensional periodic structure, the diffraction effects are exerted both in the x direction and in the y direction. In the two-dimensional periodic structure 120D, diffraction only in the x direction or only in the y direction is the same as in one-dimensional periodic structures. In addition, the periodic structure 120D involves diffraction in a direction having x and y components (for example, in a direction making an angle of 45 degrees) and is expected to provide different results from one-dimensional structures. FIG. 18B shows the calculation results of enhancement of light for the two-dimensional periodic structure. The calculations were performed under the same conditions as in FIG. 2 except for the type of periodic structure. As shown in FIG. 18B, peaks matching the peaks for TM polarized light in FIG. 6 were observed in addition to peaks matching the peaks for TE polarized light in FIG. 2. These results demonstrate that the two-dimensional periodic structure also outputs TM polarized light by diffraction. For a two-dimensional periodic structure, diffraction that simultaneously satisfies the first-order diffraction conditions in both the x direction and the y direction also has to be taken into account. Such diffracted light is emitted at an angle corresponding to $\sqrt{2}$ times (that is, $2^{1/2}$ times) the period p. Thus, peaks will occur at $\sqrt{2}$ times the period p in addition to peaks that occur in a one-dimensional periodic structure. Such peaks are also observed in FIG. 18B.

5. Experimental Examples

Manufacture of a light-emitting device will be described below. A sample light-emitting device having the structure as illustrated in FIG. 17A was prepared and evaluated for its properties. The light-emitting device was prepared as described below.

Figure 19:
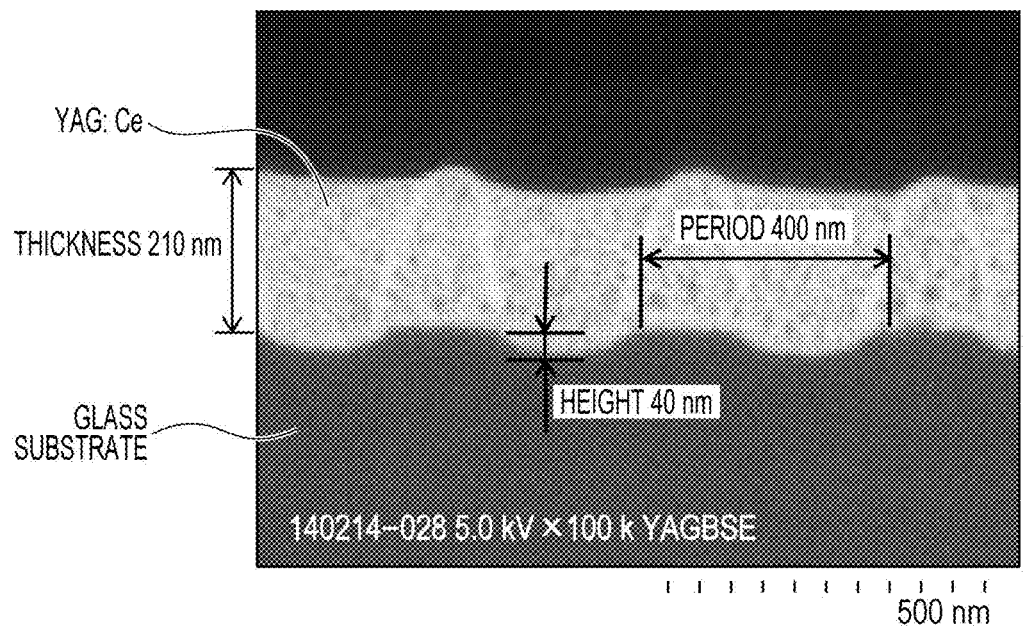
FIG. 19 is a cross-sectional transmission electron microscopy (TEM) image of a photoluminescent layer formed on a glass substrate having a periodic structure.
Figure 20:
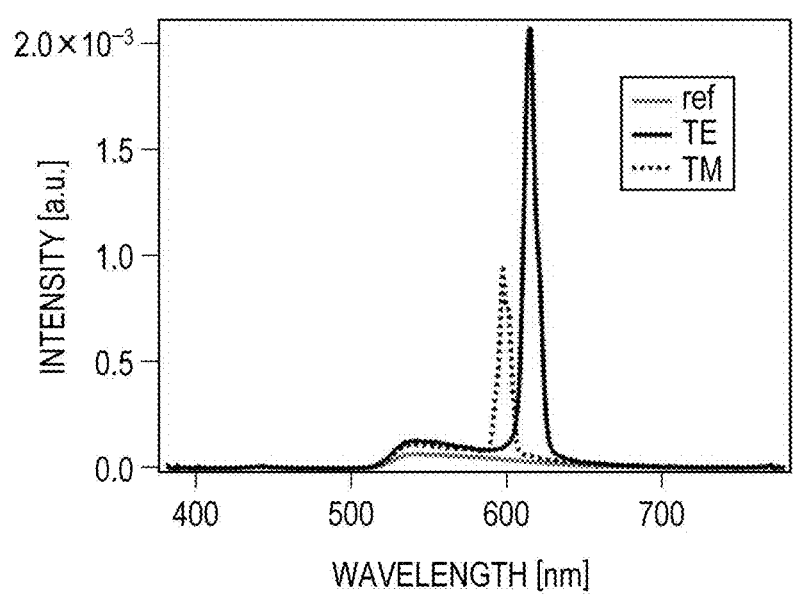
FIG. 20 is a graph showing the measurement results of the spectrum of light emitted from a sample light-emitting device in the front direction.

A one-dimensional periodic structure (stripe-shaped projections) having a period of 400 nm and a height of 40 nm was formed on a glass substrate, and a film (thickness: 210 nm) of a photoluminescent material YAG:Ce was formed on the one-dimensional periodic structure. FIG. 19 shows a cross-sectional transmission electron microscopy (TEM) image of the resulting layered structure. FIG. 20 shows the measurement results of the spectrum of light emitted from the light-emitting device in the front direction when YAG:Ce was excited with an LED having an emission wavelength of 450 nm. FIG. 20 shows the results (ref) for a light-emitting device having no periodic structure, the results for TE polarized light, and the results for TM polarized light. The TE polarized light has a polarization component parallel to the one-dimensional periodic structure. The TM polarized light has a polarization component perpendicular to the one-dimensional periodic structure. The results show that the intensity of light having a particular wavelength is significantly higher in the presence of the periodic structure than in the absence of the periodic structure. The results also show that the emission enhancement effect is greater in TE polarized light, which has a polarization component parallel to the one-dimensional periodic structure.

Figure 21A:
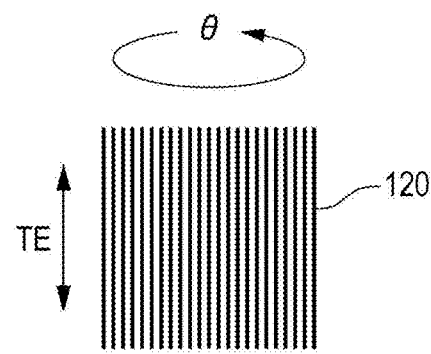
FIG. 21A is a schematic view of a light-emitting device that emits linearly TE polarized light, rotated about an axis parallel to the line direction of a one-dimensional periodic structure.
Figure 21B:
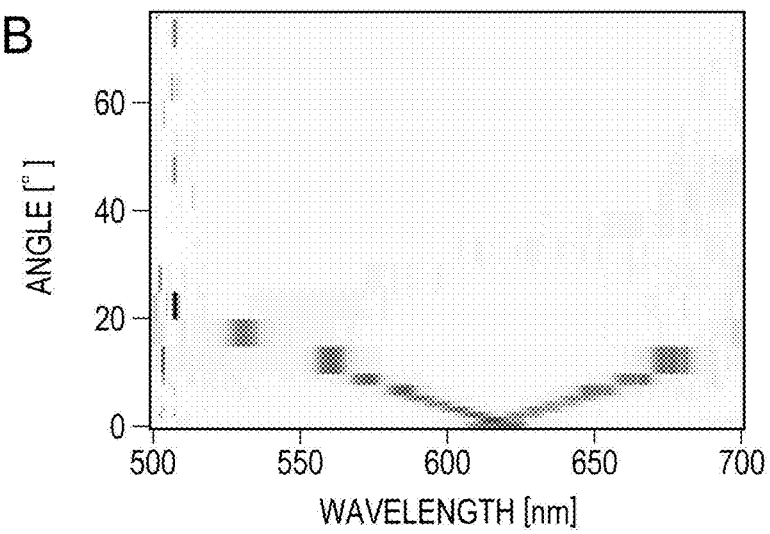
FIG. 21B is a graph showing the measurement results of the angular dependence of light emitted from a sample light-emitting device rotated as illustrated in FIG. 21A.
Figure 21C:
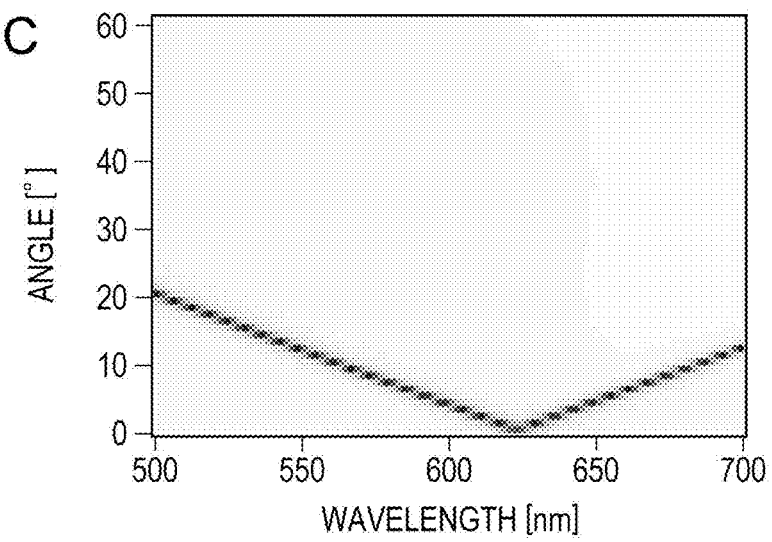
FIG. 21C is a graph showing the calculation results of the angular dependence of light emitted from a sample light-emitting device rotated as illustrated in FIG. 21A.
Figure 21D:
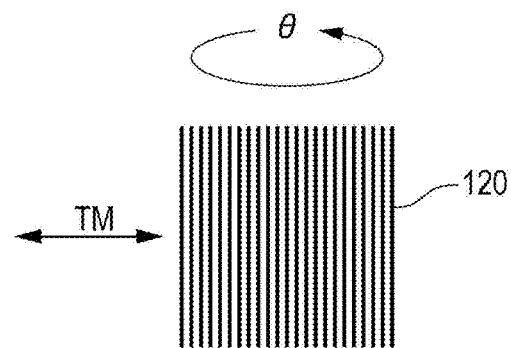
FIG. 21D is a schematic view of a light-emitting device that emits linearly TM polarized light, rotated about an axis parallel to the line direction of a one-dimensional periodic structure.
Figure 21E:
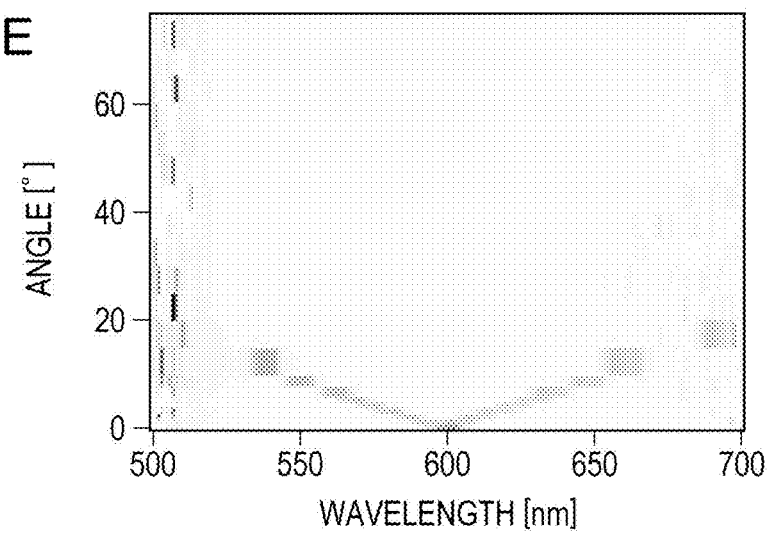
FIG. 21E is a graph showing the measurement results of the angular dependence of light emitted from a sample light-emitting device rotated as illustrated in FIG. 21D.
Figure 21F:
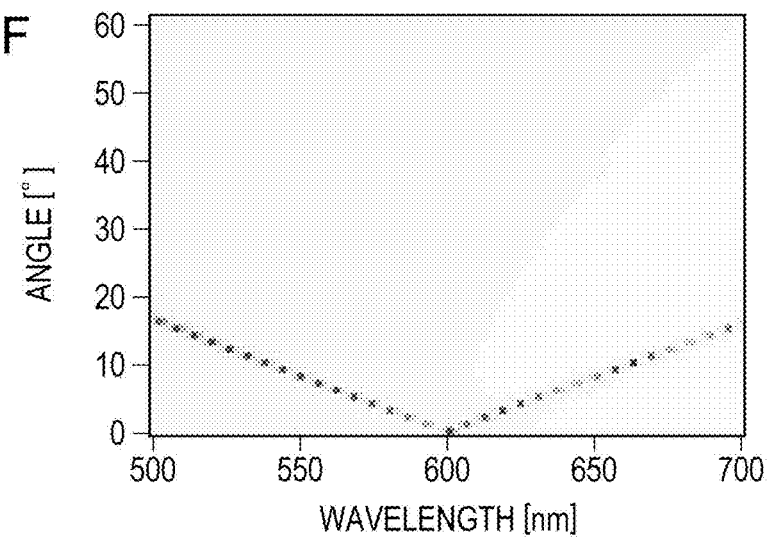
FIG. 21F is a graph showing the calculation results of the angular dependence of light emitted from a sample light-emitting device rotated as illustrated in FIG. 21D.
Figure 22A:
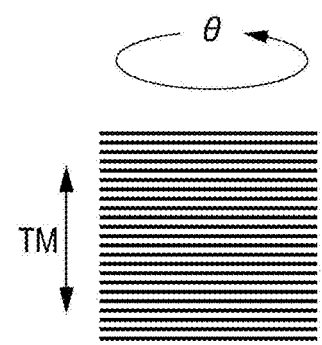
FIG. 22A is a schematic view of a light-emitting device that emits linearly TM polarized light, rotated about an axis perpendicular to the line direction of a one-dimensional periodic structure.
Figure 22B:
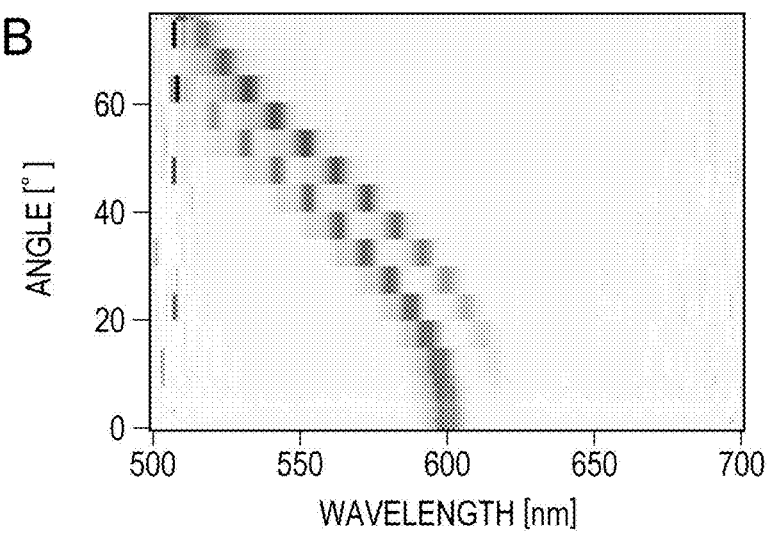
FIG. 22B is a graph showing the measurement results of the angular dependence of light emitted from a sample light-emitting device rotated as illustrated in FIG. 22A.
Figure 22C:
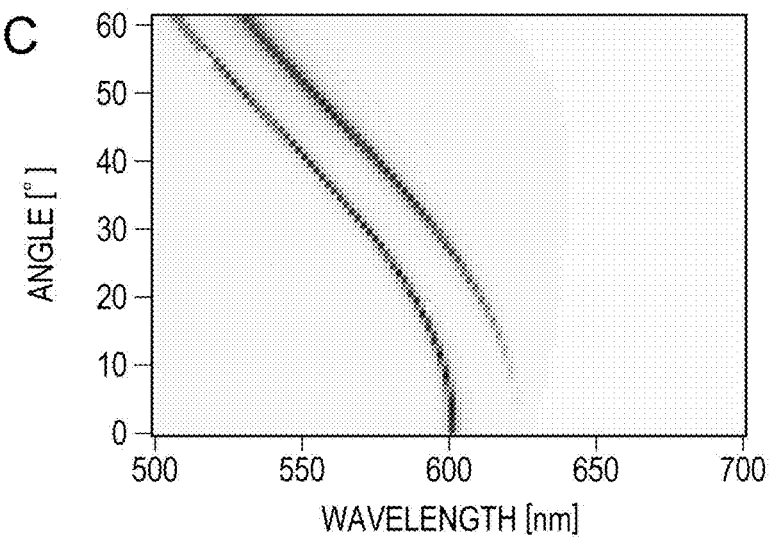
FIG. 22C is a graph showing the calculation results of the angular dependence of light emitted from a sample light-emitting device rotated as illustrated in FIG. 22A.
Figure 22D:
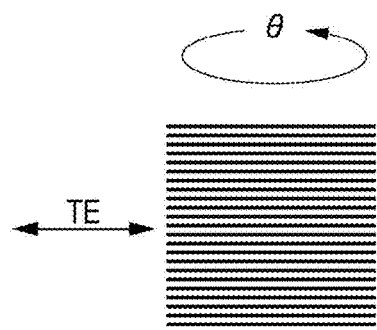
FIG. 22D is a schematic view of a light-emitting device that emits linearly TE polarized light, rotated about an axis perpendicular to the line direction of a one-dimensional periodic structure.
Figure 22E:
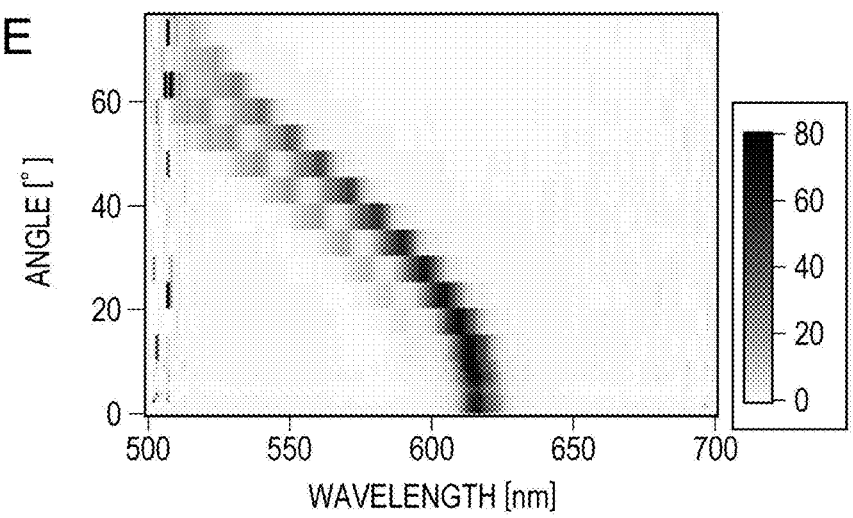
FIG. 22E is a graph showing the measurement results of the angular dependence of light emitted from a sample light-emitting device rotated as illustrated in FIG. 22D.
Figure 22F:
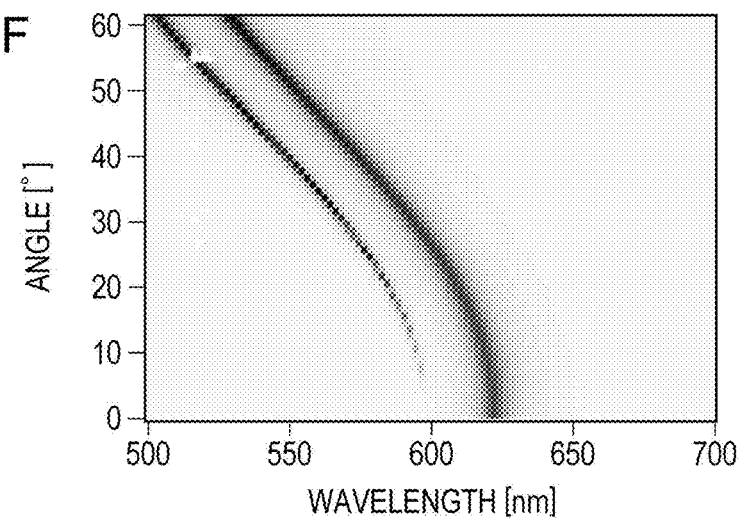
FIG. 22F is a graph showing the calculation results of the angular dependence of light emitted from a sample light-emitting device rotated as illustrated in FIG. 22D.

FIGS. 21A to 21F and FIGS. 22A to 22F show the results of measurements and calculations of the angular dependence of the intensity of light emitted from the same sample. FIG. 21A illustrates a light-emitting device that emits linearly TE polarized light, rotated about an axis parallel to the line direction (the longitudinal direction of stripe-shaped projections) of a periodic structure 120 (a one-dimensional periodic structure). FIGS. 21B and 21C show the results of measurements and calculations for the rotation. FIG. 21D illustrates a light-emitting device that emits linearly TM polarized light, rotated about an axis parallel to the line direction of a one-dimensional periodic structure. FIGS. 21E and 21F show the results of measurements and calculations for the rotation. FIG. 22A illustrates a light-emitting device that emits linearly TM polarized light, rotated about an axis perpendicular to the line direction of a periodic structure 120 (a one-dimensional periodic structure). FIGS. 22B and 22C show the results of measurements and calculations for the rotation. FIG. 22D illustrates a light-emitting device that emits linearly TE polarized light, rotated about an axis perpendicular to the line direction of a one-dimensional periodic structure. FIGS. 22E and 22F show the results of measurements and calculations for the rotation.

As is clear from FIGS. 21A to 21F and FIGS. 22A to 22F, the enhancement effect is greater for TE polarized light. The wavelength of enhanced light shifts with angle. For example, light having a wavelength of 610 nm is observed only for polarized light and in the front direction, indicating that the light is directional and polarized. Furthermore, the measurement results and the calculation results match each other in FIGS. 21B and 21C, FIGS. 21E and 21F, FIGS. 22B and 22C, and FIGS. 22E and 22F. Thus, the validity of the above calculations was experimentally demonstrated.

Figure 23:
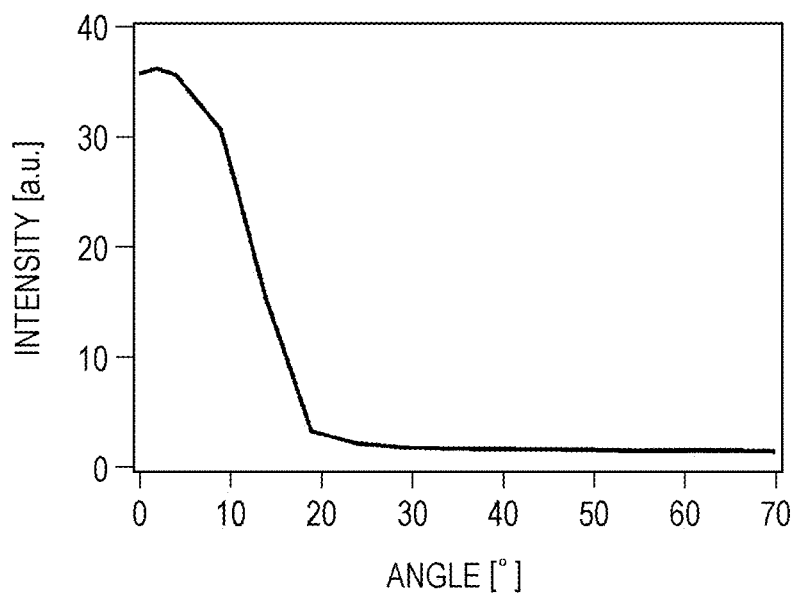
FIG. 23 is a graph showing the measurement results of the angular dependence of light (wavelength: 610 nm) emitted from a sample light-emitting device.

FIG. 23 shows the angular dependence of the intensity of light having a wavelength of 610 nm for rotation about an axis perpendicular to the line direction, as illustrated in FIG. 22D. The results show that the light was significantly enhanced in the front direction and was little enhanced at other angles. The directional angle of light emitted in the front direction is less than 15 degrees. As described above, the directional angle is the angle at which the intensity is 50% of the maximum intensity and is expressed as the angle of one side with respect to the direction with the maximum intensity. The results shown in FIG. 23 demonstrates that directional light emission was generated. In addition, output light was entirely a component of TE polarized light, which demonstrates that polarized light emission was simultaneously generated.

These verification experiments were performed with YAG:Ce, which emits light over a wide wavelength range. Directional polarized light emission can also be generated in similar experiments using a photoluminescent material that emits light in a narrow wavelength range. Such a photoluminescent material does not emit light having other wavelengths and can therefore be used to provide a light source that does not emit light in other directions or in other polarized states.

6. Directionality Improved by Limited Polarization

FIGS. 21A to 21F are referred to again. For example, as can be seen from FIG. 21C, in this embodiment, TE polarized light having a wavelength of 610 nm is strongly emitted in the front direction of the light-emitting device. By contrast, for TM polarized light in FIG. 21F, light having a wavelength of 610 nm is emitted in a direction different from the front direction. At a particular wavelength, the direction in which light is strongly emitted is different between TE polarized light and TM polarized light. A comparison between FIGS. 21C and 21F shows that the wavelength of light strongly emitted in the front direction of the light-emitting device is different between TE polarized light and TM polarized light.

The results in FIGS. 21B, 21C, 21E, and 21F show that even if a light-emitting device is designed to strongly emit one polarized light in the front direction, the other polarized light can be strongly emitted in a direction away from the front direction, and the light-emitting device can have reduced directionality. The present inventors have focused on these analysis results and have studied a structure that can achieve higher directionality.

Figure 24A:
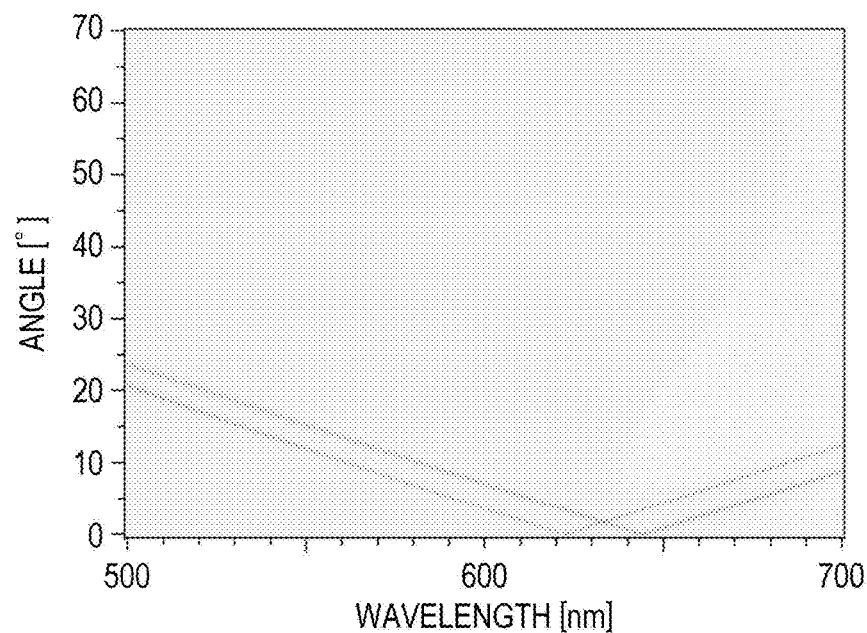
FIG. 24A is a graph showing the calculation results of the angular dependence of the intensities of TE polarized light and TM polarized light.

FIG. 24A shows the calculation results of the angular dependence of the intensities of TE polarized light and TM polarized light. The calculation model includes a photoluminescent layer having a refractive index of 1.8 on a transparent substrate having a refractive index of 1.5. A one-dimensional periodic structure (stripe-shaped projections) is disposed on the photoluminescent layer. In the calculation, the photoluminescent layer has a thickness of 200 nm, and the one-dimensional periodic structure has a refractive index of 1.5, a period of 400 nm, and a height of 40 nm.

Figure 24B:
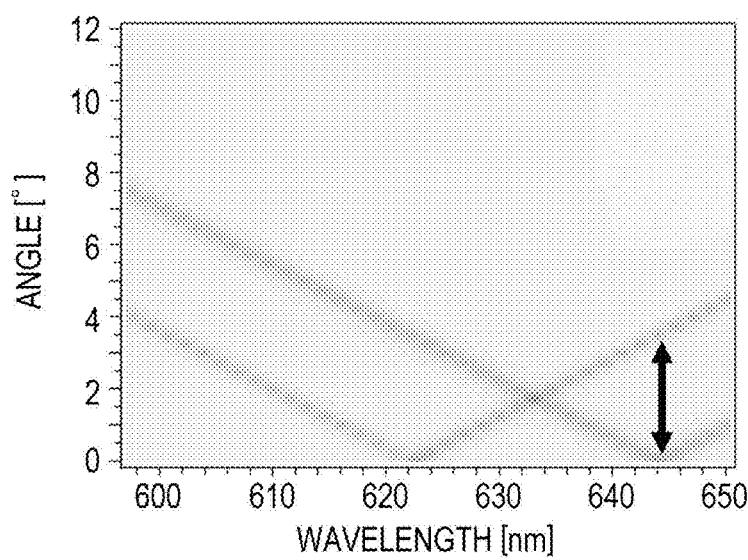
FIG. 24B is an enlarged view of the graph of FIG. 24A at a rotation angle of approximately 0 degrees.
Figure 24C:
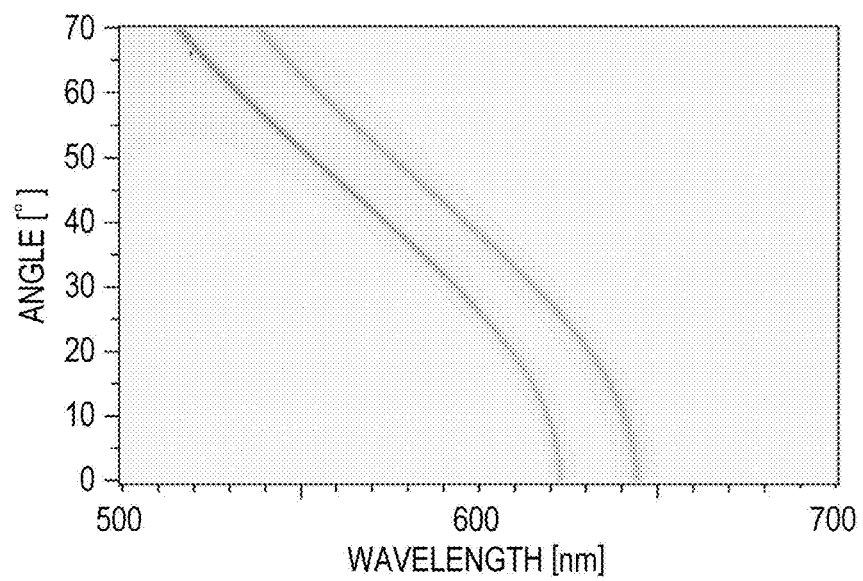
FIG. 24C is a graph showing the calculation results of the angular dependence of the intensities of TE polarized light and TM polarized light.
Figure 24D:
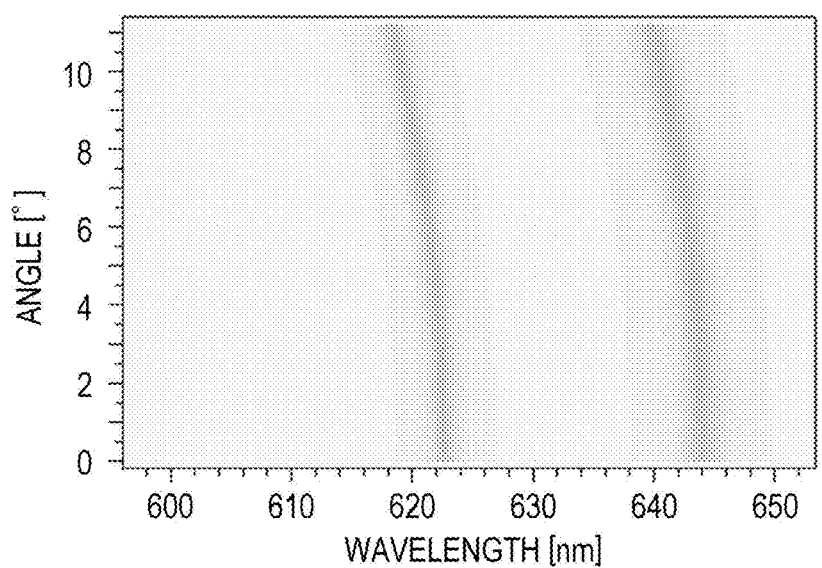
FIG. 24D is an enlarged view of the graph of FIG. 24C at a rotation angle of approximately 0 degrees.

FIG. 24A shows the calculation results of the angular dependence of the intensity of light emitted from a light-emitting device rotated about an axis parallel to the line direction of the one-dimensional periodic structure, as illustrated in FIGS. 21A and 21D. FIG. 24B is an enlarged view of the graph of FIG. 24A at a rotation angle of approximately 0 degrees. FIG. 24C shows the calculation results of the angular dependence of the intensities of TE polarized light and TM polarized light using the calculation model described with reference to FIG. 24A. FIG. 24C shows the calculation results of the angular dependence of the intensity of light emitted from a light-emitting device rotated about an axis perpendicular to the line direction of the one-dimensional periodic structure, as illustrated in FIGS. 22A and 22D. FIG. 24D is an enlarged view of the graph of FIG. 24C at a rotation angle of approximately 0 degrees.

FIGS. 24A and 24C show that the light-emitting device having a one-dimensional periodic structure emits both TE polarized light and TM polarized light and can thereby exhibit overlapping light-emitting properties of the angular dependence of TE polarized light and the angular dependence of TM polarized light. For example, for light having a wavelength of 644 nm, the presence of light emission in a direction away from the front direction can reduce directionality, as shown in FIGS. 24B and 24D.

As described above, a periodic structure on a photoluminescent layer can provide a narrow-angle light distribution. A narrow-angle light distribution can also be provided when the photoluminescent layer is disposed on a substrate, as demonstrated by the experimental examples described with reference to FIGS. 19 to 22F, for example. When a photoluminescent layer is disposed on a substrate, the photoluminescent layer is disposed between the substrate and an air layer, for example. Thus, in a structure that includes a photoluminescent layer on a substrate, the material of the substrate can be chosen to relatively easily differentiate the refractive index of a medium adjacent to one surface of the photoluminescent layer from the refractive index of a medium adjacent to the other surface. The present inventors have focused on these analysis results and have investigated the possibility of selectively extracting one polarized light.

As described above with reference to FIGS. 1A to 1D, a light-emitting device according to an embodiment of the present disclosure has properties similar to those of slab waveguides. The structure including the substrate 140 illustrated in FIGS. 1C and 1D can be represented by a waveguide disposed between two media having different refractive indices.

Figure 42B:
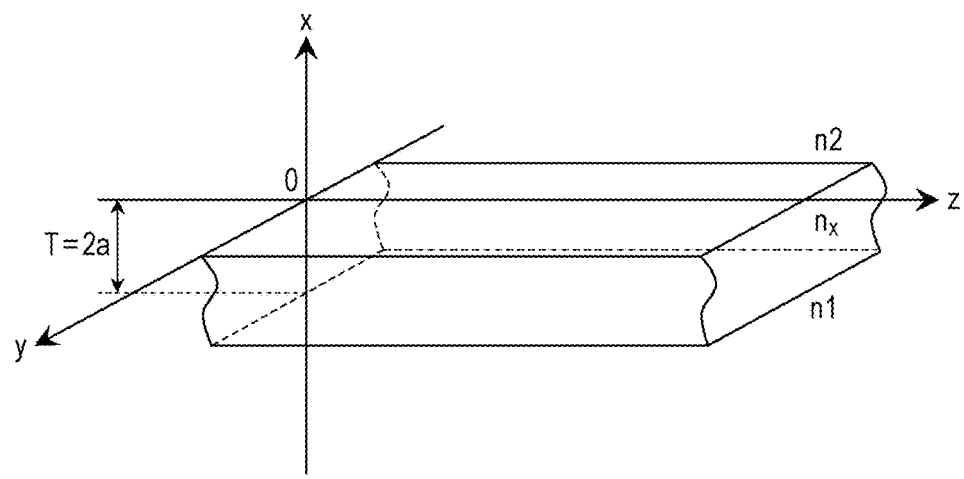
FIG. 42B is a schematic view of a model of a slab waveguide disposed between two media having different refractive indices.

FIG. 42B illustrates a model of a slab waveguide disposed between two media having different refractive indices. The slab waveguide extends in the yz plane.

FIG. 42B illustrates a model of a slab waveguide (refractive index: $n_x$) disposed between a medium having a refractive index n1 and a medium having a refractive index n2. In the model illustrated in FIG. 42B, the interface between the slab waveguide having a refractive index $n_x$ and the medium having a refractive index n2 is disposed at x=0, and the interface between the slab waveguide having a refractive index $n_x$ and the medium having a refractive index n1 is disposed at x=−2a. Thus, the slab waveguide of the model has a thickness T of 2a. It is assumed that $n_x > n1 > n2$. The model illustrated in FIG. 42B is also referred to as an asymmetric three-layer slab waveguide. In FIG. 42B, the slab waveguide having a refractive index $n_x$ and the medium having a refractive index n1 correspond to the photoluminescent layer 110 and the substrate 140 in FIG. 1C, respectively. The medium having a refractive index n2 corresponds to an air layer facing the periodic structure 120 on the photoluminescent layer 110.

First, a light wave in the TE mode transmitted through the asymmetric three-layer slab waveguide will be described below. A y component $E_y(x)$ of an electric field E of a light wave transmitted through the slab waveguide is represented by the following formula (24) in consideration of the continuity conditions at the interface. In the following formula (24), A, B, p, q, and r are constants.

$$E_y(x) = \begin{cases} A\exp[-rx] & (x \geq 0) \\ A\cos qx + B\sin qx & (0 \geq x \geq a) \\ (A\cos 2aq - B\sin 2aq)\exp[p(x+2a)] & (-2a \geq x) \end{cases} \quad (24)$$

The electric field E must satisfy the wave equation represented by the following formula (25), and the following formula (26) is derived. In the formula, $k_0$ denotes a wave number represented by $k_0 = (2\pi/\lambda_0)$ using $\lambda_0$ in a vacuum, and β denotes the propagation constant of the slab waveguide.

$$\frac{\partial^2 E}{\partial x^2} + (n^2 k_0^2 - \beta^2)E = 0 \quad (25)$$

$$r^2 = \beta^2 - n2^2 k_0^2 \quad (26)$$
$$q^2 = n_x^2 k_0^2 - \beta^2$$
$$p^2 = \beta^2 - n1^2 k_0^2$$

A relational expression between $E_y(x)$ and a z component $H_z(x)$ of the magnetic field H of a light wave transmitted through the slab waveguide is derived using Maxwell equations. The relational expression is used to determine $H_z(x)$ from $E_y(x)$. The following formula (27) is derived from the continuity conditions for $H_z(x)$ at x=0 and x=−2a. The formula (26) is used to derive the formula (28) from the formula (27).

$$\tan 2aq = \frac{q(p+r)}{q^2 - pr} \quad (27)$$

$$\frac{T}{\lambda_0} = \frac{1}{2\pi\sqrt{n_x^2 - n_{eff}^2}}\left(\tan^{-1}\sqrt{\frac{n_{eff}^2 - n1^2}{n_x^2 - n_{eff}^2}} + \tan^{-1}\sqrt{\frac{n_{eff}^2 - n2^2}{n_x^2 - n_{eff}^2}} + m\pi\right) \quad (28)$$

In the formula (28), $n_{eff}$ denotes the effective refractive index and is represented by $n_{eff} = (\beta/k_0)$. From the formula (28), the cut-off thickness $T_{cutoff}$ of a light wave having a wavelength $\lambda_a$ is represented by the following formula (29).

$$\frac{T_{cutoff}}{\lambda_a} = \frac{1}{2\pi\sqrt{n_x^2 - n1^2}}\left(\tan^{-1}\sqrt{\frac{n1^2 - n2^2}{n_x^2 - n1^2}} + m\pi\right) \quad (29)$$

The cut-off thickness $T_{cutoff}$ for the TM mode is then determined. For the TM mode, a y component $H_y(x)$ of the magnetic field is used. In consideration of the continuity conditions at the interface, the y component $H_y(x)$ of the magnetic field is represented by the following formula (30). In the following formula (30), C and D are constants.

$$H_y(x) = \begin{cases} C\exp[-rx] & (x \geq 0) \\ C\cos qx + D\sin qx & (0 \geq x \geq a) \\ (C\cos 2aq - D\sin 2aq)\exp[p(x+2a)] & (-2a \geq x) \end{cases} \quad (30)$$

A relational expression between $H_y(x)$ and $E_z(x)$ is derived using Maxwell equations. From the relational expression and the formula (30), $E_z(x)$ is represented by the following formula (31) using an angular frequency ω. The following formula (32) is derived from the continuity conditions with respect to $E_z(x)$ and the formula (26).

$$E_z(x) = -\frac{i}{\omega\varepsilon_0} \begin{cases} -\frac{rC}{n2^2}\exp[-rx] & (x \geq 0) \\ \frac{q}{n_x^2}(-C\sin qx + D\cos qx) & (0 \geq x \geq a) \\ \frac{p}{n1^2}(C\cos 2aq - D\sin 2aq)\exp[p(x+2a)] & (-2a \geq x) \end{cases} \quad (31)$$

$$\tan 2aq = \frac{n_x^2 q(n2^2 p + n1^2 r)}{n1^2 n2^2 q^2 - n_x^4 pr} \quad (32)$$

The following formula (33) is derived from the formula (32). Finally, the cut-off thickness $T_{cutoff}$ of a light wave having a wavelength $\lambda_a$ is represented by the following formula (34).

$$\frac{T}{\lambda_0} = \frac{1}{2\pi\sqrt{n_x^2 - n_{eff}^2}} \left( \tan^{-1}\frac{n_x^2}{n1^2}\sqrt{\frac{n_{eff}^2 - n1^2}{n_x^2 - n_{eff}^2}} + \tan^{-1}\frac{n_x^2}{n2^2}\sqrt{\frac{n_{eff}^2 - n2^2}{n_x^2 - n_{eff}^2}} + m\pi \right) \quad (33)$$

$$\frac{T_{cutoff}}{\lambda_a} = \frac{1}{2\pi\sqrt{n_x^2 - n1^2}} \left( \tan^{-1}\frac{n_x^2}{n2^2}\sqrt{\frac{n1^2 - n2^2}{n_x^2 - n1^2}} + m\pi \right) \quad (34)$$

A comparison between the formula (29) and the formula (34) shows that the cut-off thickness $T_{cutoff}$ in the asymmetric three-layer slab waveguide is different between the TE mode and the TM mode. If the asymmetric three-layer slab waveguide is a photoluminescent layer, and the medium having a refractive index n2 is an air layer, then $n_x > n2$ holds generally. As is clear from the formula (29) and the formula (34), the cut-off thickness $T_{cutoff}$ for the TM mode is always greater than the cut-off thickness $T_{cutoff}$ for the TE mode.

In order to transmit light having a wavelength $\lambda_a$ through a slab waveguide, the thickness of the slab waveguide must be greater than the cut-off thickness $T_{cutoff}$. The present inventors thought that the mode of a light wave that can be transmitted through a photoluminescent layer used as a slab waveguide is also limited by the thickness of the photoluminescent layer and have conducted further investigations.

In a quasi-guided mode, the surface structure has an influence on light guiding. Thus, in a light-emitting device having a surface structure, the refractive index $n_{wav}$ of a photoluminescent layer cannot be directly applied to the refractive index $n_x$ in the above formulae. Accordingly, the present inventors have studied a waveguide structure that can be selectively applied to the TE mode by adjusting the effective thickness in a predetermined range in consideration of the effects of a surface structure disposed on a photoluminescent layer.

In a light-emitting device according to an embodiment of the present disclosure, the effective thickness $t_{eff}$ of a layered structure of the photoluminescent layer 110 and the surface structure 120 is determined so as to satisfy the following formula (35). In the formula (35), n1 and n2 denote the refractive indices of the media on the main surfaces of the photoluminescent layer 110. Typically, n1 denotes the refractive index of a substrate that supports the photoluminescent layer 110.

$$\frac{\lambda_a}{2\pi\sqrt{n_{wav-a}^2 - n1^2}} \left[ \tan^{-1}\left(\sqrt{\frac{n1^2 - n2^2}{n_{wav-a}^2 - n1^2}}\right) + m\pi \right] < t_{eff} < \quad (35)$$

-continued $$\frac{\lambda_a}{2\pi\sqrt{n_{wav-a}^2 - n1^2}} \left[ \tan^{-1}\left(\frac{n_{wav-a}^2}{n2^2}\sqrt{\frac{n1^2 - n2^2}{n_{wav-a}^2 - n1^2}}\right) + m\pi \right]$$

The effective thickness $t_{eff}$ of a layered structure of the photoluminescent layer 110 and the surface structure 120 can be defined by the following formula (36). In the formula (36), $t_{wav}$ denotes the thickness of the photoluminescent layer 110, h denotes the thickness of the surface structure 120, and $n_p$ denotes the refractive index of the surface structure 120 for light having a wavelength $\lambda_a$ in air.

$$t_{eff} = t_{wav} + (1 - R_v) \cdot h \cdot \frac{n_p}{n_{wav-a}^2} \quad (36)$$

Figure 25A:
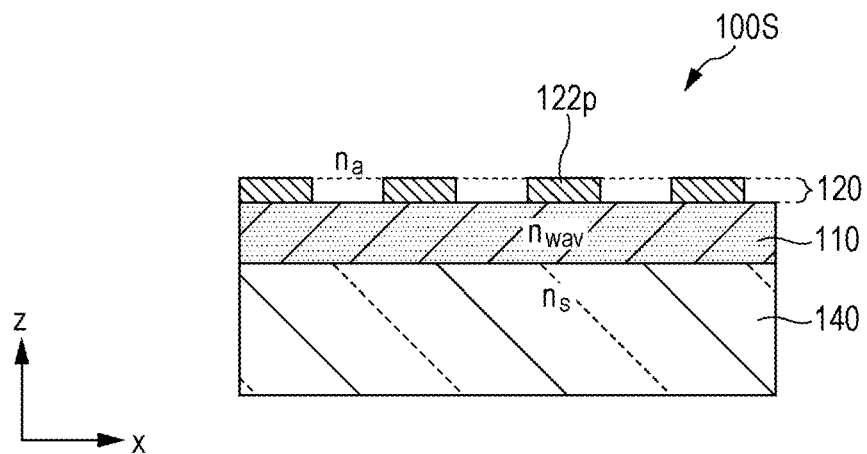
FIG. 25A is a schematic cross-sectional view illustrating a method for determining the volume ratio $R_v$ of the portions between the projections of a surface structure to the surface structure.

The second term $R_v$ in the formula (36) denotes the volume ratio of the portions between the projections of the surface structure to the surface structure. For example, as illustrated in FIG. 25A, a surface structure 120 having projections 122p is disposed on a photoluminescent layer 110, which is disposed on a substrate 140. A portion between two adjacent projections is a recess. The surface structure 120 on the photoluminescent layer 110 faces an air layer, and the recesses are filled with air. In this embodiment, the volume ratio $R_v$ is the volume ratio of the air layer to the surface structure 120. The surface structure 120 extends from the top surface of the photoluminescent layer 110 to the top surface of the projections 122p. Thus, the volume ratio $R_v$ is the ratio of the volume of the recesses to the volume of the projections and recesses of the periodic structure 120b. For example, if the volume ratio of the projections 122p to the region extending from the top surface of the photoluminescent layer 110 to the top surface of the projections 122p is 60%, then $R_v = 40\%$.

Figure 25B:
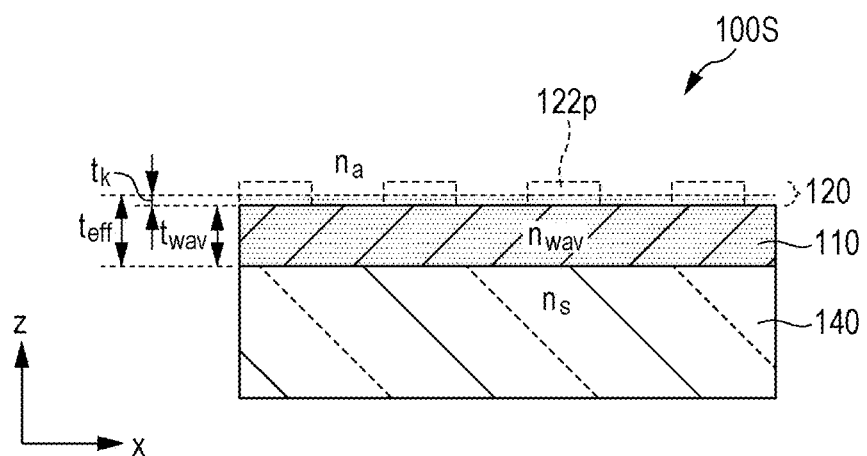
FIG. 25B is a schematic cross-sectional view illustrating a method for determining the effective thickness $t_{\mathit{eff}}$ of a layered structure including a photoluminescent layer and a surface structure.

The second term in the formula (36) is a correction term for the effects of the surface structure 120, and the factor $(1-R_v) \cdot h$ means the thickness of a continuous film formed by flattening the projections and recesses of the surface structure 120. Thus, the entire second term in the formula (36) corresponds to the thickness $t_k$ of the surface structure 120 replaced by the photoluminescent layer (see FIG. 25B). The present inventors have found that when the effective thickness $t_{eff}$ in the formula (36) satisfies the formula (35), transmission of a light wave in the TM mode through a waveguide can be reduced also in a quasi-guided mode formed by a combination of the photoluminescent layer 110 and the surface structure 120, as described below.

Figure 26:
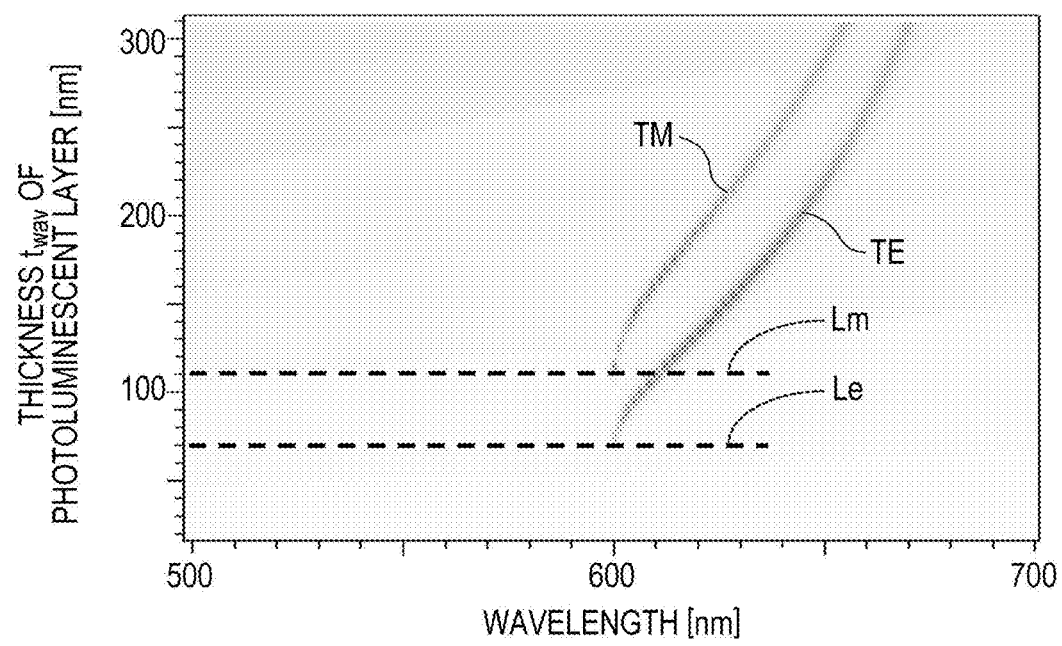
FIG. 26 is a graph showing the calculation results of enhancement of light emitted in the front direction with varying emission wavelengths and varying thicknesses $t_{wav}$ of the photoluminescent layer. The photoluminescent layer has a refractive index $n_{wav}$ of 1.8, and the periodic structure has a period of 400 nm, a height of 40 nm, and a refractive index of 1.5.

FIG. 26 shows the calculation results of enhancement of light emitted in the front direction with varying emission wavelengths and varying thicknesses $t_{wav}$ of the photoluminescent layer. The photoluminescent layer had a refractive index $n_{wav}$ of 1.8, and the periodic structure had a period of 400 nm, a height of 40 nm, and a refractive index of 1.5. FIG. 26 shows the calculation results of enhancement of light in a structure that includes a substrate having a refractive index of 1.5 on a main surface of the photoluminescent layer opposite the main surface of the photoluminescent layer on which the periodic structure is disposed. The volume ratio of the projections of the surface structure to the entire surface structure is 50%. Thus, $R_v$ is calculated to be 50%. In the calculation, the medium facing the main surface on which the periodic structure is disposed is air (refractive index: 1.0).

As shown in FIG. 26, the presence of the substrate on a main surface of the photoluminescent layer results in different calculation results from those shown in FIG. 4. In FIG. 26, the broken lines Le and Lm indicate the cut-off thicknesses of the TE mode and the TM mode, respectively, in the light-emitting device. FIG. 26 shows that when the photoluminescent layer has a thickness of more than 110 nm, the presence of a plurality of peak wavelengths can reduce directionality. When the photoluminescent layer has a thickness of less than 110 nm, the TM mode is cut off. When the photoluminescent layer has a thickness of less than 70 nm, the TE mode is also cut off. In this embodiment, when the photoluminescent layer has a thickness in the range of 70 to 110 nm, the output light is limited to the TE mode, and the output wavelength in the front direction is limited to one.

The cut-off thickness $T_{cutoff}$ of an asymmetric three-layer waveguide that includes a waveguide having a refractive index of 1.8 on a transparent substrate having a refractive index of 1.5 for light having a wavelength of 600 nm is 81 nm for the TE mode and 125 nm for the TM mode, as determined by the formulae (29) and (34). In FIG. 26, the cut-off thicknesses for the TE mode and the TM mode are smaller than the cut-off thickness $T_{cutoff}$ of an asymmetric three-layer slab waveguide.

In the model used for this calculation example, the second term of the formula (36) is approximately 17 nm. Thus, in this embodiment, the formation of the surface structure increases the thickness of the photoluminescent layer by 17 nm. For light having a wavelength of 600 nm, subtracting 17 nm from the cut-off thicknesses $T_{cutoff}$ 81 nm and 125 nm gives 64 nm and 108 nm, which are nearly identical to the cut-off thickness 70 nm for the TE mode and 110 nm for the TM mode in FIG. 26.

Figure 27A:
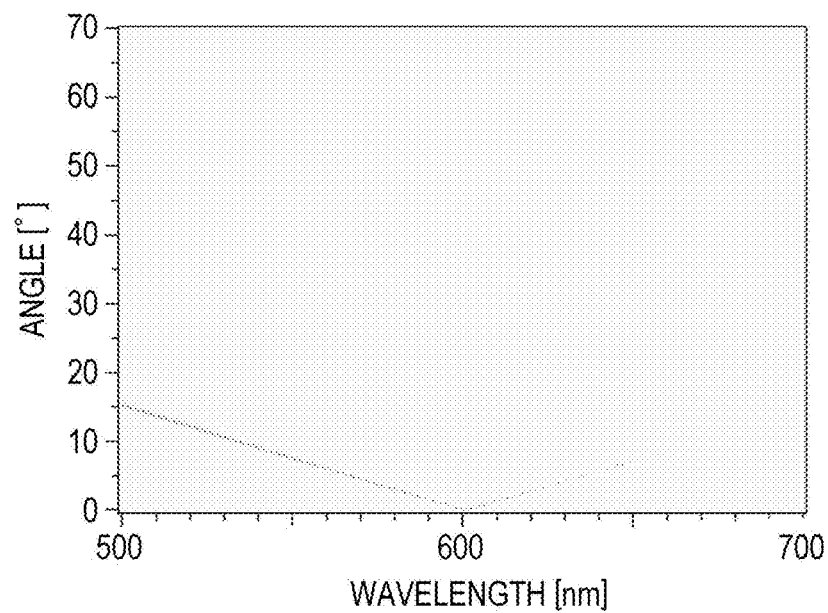
FIG. 27A is a graph showing the calculation results of the angular dependence of the intensity of light emitted from the model used for the calculation in FIG. 26 when the photoluminescent layer has a thickness $t_{wav}$ of 80 nm.
Figure 27B:
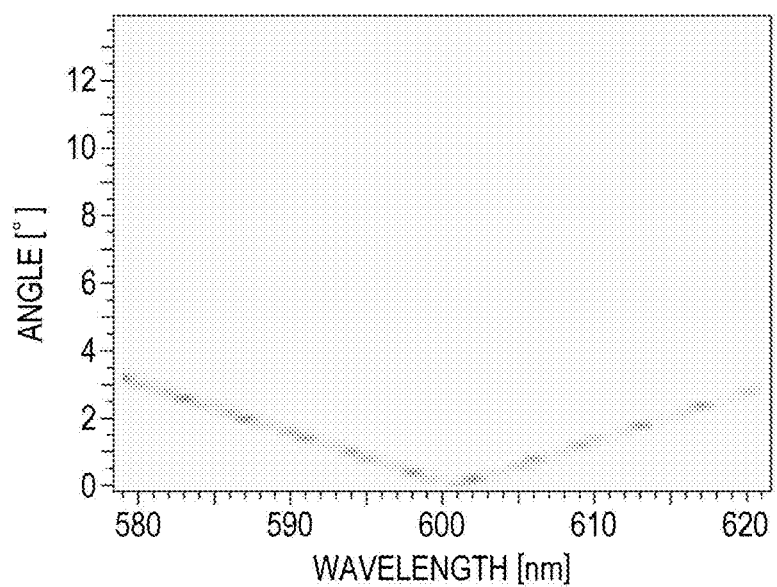
FIG. 27B is an enlarged view of the graph of FIG. 27A at a rotation angle of approximately 0 degrees.
Figure 27C:
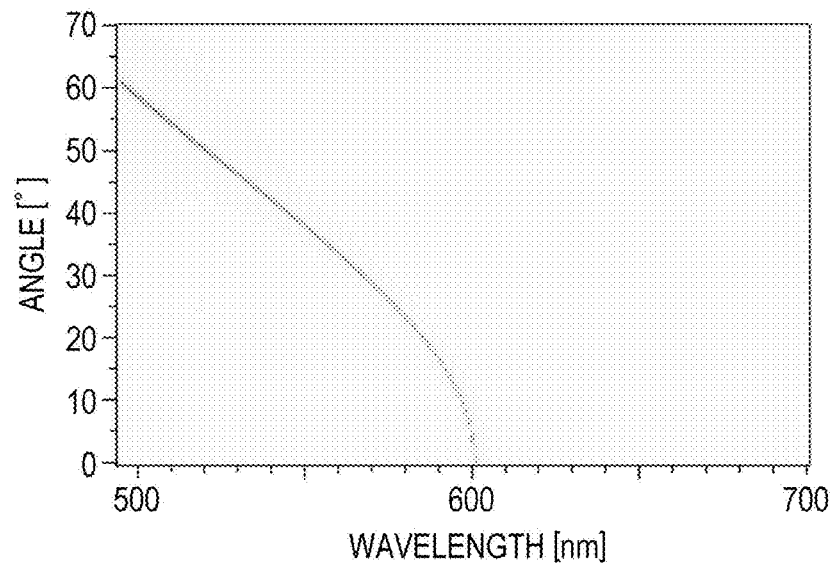
FIG. 27C is a graph showing the calculation results of the angular dependence of the intensity of light emitted from the model used for the calculation in FIG. 26 when the photoluminescent layer has a thickness $t_{wav}$ of 80 nm.
Figure 27D:
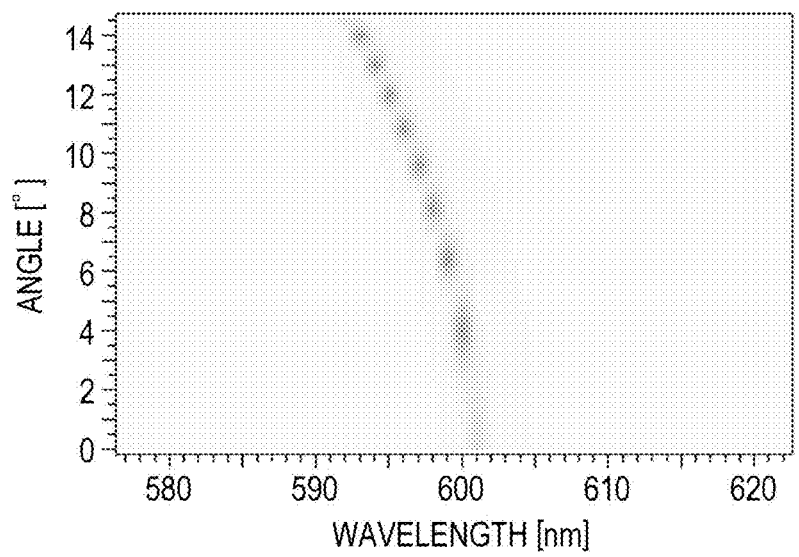
FIG. 27D is an enlarged view of the graph of FIG. 27C at a rotation angle of approximately 0 degrees.

FIG. 27A shows the calculation results of the angular dependence of the intensity of light emitted from the model used for the calculation in FIG. 26 when the photoluminescent layer has a thickness $t_{wav}$ of 80 nm. FIG. 27A shows the calculation results of the angular dependence of the intensity of light emitted from a light-emitting device rotated about an axis parallel to the line direction of the one-dimensional periodic structure, as illustrated in FIGS. 21A and 21D. FIG. 27B is an enlarged view of the graph of FIG. 27A at a rotation angle of approximately 0 degrees. FIG. 27C shows the calculation results of the angular dependence of the intensity of light emitted from the model used for the calculation in FIG. 27A. FIG. 27C shows the calculation results of the angular dependence of the intensity of light emitted from a light-emitting device rotated about an axis perpendicular to the line direction of the one-dimensional periodic structure, as illustrated in FIGS. 22A and 22D. FIG. 27D is an enlarged view of the graph of FIG. 27C at a rotation angle of approximately 0 degrees.

In this embodiment, the thickness $t_{wav}$ of the photoluminescent layer is 80 nm, and the effective increase in the thickness of the photoluminescent layer due to the periodic structure is 17 nm. Thus, the effective thickness $t_{eff}$ of the layered structure of the photoluminescent layer and the periodic structure in this embodiment is calculated to be 97 nm using the formula (36). For zero-order diffracted light (m=0), the lower limit and the upper limit of the formula (35) are calculated to be approximately 81 and 125 nm, respectively. Thus, the effective thickness $t_{eff}$ in this embodiment satisfies the relational expression represented by the formula (35).

As shown in FIGS. 27A to 27D, in this embodiment, light having a wavelength other than 600 nm is not strongly emitted in the front direction. On the other hand, light having a wavelength of 600 nm is not strongly emitted in a direction away from the front direction. For example, a comparison between FIG. 27B and FIG. 24B or between FIG. 27D and FIG. 24D shows that a light-emitting device designed such that the effective thickness $t_{eff}$ satisfies the formula (35) can emit polarized light in a limited direction with improved directionality.

This is also true for a structure that includes the surface structure 120 on both surfaces of the photoluminescent layer 110, provided that the two media on both surfaces of the photoluminescent layer 110 have different refractive indices as in this embodiment. In this case, the second term of the formula (36) is the sum of the increase in the effective thickness of the photoluminescent layer 110 due to the surface structure 120 on one surface of the photoluminescent layer 110 and the increase in the effective thickness of the photoluminescent layer 110 due to the surface structure 120 on the other surface of the photoluminescent layer 110.

Figure 28:
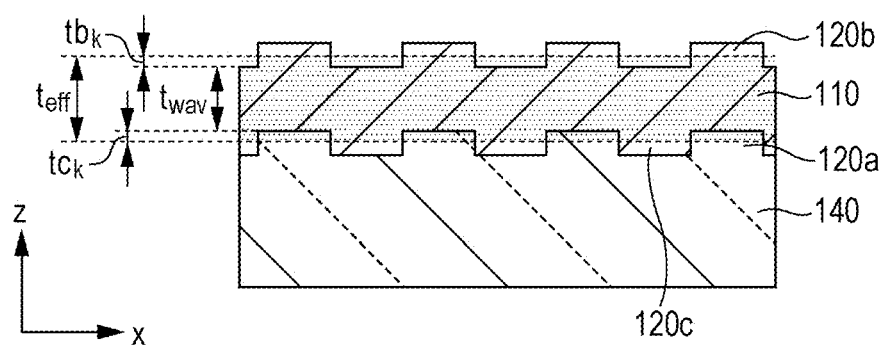
FIG. 28 is a schematic cross-sectional view illustrating a method for determining the effective thickness $t_{\mathit{eff}}$ of a light-emitting device that has a periodic structure on a surface facing a substrate and a periodic structure on the opposite surface.

For example, in the structure described with reference to FIG. 17A, the periodic structure 120a on the substrate 140 forms the periodic structure 120c on a surface of the photoluminescent layer 110 facing the substrate 140. FIG. 28 is a schematic cross-sectional view of a light-emitting device that includes a periodic structure 120c on a surface of a photoluminescent layer 110 facing a substrate 140 and a periodic structure 120b on a surface of the photoluminescent layer 110 opposite the substrate 140. In this embodiment, the surface of the photoluminescent layer 110 facing the substrate 140 is at the same level as the top surface of projections of a periodic structure 120a on the substrate 140. The regions (recesses) between the projections of the periodic structure 120c are filled with the material of the substrate 140. Thus, the volume ratio $R_v$ is the ratio of the volume of the projections of the periodic structure 120a to the total of the volume of the projections of the periodic structure 120c and the volume of the projections of the periodic structure 120a. The volume ratio $R_v$ in the structure described with reference to FIG. 17B is also determined in the same manner.

The material of the periodic structure 120b on the surface opposite the substrate 140 is the same as the material of the photoluminescent layer 110, and the regions between the projections of the periodic structure 120b are filled with air. In this structure, the height of the periodic structure 120b is the length from the bottom between two adjacent projections of the periodic structure 120b to the top surface of the projections of the periodic structure 120b in the direction normal to the photoluminescent layer 110 (in the z direction). The volume ratio $R_v$ is the volume ratio of air between two adjacent projections of the periodic structure 120b to the layer extending from the bottom between two adjacent projections of the periodic structure 120b (or the top surface of the photoluminescent layer 110) to the top surface of the projections. Thus, the volume ratio $R_v$ is the ratio of the volume of the recesses to the volume of the projections and recesses of the periodic structure 120b. In the structure described with reference to FIG. 17A, the effective thickness $t_{eff}$ is the sum of the thickness $t_{wav}$ of the photoluminescent layer 110, the thickness $tb_k$ of the periodic structure 120b replaced by the photoluminescent layer, and the thickness $tc_k$ of the periodic structure 120c replaced by the photoluminescent layer (see FIG. 28).

Figure 29:
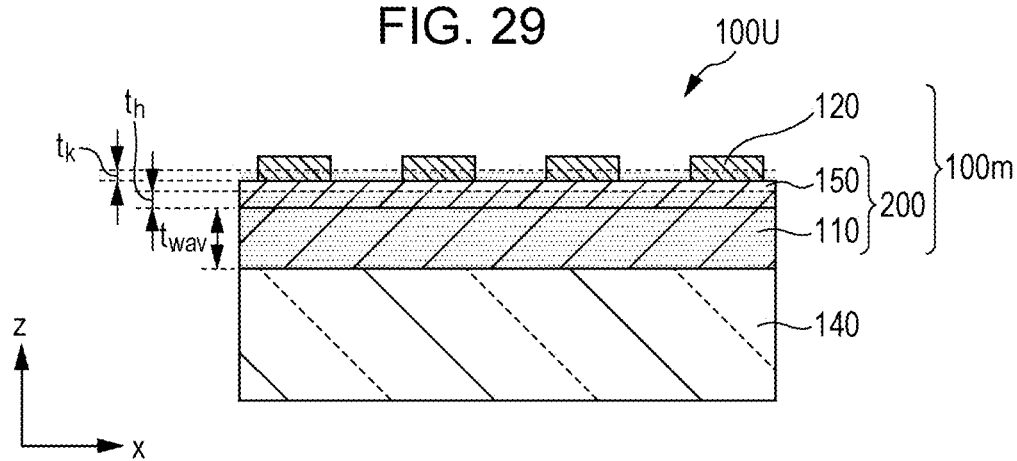
FIG. 29 is a schematic cross-sectional view illustrating a method for determining the effective thickness $t_{\mathit{eff}}$ of a structure including a protective layer between a surface structure and a photoluminescent layer.

Also in the presence of an intermediate layer between the surface structure 120 and the photoluminescent layer 110 as illustrated in FIG. 16, the effective thickness $t_{eff}$ in a predetermined range results in improved polarization selectivity. In the presence of a protective layer 150 between the surface structure 120 and the photoluminescent layer 110 as illustrated in FIG. 29, the effects of the protective layer 150 are taken into account in the effective thickness $t_{\mathit{eff}}$. More specifically, a light-emitting device is designed such that the effective thickness $t_{\mathit{eff}}$ determined using the following formula (37) instead of the formula (36) satisfies the formula (35).

$$t_{\mathit{eff}} = t_{wav} + (1 - R_v) \cdot h \cdot \frac{n_p}{n_{wav-a}} + t_m \cdot \frac{n_m}{n_{wav-a}} \quad (37)$$

In the formula (37), $t_m$ and $n_m$ denote the thickness and refractive index, respectively, of an intermediate layer (the protective layer 150) between the surface structure 120 and the photoluminescent layer 110. The third term of the right-hand side of the formula (37) represents the effective increase in the thickness of the photoluminescent layer when the protective layer 150 is replaced by a layer of a photoluminescent material. More specifically, when the protective layer 150 is replaced by a layer of a photoluminescent material, the structure illustrated in FIG. 29 satisfies $t_{\mathit{eff}} = t_{wav} + t_k + t_h$, wherein $t_h$ denotes the effective increase in the thickness of the photoluminescent layer. The intermediate layer may be monolayer or multilayer. When the intermediate layer has a layered structure, the refractive index $n_m$ of the intermediate layer is the refractive index of the entire layered structure.

7-1. Improved Directionality Due to Limited Length in Extending Direction of Periodic Structure As described above with reference to FIGS. 27A to 27D, when the effective thickness of the waveguide structure is in a predetermined range, only one polarized light can be selectively emitted with improved directionality. A comparison between FIGS. 27A and 27B or between FIGS. 27C and 27D shows that a light-emitting device rotated about an axis perpendicular to the line direction of the one-dimensional periodic structure can emit light in a wider angle range. For example, at a wavelength in the range of 500 to 700 nm, a light-emitting device rotated about an axis parallel to the line direction of the one-dimensional periodic structure emits little light at a rotation angle of 20 degrees or more (see FIG. 27A). In contrast, a light-emitting device rotated about an axis perpendicular to the line direction of the one-dimensional periodic structure emits light at a rotation angle of 20 degrees or more (see FIG. 27C). In other words, light can be strongly emitted in a direction away from the front direction in a plane in which the normal line is perpendicular to the line direction of the one-dimensional periodic structure, thus resulting in insufficient directionality. Thus, it is advantageous to provide a structure that can selectively and strongly emit light having a desired wavelength even when a light-emitting device is rotated about an axis perpendicular to the line direction of the one-dimensional periodic structure.

The present inventors have focused on the asymmetric angular dependence of light emission as shown in FIGS. 27A to 27D and have investigated the possibility of further improving directionality. The present inventors have focused on the fact that the projections of the periodic structure of the model used for the calculations in FIGS. 27A to 27D extend in a certain direction.

Although the projections are arranged at regular intervals in the array direction of the one-dimensional periodic structure (for example, in the x direction in FIG. 1C), there is no periodicity in the longitudinal direction of the one-dimensional periodic structure (for example, in the y direction in FIG. 1C). The present inventors have studied the effects of the length of the projections on the angular dependence of the emission wavelength. As a result, the present inventors have found that the length of the projections can be adjusted to control the angular dependence of the emission wavelength, as described below.

Figure 30:
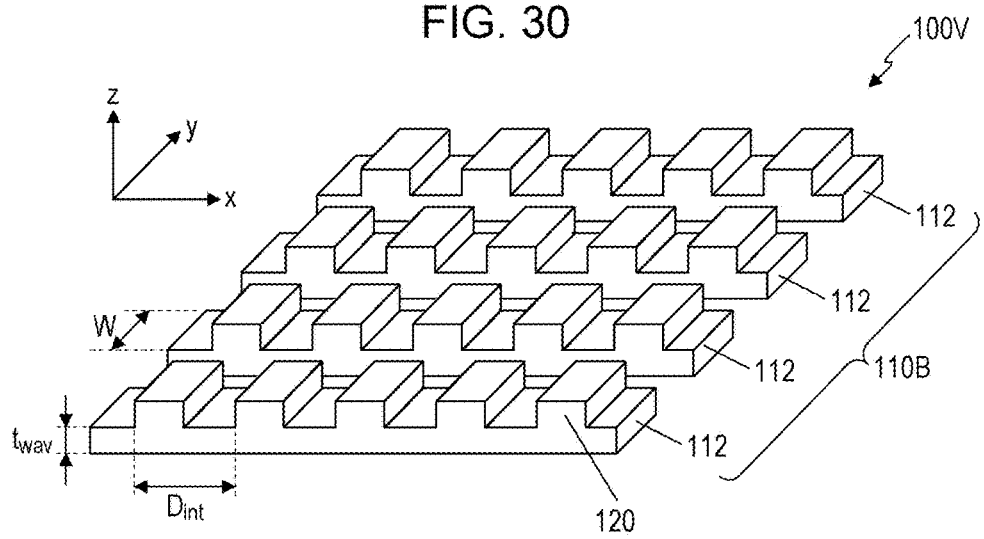
FIG. 30 is a perspective view of a light-emitting device including belt-like waveguide structures arranged in a certain direction.

The present inventors have studied a structure that includes belt-like waveguide structures arranged in a certain direction, as illustrated in FIG. 30. A light-emitting device 100V illustrated in FIG. 30 includes a photoluminescent layer 110B including belt-like portions 112. In the structure illustrated in FIG. 30, the belt-like portions 112 are separately arranged in the longitudinal direction of the projections of the surface structure 120. The projections and recesses of the surface structure 120 are disposed on each of the belt-like portions 112. As in a light-emitting device 100W illustrated in FIG. 31, the photoluminescent layer 110B including the belt-like portions 112 may be disposed on a substrate 140. The material of the surface structure 120 may be the same as or different from the material of the photoluminescent layer 110B. In this embodiment, the material of the surface structure 120 is the same as the material of the photoluminescent layer 110B.

Figure 31:
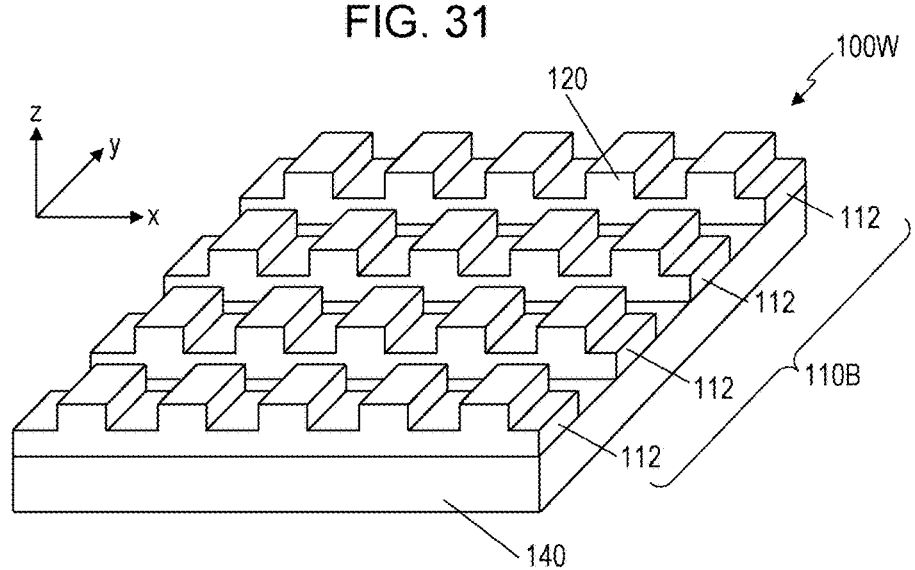
FIG. 31 is a perspective view of a light-emitting device having a photoluminescent layer on a substrate, and the photoluminescent layer includes belt-like portions.
Figure 32A:
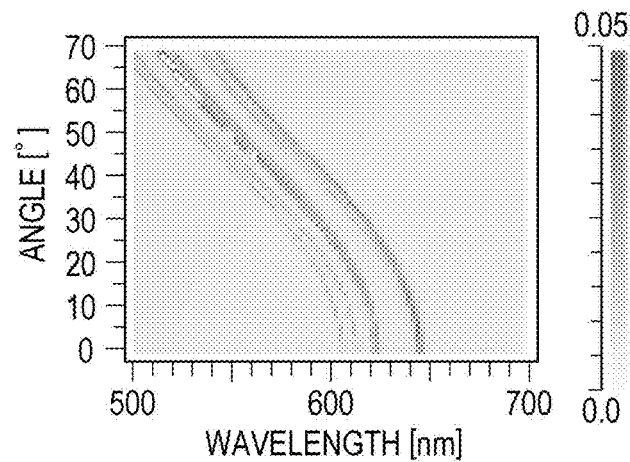
FIG. 32A is a graph showing the calculation results of the angular dependence of the intensity of output light when the photoluminescent layer has a thickness $t_{wav}$ of 200 nm, and each of the belt-like portions has a width W of 16 μm.
Figure 32B:
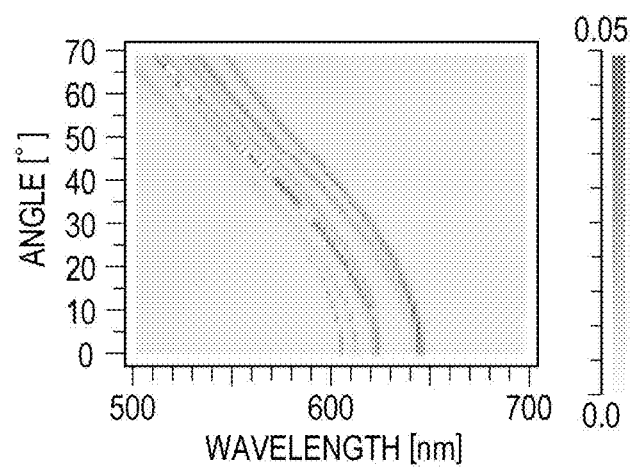
FIG. 32B is a graph showing the calculation results of the angular dependence of the intensity of output light when the photoluminescent layer has a thickness $t_{wav}$ of 200 nm, and each of the belt-like portions has a width W of 8 μm.
Figure 32C:
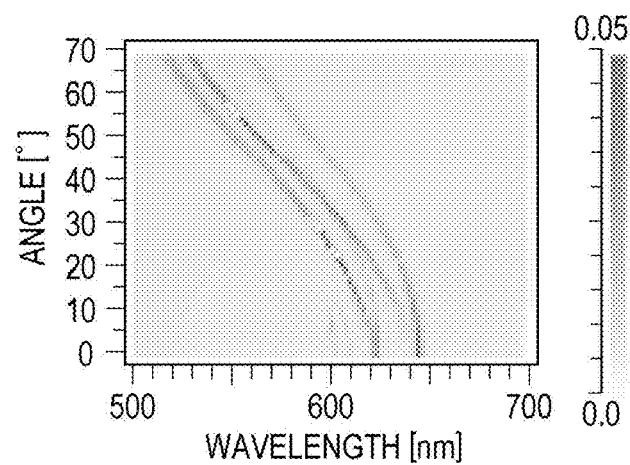
FIG. 32C is a graph showing the calculation results of the angular dependence of the intensity of output light when the photoluminescent layer has a thickness $t_{wav}$ of 200 nm, and each of the belt-like portions has a width W of 4 μm.
Figure 32D:
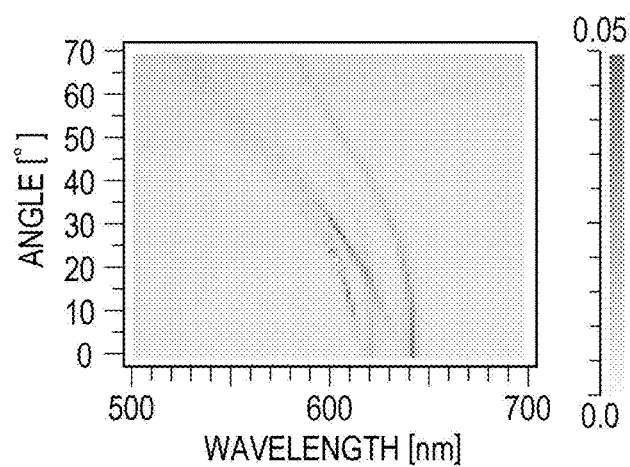
FIG. 32D is a graph showing the calculation results of the angular dependence of the intensity of output light when the photoluminescent layer has a thickness $t_{wav}$ of 200 nm, and each of the belt-like portions has a width W of 2 μm.
Figure 32E:
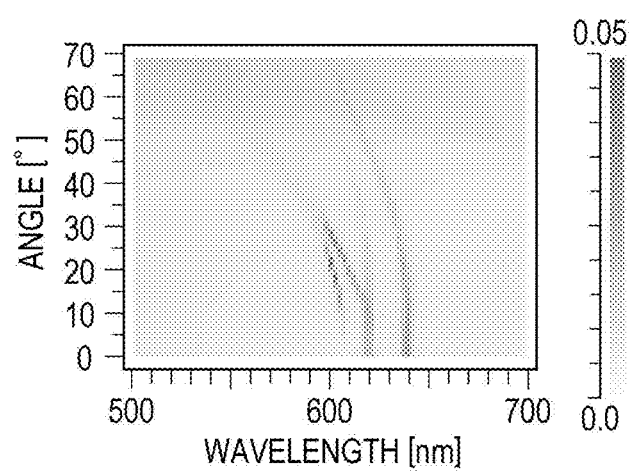
FIG. 32E is a graph showing the calculation results of the angular dependence of the intensity of output light when the photoluminescent layer has a thickness $t_{wav}$ of 200 nm, and each of the belt-like portions has a width W of 1.4 μm.
Figure 32F:
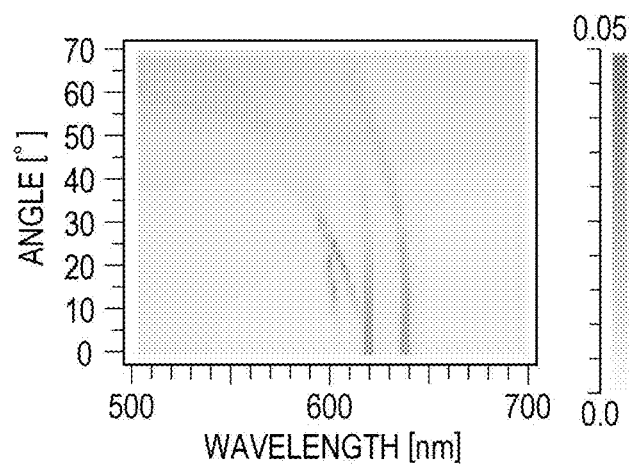
FIG. 32F is a graph showing the calculation results of the angular dependence of the intensity of output light when the photoluminescent layer has a thickness $t_{wav}$ of 200 nm, and each of the belt-like portions has a width W of 1.2 μm.
Figure 32G:
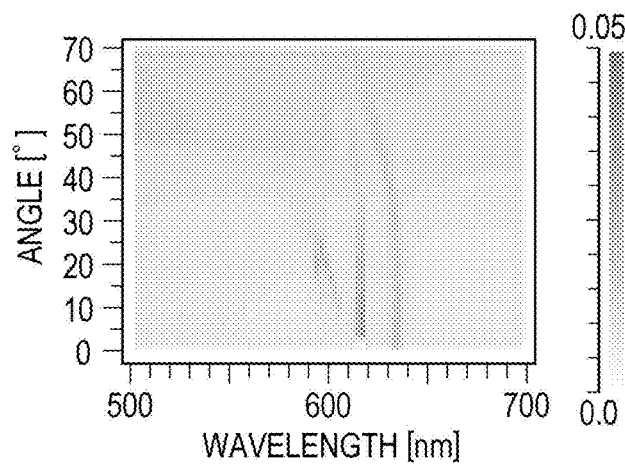
FIG. 32G is a graph showing the calculation results of the angular dependence of the intensity of output light when the photoluminescent layer has a thickness $t_{wav}$ of 200 nm, and each of the belt-like portions has a width W of 1 µm.
Figure 32H:
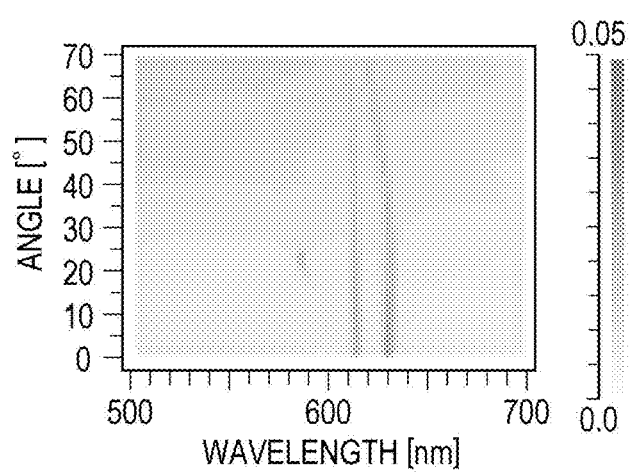
FIG. 32H is a graph showing the calculation results of the angular dependence of the intensity of output light when the photoluminescent layer has a thickness $t_{wav}$ of 200 nm, and each of the belt-like portions has a width W of 0.8 µm.
Figure 32I:
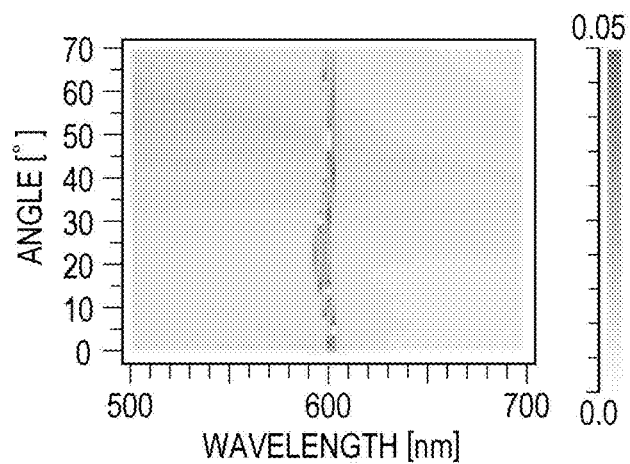
FIG. 32I is a graph showing the calculation results of the angular dependence of the intensity of output light when the photoluminescent layer has a thickness $t_{wav}$ of 200 nm, and each of the belt-like portions has a width W of 0.4 µm.

In the embodiment illustrated in FIG. 31, the belt-like portions 112 are arranged in the longitudinal direction of the projections (or recesses) of the surface structure 120 (in the y direction). In other words, in this embodiment, the projections (or recesses) are arranged in a direction perpendicular to the array direction of the belt-like portions 112 (in the x direction). As a matter of course, the array direction of the projections (or recesses) is not necessarily strictly perpendicular to the array direction of the belt-like portions 112. The length of the belt-like portions 112 in the longitudinal direction of the projections (or recesses) is hereinafter also referred to as the width W of the belt-like portions 112.

FIGS. 32A to 32I show the calculation results of the angular dependence of the intensity of light emitted from a structure that includes a photoluminescent layer having belt-like portions. In the calculations, the photoluminescent layer on a transparent substrate having a refractive index of 1.5 has a refractive index of 1.8 and a thickness of 200 nm. A one-dimensional periodic structure of each belt-like portion 112 has a refractive index of 1.5, a period of 400 nm, and a height of 40 nm.

FIGS. 32A to 32I show the calculation results of the angular dependence of the intensity of light emitted from a light-emitting device rotated about an axis perpendicular to the line direction of the one-dimensional periodic structure, as illustrated in FIGS. 22A and 22D. FIGS. 32A to 32I show the calculation results when the width W of the belt-like portion 112 is 16, 8, 4, 2, 1.4, 1.2, 1, 0.8, and 0.4 μm, respectively.

As described above, in this embodiment, the thickness $t_{wav}$ of the photoluminescent layer is 200 nm. Thus, in this embodiment, the effective thickness $t_{\mathit{eff}}$ of a layered structure of the photoluminescent layer and the surface structure exceeds the upper limit (125 nm) of the formula (35). Thus, a plurality of enhancement peaks corresponding to TE polarized light and TM polarized light appear in the figures. As clearly illustrated in FIG. 32A, when the width W of the belt-like portion 112 exceeds 2 μm, the peak wavelength shifts with deviation from the front direction of the light-emitting device.

In contrast, when the width W of the belt-like portion 112 is approximately 2 μm or less, the wavelength of light strongly emitted in a direction away from the front direction approaches the peak wavelength in the front direction. Enhancement at a greater angle decreases as the width W of the belt-like portion 112 decreases. Thus, the color change of output light with the rotation angle is decreased when a light-emitting device is rotated about an axis perpendicular to the line direction of the one-dimensional periodic structure. The intensity of output light in a direction away from the front direction is also decreased. In other words, directionality in the yz plane is improved by using the photoluminescent layer 110B including the belt-like portions 112 and decreasing the width W of the belt-like portions 112 to some extent.

FIGS. 33A to 33I show the calculation results of the angular dependence of the intensity of light emitted from a structure that includes a photoluminescent layer having belt-like portions and having a thickness of 80 nm. As in FIGS. 32A to 32I, FIGS. 33A to 33I show the calculation results of the angular dependence of the intensity of light emitted from a light-emitting device rotated about an axis perpendicular to the line direction of the one-dimensional periodic structure. FIGS. 33A to 33I show the calculation results when the width W of the belt-like portion 112 is 16, 8, 4, 2, 1.4, 1.2, 1, 0.8, and 0.4 μm, respectively.

Figure 33A:
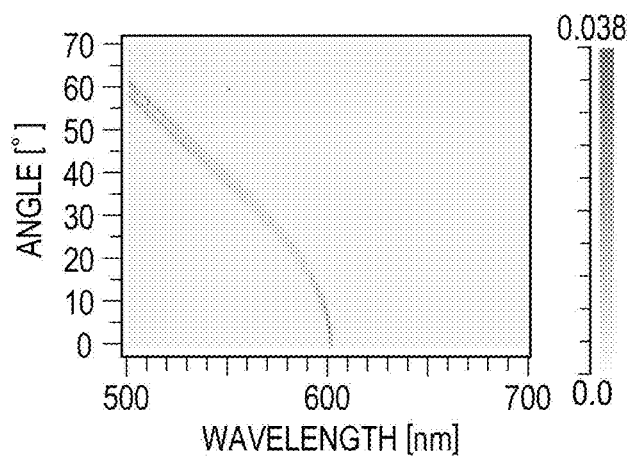
FIG. 33A is a graph showing the calculation results of the angular dependence of the intensity of output light when the photoluminescent layer has a thickness $t_{wav}$ of 80 nm, and each of the belt-like portions has a width W of 16 µm.
Figure 33B:
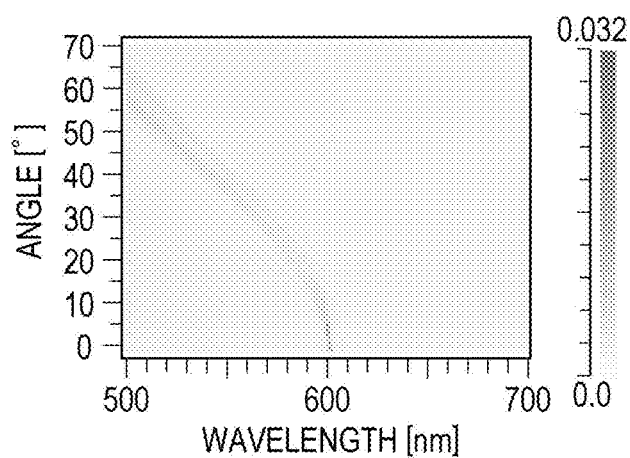
FIG. 33B is a graph showing the calculation results of the angular dependence of the intensity of output light when the photoluminescent layer has a thickness $t_{wav}$ of 80 nm, and each of the belt-like portions has a width W of 8 µm.
Figure 33C:
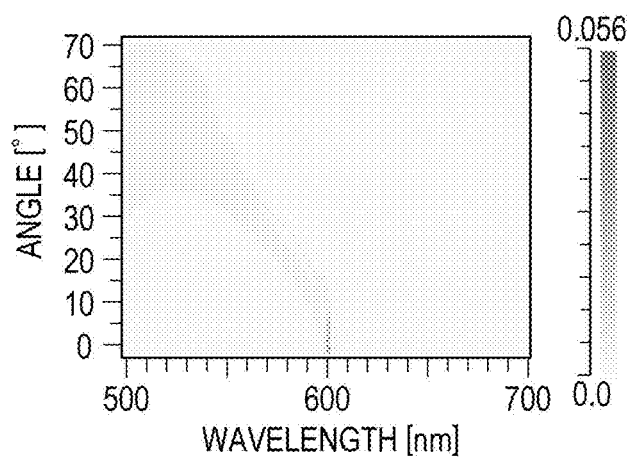
FIG. 33C is a graph showing the calculation results of the angular dependence of the intensity of output light when the photoluminescent layer has a thickness $t_{wav}$ of 80 nm, and each of the belt-like portions has a width W of 4 µm.
Figure 33D:
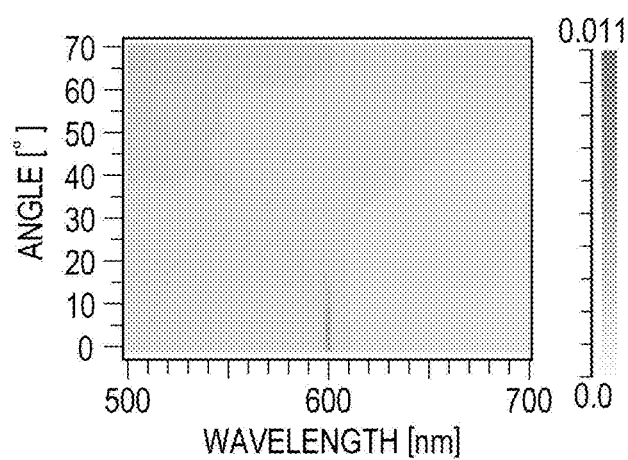
FIG. 33D is a graph showing the calculation results of the angular dependence of the intensity of output light when the photoluminescent layer has a thickness $t_{wav}$ of 80 nm, and each of the belt-like portions has a width W of 2 µm.
Figure 33E:
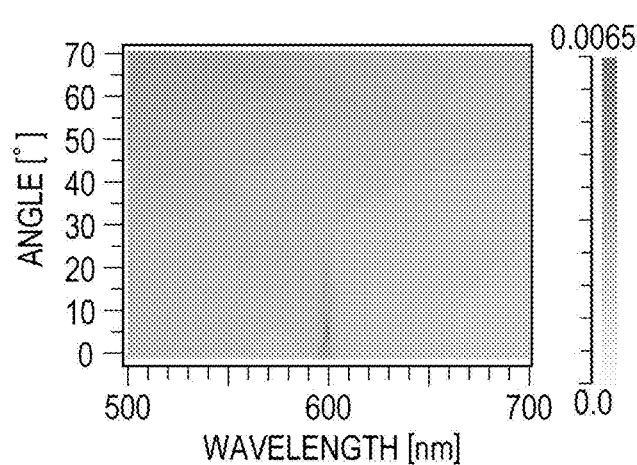
FIG. 33E is a graph showing the calculation results of the angular dependence of the intensity of output light when the photoluminescent layer has a thickness $t_{wav}$ of 80 nm, and each of the belt-like portions has a width W of 1.4 µm.
Figure 33F:
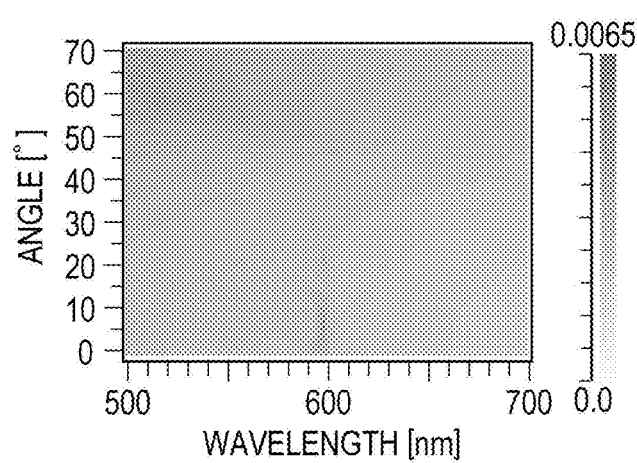
FIG. 33F is a graph showing the calculation results of the angular dependence of the intensity of output light when the photoluminescent layer has a thickness $t_{wav}$ of 80 nm, and each of the belt-like portions has a width W of 1.2 µm.
Figure 33G:
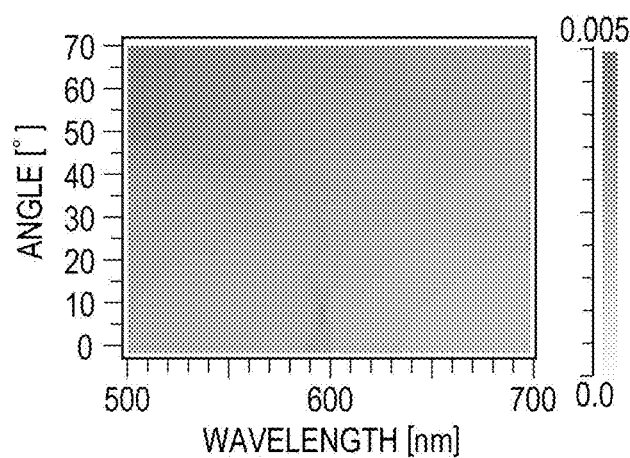
FIG. 33G is a graph showing the calculation results of the angular dependence of the intensity of output light when the photoluminescent layer has a thickness $t_{wav}$ of 80 nm, and each of the belt-like portions has a width W of 1 µm.
Figure 33H:
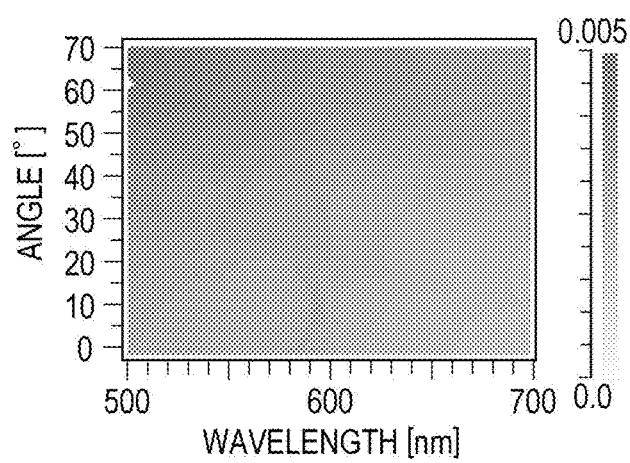
FIG. 33H is a graph showing the calculation results of the angular dependence of the intensity of output light when the photoluminescent layer has a thickness $t_{wav}$ of 80 nm, and each of the belt-like portions has a width W of 0.8 µm.
Figure 33I:
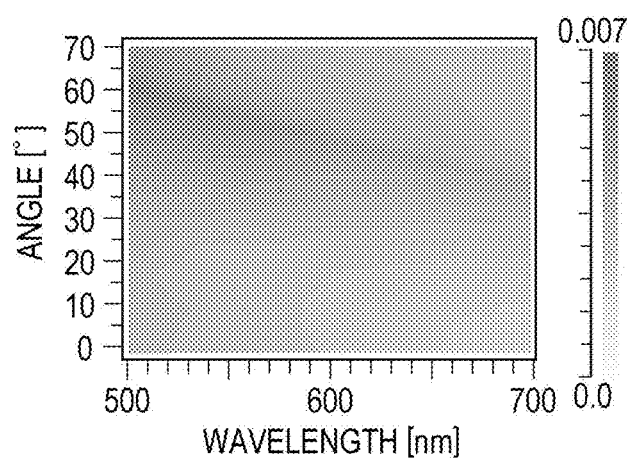
FIG. 33I is a graph showing the calculation results of the angular dependence of the intensity of output light when the photoluminescent layer has a thickness $t_{wav}$ of 80 nm, and each of the belt-like portions has a width W of 0.4 µm.
Figure 34A:
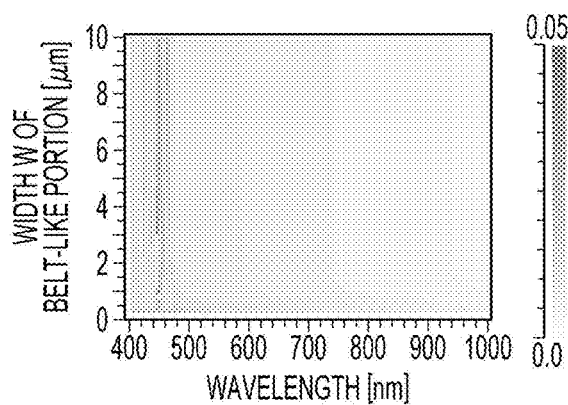
FIG. 34A is a graph showing the calculation results of the enhancement of light emitted in a direction inclined 40 degrees with respect to the front direction when the periodic structure has a period p of 0.3 µm.
Figure 34B:
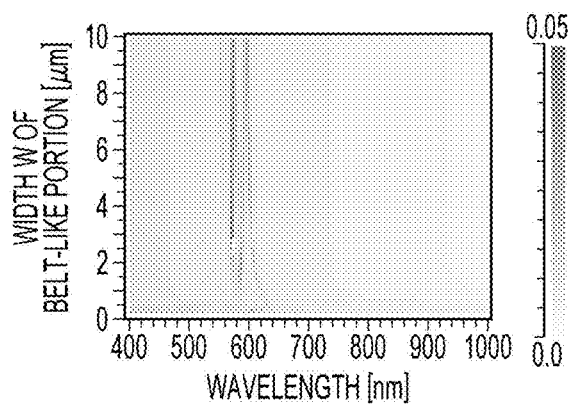
FIG. 34B is a graph showing the calculation results of the enhancement of light emitted in a direction inclined 40 degrees with respect to the front direction when the periodic structure has a period p of 0.4 µm.
Figure 34C:
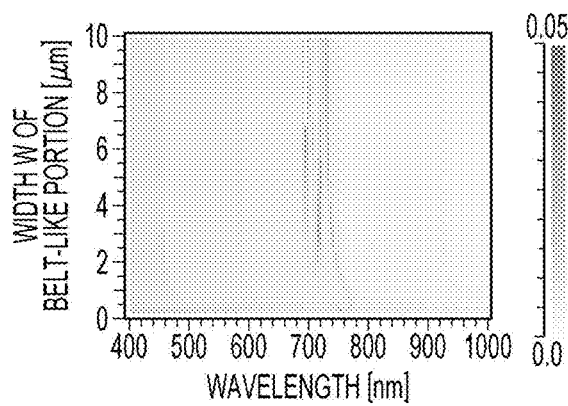
FIG. 34C is a graph showing the calculation results of the enhancement of light emitted in a direction inclined 40 degrees with respect to the front direction when the periodic structure has a period p of 0.5 µm.
Figure 34D:
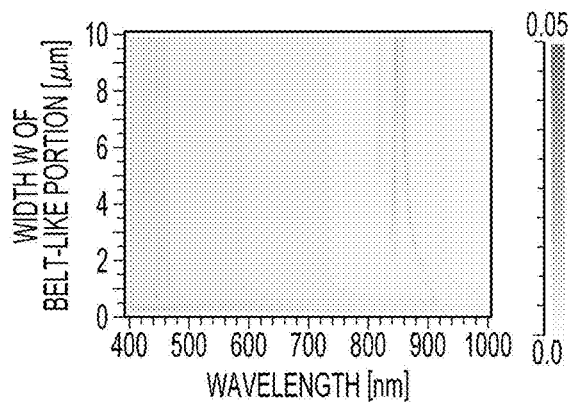
FIG. 34D is a graph showing the calculation results of the enhancement of light emitted in a direction inclined 40 degrees with respect to the front direction when the periodic structure has a period p of 0.6 µm.

FIGS. 33A to 33I show that when the width W of the belt-like portion 112 is decreased to approximately 4 μm, light emission in a direction away from the front direction is almost eliminated. Thus, directionality is improved by decreasing the width W of the belt-like portion 112 to approximately 4 μm. In other words, a narrow-angle light distribution can be provided. In FIGS. 33A to 33I, the thickness $t_{wav}$ of the photoluminescent layer is 80 nm, and the effective thickness $t_{eff}$ of a layered structure of the photoluminescent layer and the surface structure is in the range represented by the formula (35). For example, as shown in FIG. 33A, in this embodiment, no enhancement peak corresponding to TM polarized light appears. Thus, also in the presence of the photoluminescent layer 110B including the belt-like portions 112, when the effective thickness $t_{eff}$ is in a predetermined range, a light wave in the TE mode is selectively transmitted through the waveguide structure with high polarization selectivity.

As described above with reference to FIGS. 24A to 33I, the emission of TE polarized light (the oscillation of an electric field is parallel to the longitudinal direction of the one-dimensional periodic structure) can be reduced by adjusting the effective thickness $t_{eff}$ of a layered structure of the photoluminescent layer and the surface structure in a predetermined range. It is possible to place an intermediate layer between the surface structure 120 and the photoluminescent layer 110B (or the belt-like portions 112). In this case, the effective thickness $t_{eff}$ is determined using the formula (37). The angular dependence of the intensity of output light in a plane (for example, the yz plane) perpendicular to the array direction of the projections of the one-dimensional periodic structure can be reduced by decreasing the width W of the belt-like portion 112. Thus, an embodiment of the present disclosure can provide a light-emitting device with improved directionality.

The present inventors have also studied the relationship between the period of the surface structure and the width of the belt-like portion. FIGS. 34A to 34D show the calculation results for every period of the periodic structure with respect to the relationship between the wavelength and the width of the belt-like portion in the enhancement of light emitted in a direction inclined 40 degrees with respect to the front direction. In FIGS. 34A to 34D, the thickness of the photoluminescent layer is fixed to 80 nm, and the width of the belt-like portion ranges from 0.2 to 10 μm. FIGS. 34A to 34D show the enhancement of light in calculations with the period p of the periodic structure being 0.3, 0.4, 0.5, and 0.6 μm, respectively.

FIGS. 34A to 34D show that the emission intensity decreases when the width W of the belt-like portion 112 is decreased to some extent. In other words, light emission in a direction away from the front direction is reduced. For example, for the period p of 0.5 μm, the emission intensity decreases when the width W of the belt-like portion 112 is decreased to less than 2 μm. For the period p of 0.6 μm, the emission intensity decreases when the width W of the belt-like portion 112 is decreased to less than 2.4 μm. Thus, emission intensity in a direction away from the front direction decreases at a greater width W as the period p of the periodic structure increases. A comparison between FIGS. 34A to 34D shows that the wavelength with higher directionality increases with the period p of the periodic structure.

This suggests that there is a correlation of enhancement of light between the width W of the belt-like portion 112 and the period p of the periodic structure. More specifically, this suggests a correlation between the width W of the belt-like portion 112 and the center distance $D_{int}$ between two adjacent projections or two adjacent recesses of the surface structure, indicative of reduction in light emission in a direction away from the front direction. In order to reduce light emission in a direction away from the front direction, for example, the width W of the belt-like portion 112 may be less than n times the center distance $D_{int}$ between two adjacent projections or two adjacent recesses of the surface structure. For example, the width W of the belt-like portion 112 may be less than five times or less than four times the center distance $D_{int}$. The width W of the belt-like portion 112 may be less than two times the center distance $D_{int}$. In the embodiments shown in FIGS. 34A to 34D, when the width W of the belt-like portion 112 is decreased to approximately four times the center distance $D_{int}$, light emission in a direction away from the front direction is reduced.

7-2. Experimental Examples

A sample light-emitting device having the structure of the light-emitting device 100W illustrated in FIG. 31 was prepared, and the angular dependence of the intensity of light emitted from the light-emitting device was determined. The light-emitting device was prepared as described below.

Figure 35A:
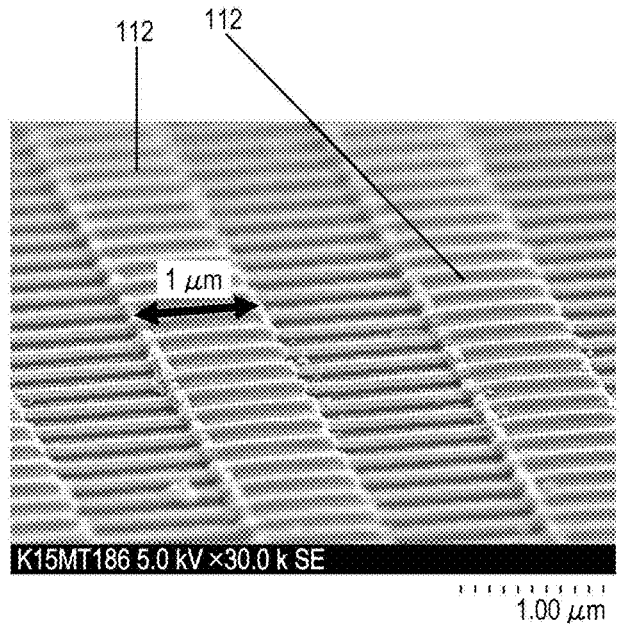
FIG. 35A is a SEM image of a sample light-emitting device having the same structure as the light-emitting device illustrated in FIG. 31.

First, stripe-shaped projections having a period of 400 nm and a height of 40 nm were formed on a glass substrate, thus forming a one-dimensional periodic structure on the glass substrate. Second, YAG:Ce was deposited on the one-dimensional periodic structure and was subjected to the lift-off process to form a photoluminescent layer including belt-like portions having a thickness of 80 nm and a width W of 1 μm on the glass substrate. FIG. 35A is a SEM image of the sample thus prepared. A sample of a reference example was prepared in the same manner as in the sample shown in FIG. 19 except that the YAG:Ce film had a thickness of 80 nm.

Figure 35B:
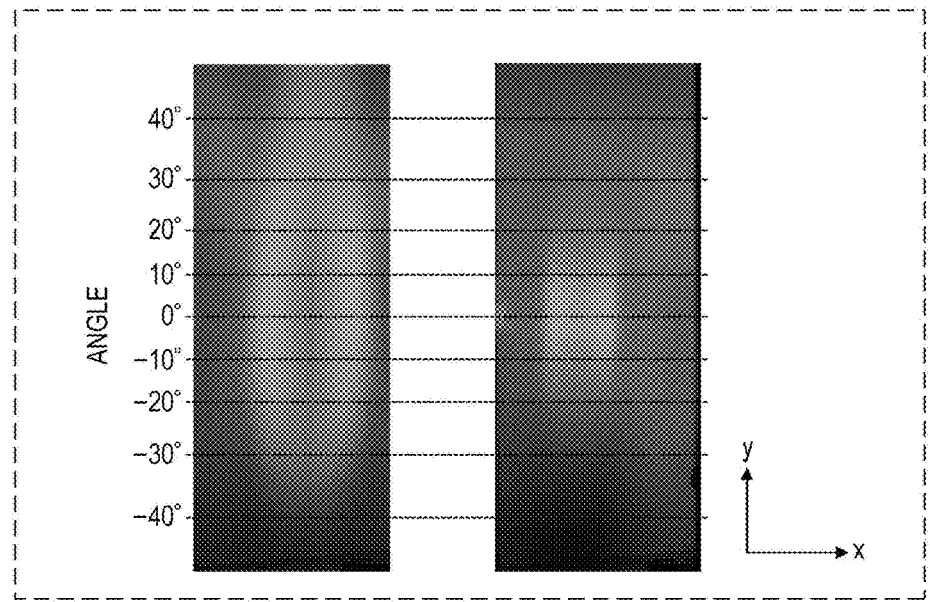
FIG. 35B is a schematic view of the pattern of light emitted from a sample light-emitting device on a screen.

A sample was disposed facing the screen and was excited by a laser beam having a wavelength of 450 nm. FIG. 35B shows the patterns of light emitted from the sample on a screen. FIG. 35B shows the patterns of light emitted from the sample rotated about an axis perpendicular to the line direction of the one-dimensional periodic structure (the x axis). In FIG. 35B, the left pattern is the pattern of light emitted from the sample of the reference example that included no belt-like portions in the photoluminescent layer, and the right pattern is the pattern of light emitted from the sample shown in FIG. 35A. FIG. 35B shows that the sample including the belt-like portions in the photoluminescent layer did not strongly emit light in a direction away from the front direction (particularly in a direction inclined more than 20 degrees with respect to the front direction). Thus, it is demonstrated that discrete belt-like portions arranged in the longitudinal direction of the projections of the surface structure can provide high directionality also in a plane in which the normal line is perpendicular to the line direction of the one-dimensional periodic structure.

7-3. Modified Examples of Shape of Belt-Like Portions and Surface Structure

Figure 36A:
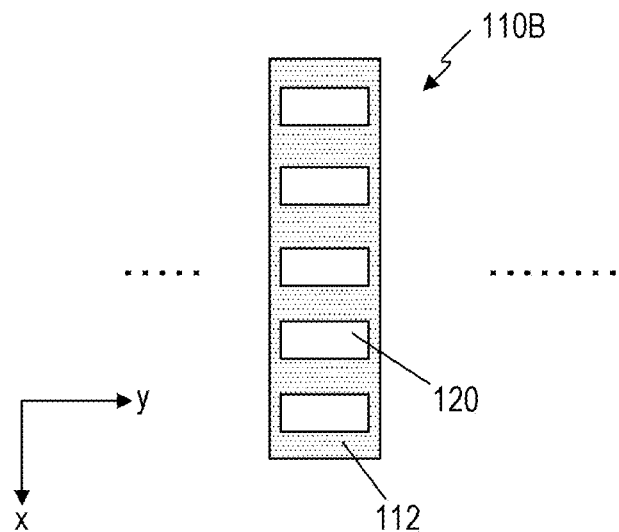
FIG. 36A is a plan view of the shape of the belt-like portions of the photoluminescent layer and the shape of the projections of the surface structure in a modified example.

In the structures illustrated in FIGS. 30 and 31, the length of the projections of the surface structure 120 in the y direction in each of the belt-like portions 112 is identical with the width W of the belt-like portion 112. However, the shape of the belt-like portions 112 in the photoluminescent layer 110B and the shape of the projections of the surface structure 120 are not limited to those illustrated in FIGS. 30 and 31 and can be variously changed. For example, as illustrated in FIG. 36A, the length of the projections of the surface structure 120 in the y direction may be different from the width W of the belt-like portion 112. In this embodiment, the length of the projections of the surface structure 120 in the y direction is smaller than the width W of the belt-like portion 112.

Figure 36B:
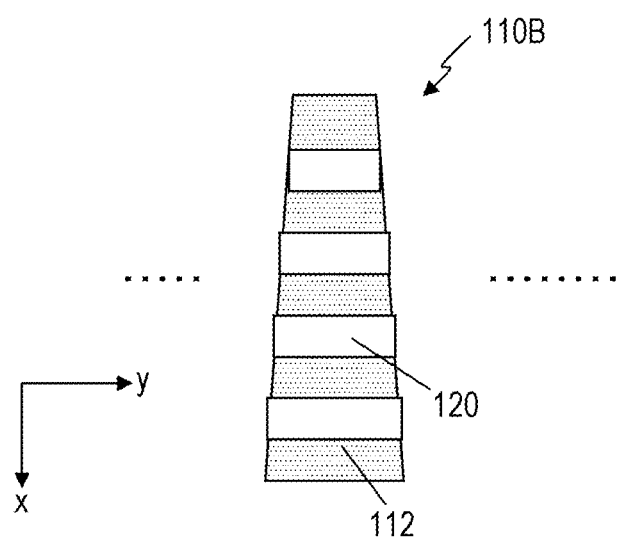
FIG. 36B is a plan view of the shape of the belt-like portions of the photoluminescent layer and the shape of the projections of the surface structure in another modified example.
Figure 37:
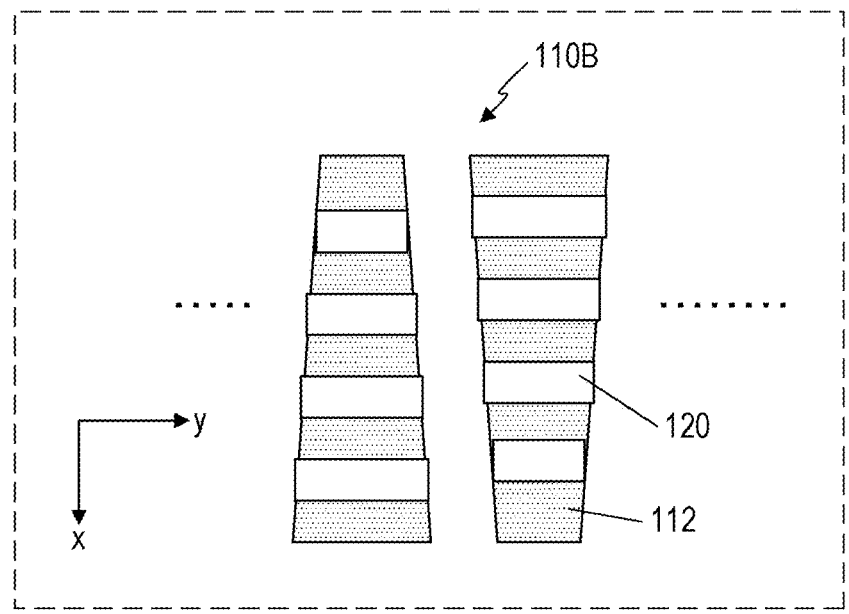
FIG. 37 is a plan view of the shape of the belt-like portions of the photoluminescent layer and the shape of the projections of the surface structure in still another modified example.
Figure 38:
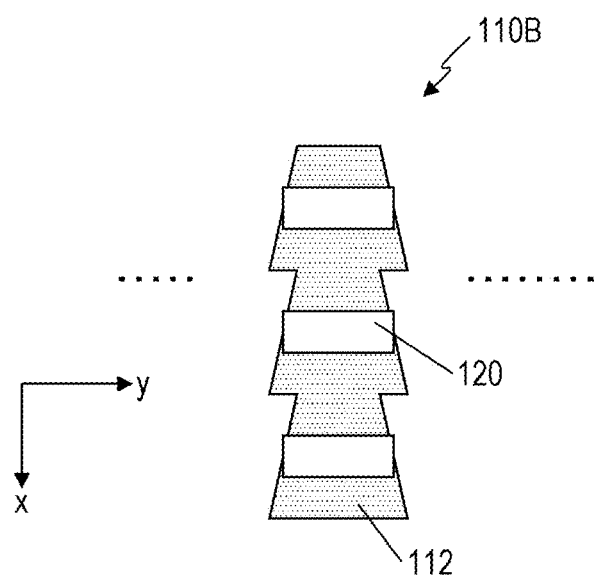
FIG. 38 is a plan view of the shape of the belt-like portions of the photoluminescent layer and the shape of the projections of the surface structure in still another modified example.

The external shape of the belt-like portion 112 when viewed in the direction normal to the photoluminescent layer 110B is not limited to rectangular. As illustrated in FIG. 36B, at least one selected from the group consisting of the sides defining the external shape of the belt-like portions 112 extending in a direction different from the longitudinal direction of the projections of the surface structure 120 is not necessarily strictly perpendicular to the longitudinal direction of the projections. The width of the belt-like portions 112 in the direction perpendicular to the longitudinal direction of the projections is not necessarily constant. Furthermore, the external shapes of two adjacent belt-like portions 112 are not necessarily congruent. The belt-like portions 112 may have different external shapes when viewed in the direction normal to the photoluminescent layer 110B. For example, in a structure illustrated in FIG. 37, one belt-like portion 112 has a width narrowing in the positive x direction, whereas another belt-like portion 112 adjacent to the belt-like portion 112 has a width narrowing in the negative x direction. Alternatively, as illustrated in FIG. 38, the belt-like portion 112 may include trapezoidal regions each corresponding to a projection of the surface structure 120. In other words, the sides defining the external shape of the belt-like portion 112 are not limited to linear.

Figure 39:
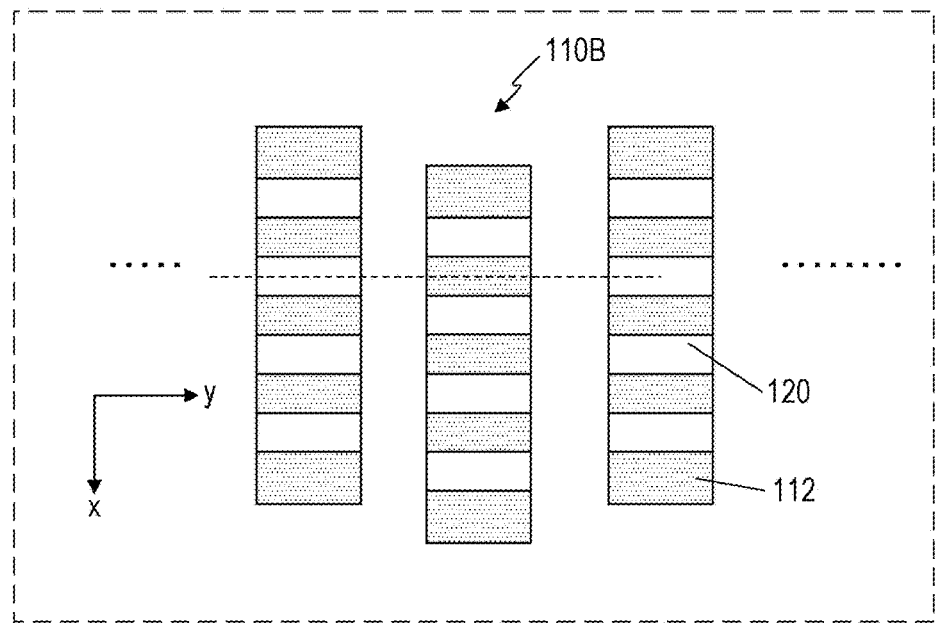
FIG. 39 is a plan view of the shape of the belt-like portions of the photoluminescent layer and the shape of the projections of the surface structure in still another modified example.
Figure 40:
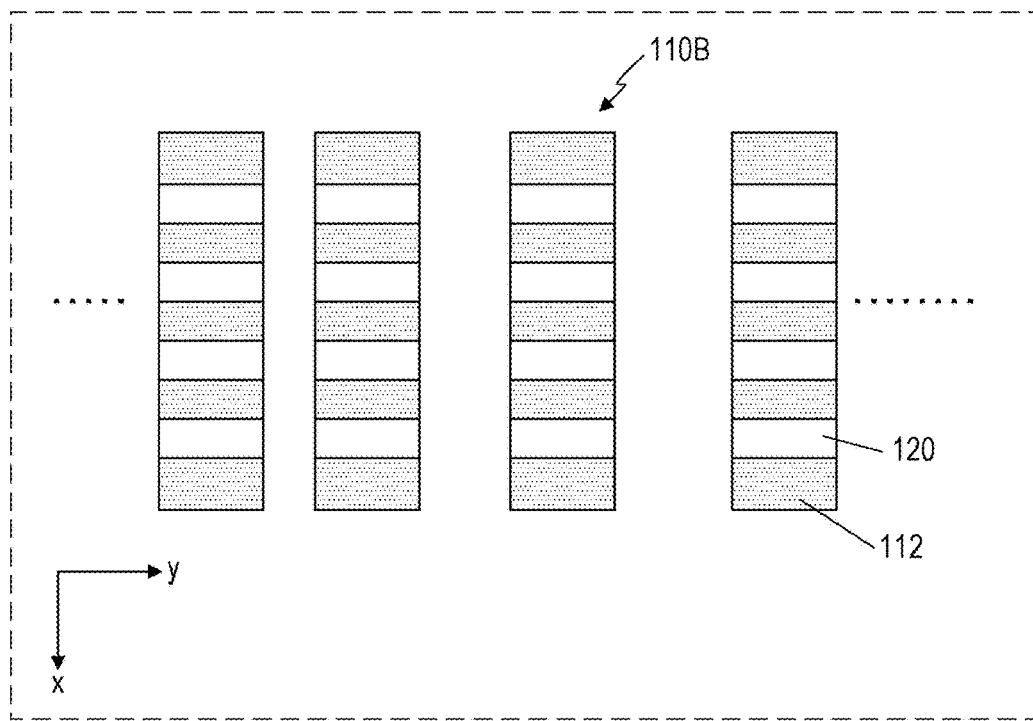
FIG. 40 is a plan view of the shape of the belt-like portions of the photoluminescent layer and the shape of the projections of the surface structure in still another modified example.

The arrangement of the projections of the surface structure 120 may be different between the belt-like portions 112. In the embodiment illustrated in FIG. 39, the arrangement of the projections of one belt-like portion 112 shifts in the x direction with respect to the arrangement of the projections of another belt-like portion 112. The projections of the belt-like portions 112 are not necessarily linearly arranged in the y direction. The belt-like portions 112 are also not necessarily arranged at regular intervals. As illustrated in FIG. 40, the distance between two belt-like portions 112 may be different from the distance between two other belt-like portions 112. The belt-like portions 112 may be arranged at irregular intervals.

Figure 41:
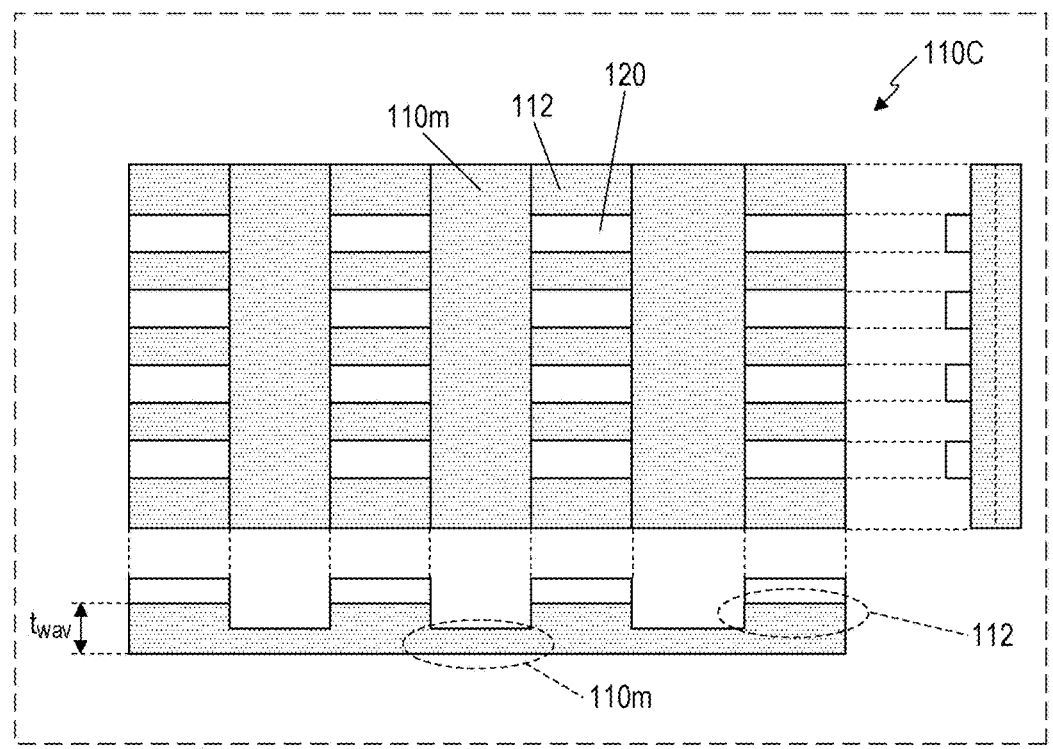
FIG. 41 illustrates a plan view, a front view, and a side view of the shape of the belt-like portions of the photoluminescent layer and the shape of the projections of the surface structure in still another modified example.

As illustrated in FIG. 41, belt-like portions 112 may be connected together with a base. In the structure illustrated in FIG. 41, a photoluminescent layer 110C includes the belt-like portions 112 and a connection 110m between two adjacent belt-like portions 112. As illustrated in the figure, the thickness of the connection 110m is smaller than the thickness of the belt-like portions 112. Typically, the thickness of the connection 110m is not allowable for the TE mode or the TM mode and is smaller than the cut-off thickness of the TE mode and the cut-off thickness of the TM mode. Since the connection 110m is not allowable for the TE mode or the TM mode, the connection 110m does not function as a waveguide structure. Thus, the structure illustrated in FIG. 41 is substantially equivalent to a structure that includes completely discrete belt-like portions 112.

In this structure, as illustrated in FIG. 41, the thickness $t_{wav}$ of the photoluminescent layer 110C is the thickness of a portion of the photoluminescent layer 110C including the belt-like portion 112. In the presence of an intermediate layer between the surface structure 120 and the photoluminescent layer 110C, the thickness $t_{wav}$ is the thickness of a portion of the light guiding layer including the belt-like portion 112.

8. Other Modified Examples

8-1. Light-Emitting Apparatus Including Excitation Light Source

Figure 43:
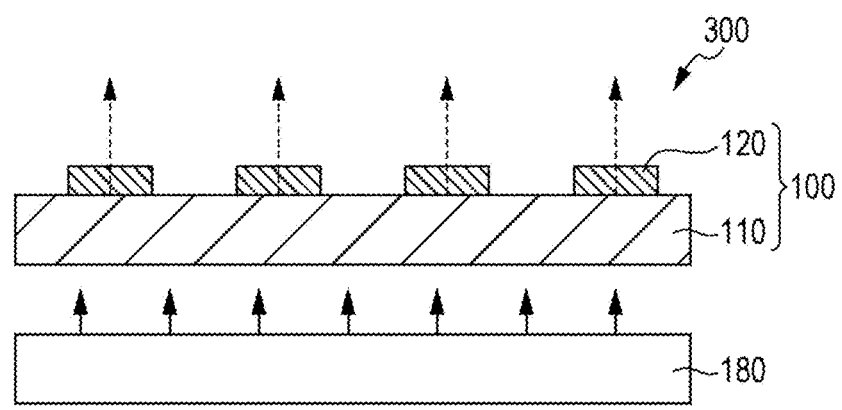
FIG. 43 is a schematic view of a light-emitting apparatus including the light-emitting device illustrated in FIGS. 1A and 1B and a light source that emits excitation light to the photoluminescent layer.

FIG. 43 illustrates a light-emitting apparatus 300 including the light-emitting device 100 illustrated in FIGS. 1A and 1B and a light source 180 that emits excitation light to the photoluminescent layer 110. In this embodiment, as described above, the photoluminescent layer can be excited with excitation light, such as ultraviolet light or blue light, and emit directional light. The light-emitting apparatus 300 including the light source 180 that emits such excitation light can emit directional light. Although the wavelength of excitation light emitted from the light source 180 is typically in the ultraviolet or blue range, the wavelength is not necessarily in this range and may be appropriately determined depending on the photoluminescent material of the photoluminescent layer 110. Although the light source 180 illustrated in FIG. 43 is configured to direct excitation light into the bottom surface of the photoluminescent layer 110, it may be configured otherwise, for example, to direct excitation light into the top surface of the photoluminescent layer 110. Excitation light may be directed at an angle (that is, obliquely) with respect to a direction perpendicular to a main surface (the top surface or the bottom surface) of the photoluminescent layer 110. Excitation light directed obliquely so as to be totally reflected in the photoluminescent layer 110 can more efficiently induce light emission from the light-emitting device 100.

Figure 44A:
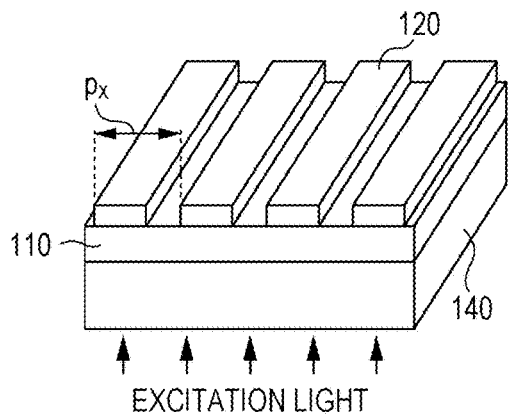
FIG. 44A is a schematic view of a one-dimensional periodic structure having a period $p_x$ in the x direction.
Figure 44B:
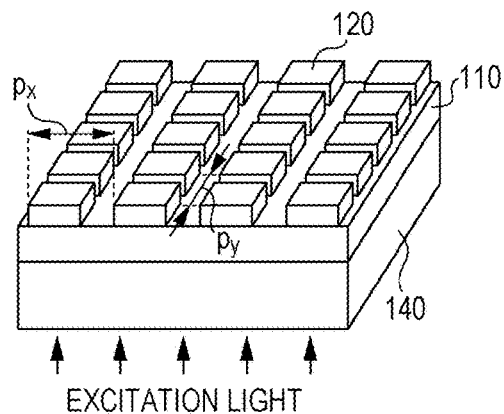
FIG. 44B is a schematic view of a two-dimensional periodic structure having a period $p_x$ in the x direction and a period $p_y$ in the y direction.

Excitation light may be coupled to a quasi-guided mode to efficiently emit light. FIGS. 44A to 44D illustrate such a method. In this embodiment, as in the structure illustrated in FIGS. 1C and 1D, a photoluminescent layer 110 and a surface structure 120 are formed on a substrate 140. As illustrated in FIG. 44A, the period $p_x$ in the x direction is first determined so as to enhance light emission. As illustrated in FIG. 44B, the period $p_y$ in the y direction is then determined so as to couple excitation light to a quasi-guided mode. The period $p_x$ is determined so as to satisfy the condition given by replacing p by $p_x$ in the formula (18). The period $p_y$ is determined so as to satisfy the following formula (38), wherein m is an integer of 1 or more, $\lambda_{ex}$ denotes the wavelength of excitation light, and $n_{out}$ denotes the refractive index of a medium having the highest refractive index of the media in contact with the photoluminescent layer 110 except the surface structure 120. In the following formula (38), $n_{out}$ denotes the refractive index $n_s$ of the substrate 140 in the embodiment illustrated in FIG. 44B.

$$\frac{m\lambda_{ex}}{n_{wav}} < p_y < \frac{m\lambda_{ex}}{n_{out}} \quad (38)$$

In particular, excitation light can be more effectively converted into a quasi-guided mode if m=1, that is, if the period $p_y$ is determined so as to satisfy the following formula (39):

$$\frac{\lambda_{ex}}{n_{wav}} < p_y < \frac{\lambda_{ex}}{n_{out}} \quad (39)$$

Thus, excitation light can be converted into a quasi-guided mode if the period $p_y$ is set to satisfy the condition represented by the formula (38) (particularly the condition represented by the formula (39)). As a result, the photoluminescent layer 110 can efficiently absorb excitation light having the wavelength $\lambda_{ex}$.

Figure 44C:
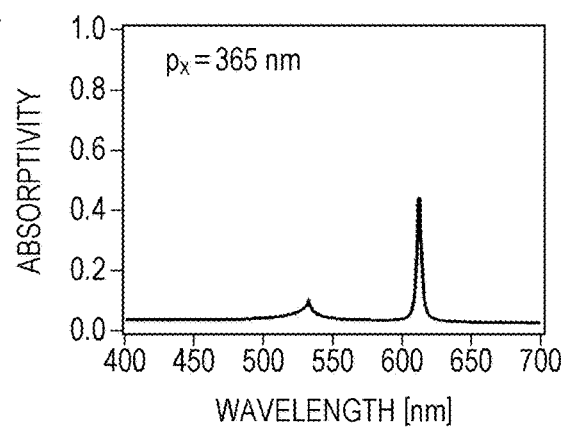
FIG. 44C is a graph showing the wavelength dependence of light absorptivity in the structure illustrated in FIG. 44A.
Figure 44D:
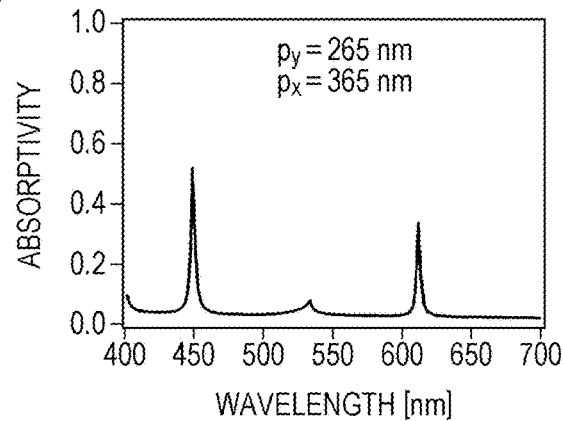
FIG. 44D is a graph showing the wavelength dependence of light absorptivity in the structure illustrated in FIG. 44B.

FIGS. 44C and 44D are the calculation results of the proportion of absorbed light to light incident on the structures illustrated in FIGS. 44A and 44B, respectively, for each wavelength. In these calculations, $p_x$=365 nm, $p_y$=265 nm, the photoluminescent layer 110 had an emission wavelength $\lambda$ of approximately 600 nm, excitation light had a wavelength $\lambda_{ex}$ of approximately 450 nm, and the photoluminescent layer 110 had an extinction coefficient of 0.003. FIG. 44D shows high absorptivity not only for light emitted from the photoluminescent layer 110 but also for excitation light of approximately 450 nm. This is because incident light is effectively converted into a quasi-guided mode and can thereby increase the proportion of light absorbed into the photoluminescent layer 110. The photoluminescent layer 110 also has increased absorptivity at the emission wavelength of approximately 600 nm. This indicates that light having a wavelength of approximately 600 nm incident on this structure is effectively converted into a quasi-guided mode in the same manner. The surface structure 120 illustrated in FIG. 44B is a two-dimensional periodic structure including structures having different periods (referred to as periodic components) in the x direction and the y direction. Such a two-dimensional periodic structure including multiple periodic components can provide high excitation efficiency and high output intensity. Although excitation light is incident on the substrate 140 in FIGS. 44A and 44B, the same effect can also be produced even if excitation light is incident on the surface structure 120.

8-2. Powder

These embodiments show that light of any wavelength can be enhanced by adjusting the period of the periodic structure and/or the thickness of the photoluminescent layer. For example, if the structure illustrated in FIGS. 1A and 1B is formed from a photoluminescent material that emits light over a wide wavelength range, only light having a certain wavelength can be enhanced. The structure of the light-emitting device 100 as illustrated in FIGS. 1A and 1B may be provided in powder form for use as a fluorescent material.

Alternatively, the light-emitting device 100 as illustrated in FIGS. 1A and 1B may be embedded in resin or glass.

Figure 45:
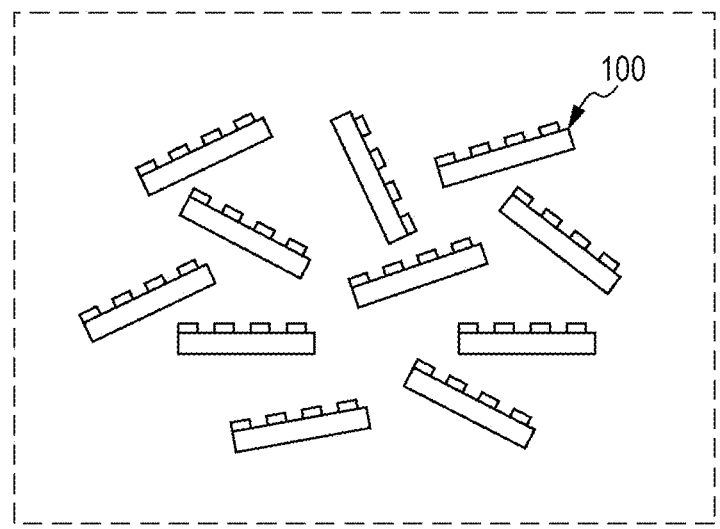
FIG. 45 is a schematic view of a mixture of light-emitting devices in powder form.

The single structure as illustrated in FIGS. 1A and 1B can selectively emit only light having a certain wavelength in a particular direction and is therefore not suitable for light having a wide wavelength spectrum, such as white light. Thus, as shown in FIG. 45, light-emitting devices 100 that differ in the conditions such as the period of the periodic structure and the thickness of the photoluminescent layer may be mixed in powder form to provide a light-emitting apparatus with a wide wavelength spectrum. In such a case, each of the light-emitting devices 100 has sizes of, for example, several micrometers to several millimeters in one direction and can include, for example, one- or two-dimensional periodic structures with several periods to several hundreds of periods.

8-3. Array of Structures with Different Periods

Figure 46:
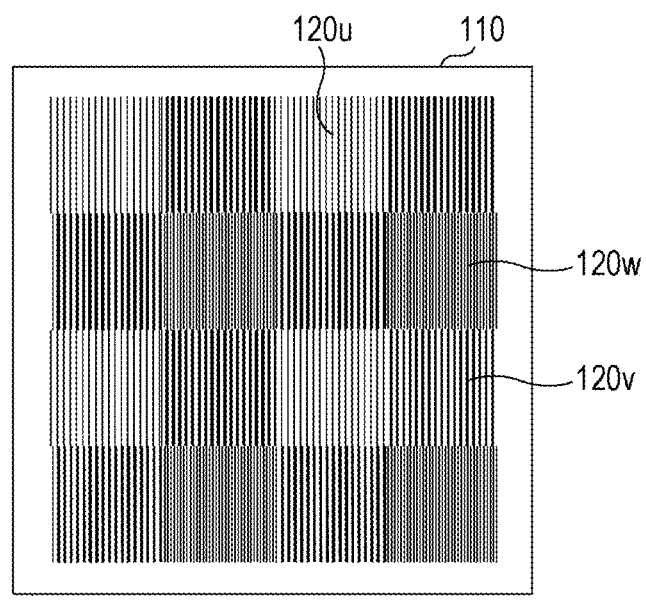
FIG. 46 is a plan view of a two-dimensional array of periodic structures having different periods on a photoluminescent layer.

FIG. 46 is a plan view of a two-dimensional array of periodic structures having different periods on a photoluminescent layer. In this embodiment, three types of periodic structures 120u, 120v, and 120w are tiled. The periods of the periodic structures 120u, 120v, and 120w are set to emit, for example, light in the red, green, and blue wavelength ranges, respectively, in the front direction. Such structures having different periods can be arranged on the photoluminescent layer to emit directional light having a wide wavelength spectrum. The periodic structures are not necessarily formed as described above and may be formed in any manner.

8-4. Layered Structure

Figure 47:
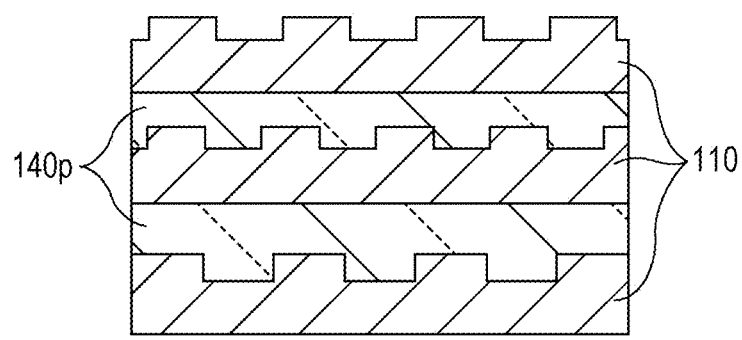
FIG. 47 is a schematic view of a light-emitting device including photoluminescent layers each having a textured surface.

FIG. 47 illustrates a light-emitting device including photoluminescent layers 110 each having a textured surface. A transparent substrate 140p is disposed between the photoluminescent layers 110, and the textured structure formed on each of the photoluminescent layers 110 corresponds to the periodic structure or the submicron structure. The embodiment illustrated in FIG. 47 includes three periodic structures having different periods. The periods of these periodic structures are set to emit light in the red, green, and blue wavelength ranges in the front direction. The material of each of the photoluminescent layers 110 is selected such that the photoluminescent layers 110 can emit light in their respective colors corresponding to the periods of the periodic structures. Thus, periodic structures having different periods can be stacked to emit directional light having a wide wavelength spectrum.

The number of photoluminescent layers 110, the structure of the photoluminescent layers 110, and the constitution of the periodic structure are not limited to those illustrated in FIG. 47. For example, in the case of a structure including two layers, first and second photoluminescent layers are formed opposite each other with a light-transmissive substrate interposed therebetween, and first and second periodic structures are formed on the first and second photoluminescent layers, respectively. In such a case, a pair of the first photoluminescent layer and the first periodic structure and a pair of the second photoluminescent layer and the second periodic structure satisfy the condition represented by the formula (23). In the case of a structure including three or more layers, the photoluminescent layer and the periodic structure in each layer satisfy the condition represented by the formula (23). The positional relationship between the photoluminescent layers and the periodic structures illustrated in FIG. 47 may be reversed. Although the layers have different periods in FIG. 47, all the layers may have the same period. In such a case, although the spectrum cannot be broadened, the emission intensity can be increased.

9. Materials and Production Methods

9-1. Material

A structure including a photoluminescent layer (light guiding layer) and a surface structure (typically a periodic structure) that satisfy these conditions can emit directional light. The surface structure may be formed of any material. However, a photoluminescent layer (or light guiding layer) and a periodic structure formed of a medium with high light absorption are less effective in confining light and therefore result in a lower peak intensity and Q value. Thus, the photoluminescent layer (or light guiding layer) and the surface structure may be formed of a medium with relatively low light absorption.

For example, the periodic structure may be formed of a dielectric material having low light absorptivity. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins can be used, which have refractive indices of approximately 1.3 to 1.5.

The term "photoluminescent material" encompasses fluorescent materials and phosphorescent materials in a narrow sense, encompasses inorganic materials and organic materials (for example, dyes), and encompasses quantum dots (for example, tiny semiconductor particles). In general, fluorescent materials containing an inorganic host material tend to have a higher refractive index. Examples of fluorescent materials that emit blue light include $M_{10}(PO_4)_6Cl_2$:$Eu^{2+}$ (wherein M is at least one element selected from Ba, Sr, and Ca), $BaMgAl_{10}O_{17}$:$Eu^{2+}$, $M_3MgSi_2O_8$:$Eu^{2+}$ (wherein M is at least one element selected from Ba, Sr, and Ca), and $M_5SiO_4Cl_6$:$Eu^{2+}$ (wherein M is at least one element selected from Ba, Sr, and Ca). Examples of fluorescent materials that emit green light include $M_2MgSi_2O_7$:$Eu^{2+}$ (wherein M is at least one element selected from Ba, Sr, and Ca), $SrSi_5AlO_2N_7$:$Eu^{2+}$, $SrSi_2O_2N_2$:$Eu^{2+}$, $BaAl_2O_4$:$Eu^{2+}$, $BaZrSi_3O_9$:$Eu^{2+}$, $M_2SiO_4$:$Eu^{2+}$ (wherein M is at least one element selected from Ba, Sr, and Ca), $BaSi_3O_4N_2$:$Eu^{2+}$, $Ca_8Mg(SiO_4)_4Cl_2$:$Eu^{2+}$, $Ca_3SiO_4Cl_2$:$Eu^{2+}$, $CaSi_{12-(m+n)}Al_{(m+n)}O_nN_{16-n}$:$Ce^{3+}$, and β-SiAlON:$Eu^{2+}$. Examples of fluorescent materials that emit red light include $CaAlSiN_3$:$Eu^{2+}$, $SrAlSi_4O_7$:$Eu^{2+}$, $M_2Si_5N_8$:$Eu^{2+}$ (wherein M is at least one element selected from Ba, Sr, and Ca), $MSiN_2$:$Eu^{2+}$ (wherein M is at least one element selected from Ba, Sr, and Ca), $MSi_2O_2N_2$:$Yb^{2+}$ (wherein M is at least one element selected from Sr and Ca), $Y_2O_2S$:$Eu^{3+}$, $Sm^{3+}$, $La_2O_2S$:$Eu^{3+}$, $Sm^{3+}$, $CaWO_4$:$Li^{1+}$, $Eu^{3+}$, $Sm^{3+}$, $M_2SiS_4$:$Eu^{2+}$ (wherein M is at least one element selected from Ba, Sr, and Ca), and $M_3SiO_5$:$Eu^{2+}$ (wherein M is at least one element selected from Ba, Sr, and Ca). Examples of fluorescent materials that emit yellow light include $Y_3Al_5O_{12}$:$Ce^{3+}$, $CaSi_2O_2N_2$:$Eu^{2+}$, $Ca_3Sc_2Si_3O_{12}$:$Ce^{3+}$, $CaSc_2O_4$:$Ce^{3+}$, α-SiAlON:$Eu^{2+}$, $MSi_2O_2N_2$:$Eu^{2+}$ (wherein M is at least one element selected from Ba, Sr, and Ca), and $M_7(SiO_3)_6Cl_2$:$Eu^{2+}$ (wherein M is at least one element selected from Ba, Sr, and Ca).

Examples of quantum dots include materials such as CdS, CdSe, core-shell CdSe/ZnS, and alloy CdSSe/ZnS. Light having various wavelengths can be emitted depending on the material. Examples of matrices for quantum dots include glasses and resins.

The substrate 140 illustrated in, for example, FIGS. 1C and 1D is formed of a light-transmissive material having a lower refractive index than the photoluminescent layer 110. Examples of such materials include magnesium fluoride ($MgF_2$), lithium fluoride (LiF), calcium fluoride ($CaF_2$), quartz ($SiO_2$), glasses, and resins. For example, the substrate 140 may be formed of $BaF_2$, $SrF_2$, MgO, $MgAl_2O_4$, sapphire ($Al_2O_3$), $SrTiO_3$, $LaAlO_3$, $TiO_2$, $Gd_3Ga_5O_{12}$, $LaSrAlO_4$, $LaSrGaO_4$, $LaTaO_3$, SrO, yttria-stabilized zirconia (YSZ) $ZrO_2.Y_2O_3$, yttrium-aluminum-garnet (YAG), or $Tb_3Ga_5O_{12}$. In structures in which excitation light enters the photoluminescent layer 110 without passing through the substrate 140, the substrate 140 is not necessarily transparent.

9-2. Production Method

A method for producing a light-emitting device will be described below.

A method for forming the structure illustrated in FIGS. 1C and 1D includes forming the photoluminescent layer 110 on the substrate 140, for example, by evaporation, sputtering, or coating of a fluorescent material, forming a dielectric film, and then patterning the dielectric film, for example, by photolithography to form the periodic structure 120. Alternatively, the periodic structure 120 may be formed by nanoimprinting. Before the formation of the periodic structure 120, a material for the protective layer 150 may be deposited on the photoluminescent layer 110 by evaporation or sputtering, thereby forming the light guiding layer 200 illustrated in FIG. 16.

The light-emitting device 100 illustrated in FIGS. 1A and 1B can be produced, for example, by producing the light-emitting device 100S illustrated in FIGS. 1C and 1D and then removing the photoluminescent layer 110 and the surface structure 120 from the substrate 140.

The structure illustrated in FIG. 17A can be produced, for example, by forming the periodic structure 120a on the substrate 140 by a semiconductor process or nanoimprinting and then depositing the material of the photoluminescent layer 110 on the periodic structure 120a by evaporation or sputtering. The structure illustrated in FIG. 17B can be produced by filling the recesses in the periodic structure 120a with the photoluminescent layer 110 by coating.

The structure that includes the belt-like portions 112 in the photoluminescent layer illustrated in FIG. 31 or 41 is produced, for example, by depositing the material of the photoluminescent layer on the substrate 140, patterning the photoluminescent layer by photolithography, and forming the periodic structure 120. Alternatively, after the photoluminescent layer and the periodic structure 120 are formed, part of the photoluminescent layer and the periodic structure 120 may be removed by micromachining to form such a structure. As described above, after the periodic structure 120a is formed on the substrate 140 by a semiconductor process or nanoimprinting, the photoluminescent layer may be processed in a band shape by a lift-off process. More specifically, before a photoluminescent material is deposited on the substrate, a belt-like pattern is formed with a photoresist on a portion from which the photoluminescent material is to be selectively removed on a region of the substrate 140 on which the periodic structure 120a is formed. After that, a photoluminescent layer is formed on the photoresist pattern. The photoresist is removed together with the photoluminescent material disposed on the photoresist, thereby forming belt-like portions each having a periodic structure on its surface (see FIG. 35A). These production methods are for illustrative purposes only, and the light-emitting devices according to the embodiments of the present disclosure may be produced by other methods.

10. Reduction in Viewing Angle Dependence of Color of Output Light

Figure 48:
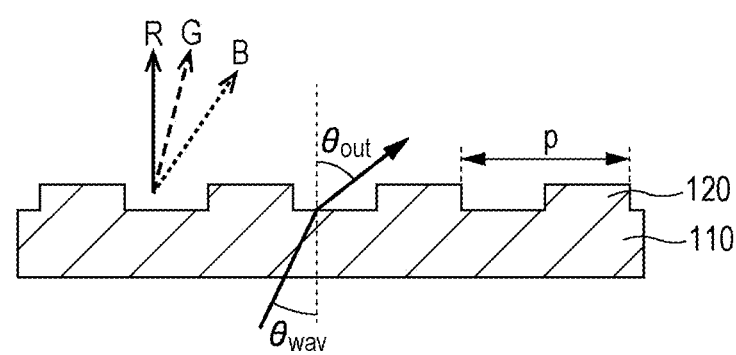
FIG. 48 is a schematic view illustrating the relationship between the wavelength and output direction of light under the emission enhancement effect in a light-emitting device having a periodic structure on a photoluminescent layer.

The wavelength and output direction of light under the emission enhancement effect depend on the constitution of the surface structure. FIG. 48 illustrates a light-emitting device having a periodic structure 120 on a photoluminescent layer 110. The periodic structure 120 is formed of the material of the photoluminescent layer 110 and has the one-dimensional periodic structure illustrated in FIG. 1A. Light to be enhanced by the one-dimensional periodic structure satisfies the relationship $p \times n_{wav} \times \sin \theta_{wav} - p \times n_{out} \times \sin \theta_{out} = m\lambda$. (see the formula (13); "x" means multiplication), wherein p (nm) denotes the period of the one-dimensional periodic structure, $n_{wav}$ denotes the refractive index of the photoluminescent layer 110, $n_{out}$ denotes the refractive index of an outer medium toward which the light is emitted, $\theta_{wav}$ denotes the incident angle of light on the one-dimensional periodic structure, and $\theta_{out}$ denotes the angle at which the light is emitted from one-dimensional periodic structure to the outer medium. $\lambda$ denotes the light wavelength in air, and m is an integer.

The formula can be transformed into $\theta_{out} = \arcsin[(n_{wav} \times \sin \theta_{wav} - m\lambda/p)/n_{out}]$. Thus, in general, the output angle $\theta_{out}$ of light under the emission enhancement effect varies with the wavelength $\lambda$. Consequently, as schematically illustrated in FIG. 48, the color of visible light varies with the observation direction.

This viewing angle dependence can be reduced by determining $n_{wav}$ and $n_{out}$ so as to make $(n_{wav} \times \sin \theta_{wav} - m\lambda/p)/n_{out}$ constant for any wavelength $\lambda$. The refractive indices of substances have wavelength dispersion (wavelength dependence). Thus, materials having $n_{wav}$ and $n_{out}$ to be selected should have the wavelength dispersion characteristics such that $(n_{wav} \times \sin \theta_{wav} - m\lambda/p)/n_{out}$ is independent of the wavelength $\lambda$. For example, if the outer medium is air, $n_{out}$ is approximately 1.0 irrespective of the wavelength. Thus, the material of the photoluminescent layer 110 and the periodic structure 120 advantageously has a narrow wavelength dispersion of the refractive index $n_{wav}$. The material also advantageously has a reciprocal dispersion of the refractive index $n_{wav}$ in which the refractive index is lower for light of a shorter wavelength.

Figure 49A:
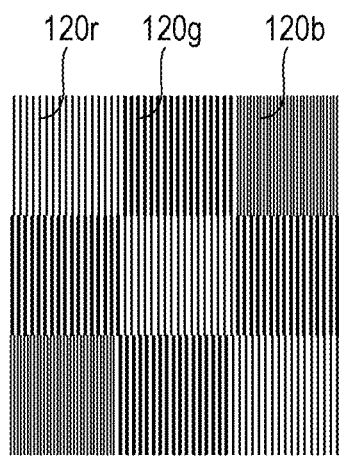
FIG. 49A is a schematic plan view of an example structure of an array of periodic structures that have the emission enhancement effect at different wavelengths.

As illustrated in FIG. 49A, an array of periodic structures that have the emission enhancement effect at different wavelengths can emit white light. In the embodiment illustrated in FIG. 49A, a periodic structure 120r that can enhance red light (R), a periodic structure 120g that can enhance green light (G), and a periodic structure 120b that can enhance blue light (B) are arranged in a matrix. Each of the periodic structures 120r, 120g, and 120b may be a one-dimensional periodic structure. The projections of the periodic structures 120r, 120g, and 120b may be arranged in parallel. Thus, the red light, green light, and blue light may have the same polarization characteristics. Light beams of three primary colors emitted from the periodic structures 120r, 120g, and 120b under the emission enhancement effect are mixed to produce linearly polarized white light.

Each of the periodic structures 120r, 120g, and 120b arranged in a matrix is referred to as a unit periodic structure (or pixel). The size (the length of one side) of the unit periodic structure may be at least three times the period. It is desirable that the unit periodic structures be not perceived by the human eye in order to produce the color mixing effect. For example, the length of one side is less than 1 mm. Although each of the unit periodic structures is square in the figure, adjacent periodic structures 120r, 120g, and 120b may be in the shape other than square, such as rectangular, triangular, or hexagonal. Photoluminescent layers under the periodic structures 120r, 120g, and 120b may be the same or may be formed of different photoluminescent materials corresponding to their respective colors of light.

Figure 49B:
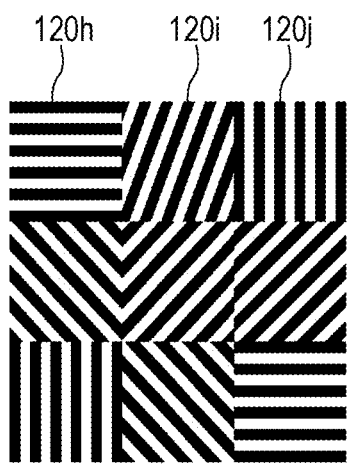
FIG. 49B is a schematic plan view of an example structure that includes an array of one-dimensional periodic structures having projections extending in different directions.

As illustrated in FIG. 49B, the projections of the one-dimensional periodic structures (including periodic structures 120h, 120i, and 120j) may extend in different directions. Light emitted from each of the periodic structures under the emission enhancement effect may have the same wavelength or different wavelengths. For example, the same periodic structures arranged as illustrated in FIG. 49B can produce unpolarized light. The periodic structures 120r, 120g, and 120b illustrated in FIG. 49A arranged as illustrated in FIG. 49B can produce unpolarized white light as a whole.

Figure 50:
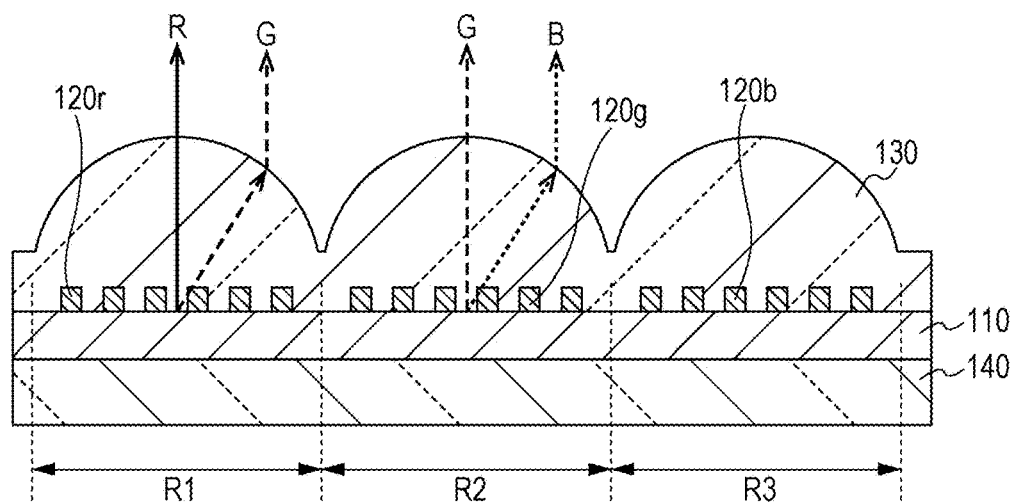
FIG. 50 is a schematic cross-sectional view of a light-emitting device including microlenses.

As illustrated in FIG. 50, for example, an array of microlenses 130 may be disposed on a light emission side of a light-emitting device. The array of microlenses 130 can refract oblique light in the normal direction and thereby produce the color mixing effect. The light-emitting device illustrated in FIG. 50 includes regions R1, R2, and R3, which include the periodic structures 120r, 120g, and 120b, respectively, illustrated in FIG. 49A. In the region R1, the periodic structure 120r outputs red light R in the normal direction and, for example, outputs green light G in an oblique direction. The microlens 130 refracts the oblique green light G in the normal direction. Consequently, a mixture of red light R and green light G is observed in the normal direction. Thus, the microlenses 130 can reduce the viewing angle dependence of the color of light to be observed. Although the microlens array including microlenses corresponding to the periodic structures is described here, another microlens array is also possible. As a matter of course, periodic structures to be tiled are not limited to those described above and may be the same periodic structures or the structures illustrated in FIG. 49B.

A lenticular lens may also be used as an optical element for refracting oblique light instead of the microlens array. In addition to lenses, prisms may also be used. A prism array may also be used. A prism corresponding to each periodic structure may be arranged. Prisms of any shape may be used. For example, a triangular or pyramidal prism may be used.

Figure 51A:
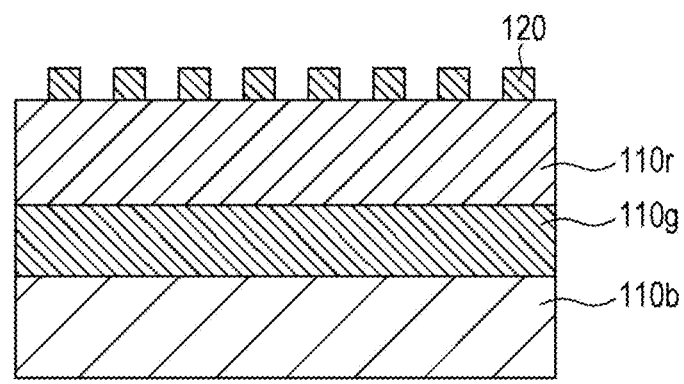
FIG. 51A is a schematic cross-sectional view of a light-emitting device that includes photoluminescent layers having different emission wavelengths.
Figure 51B:
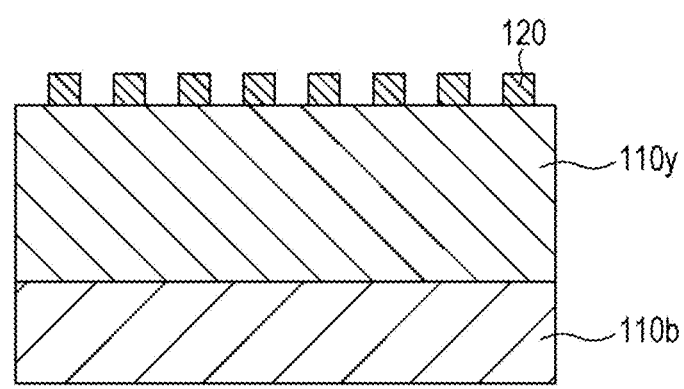
FIG. 51B is a schematic cross-sectional view of another light-emitting device that includes photoluminescent layers having different emission wavelengths.

White light (light having a broad spectral width) may be produced by using the periodic structure described above or using a plurality of photoluminescent layers as illustrated in FIG. 51A or 51B. For example, as illustrated in FIG. 51A, the photoluminescent layer 110b that emits blue light, the photoluminescent layer 110g that emits green light, and the photoluminescent layer 110r that emits red light can be stacked to generate white light. As illustrated in FIG. 51B, a photoluminescent layer 110y that emits yellow light may be disposed on the photoluminescent layer 110b. The photoluminescent layer 110y may be formed of YAG. In this way, photoluminescent layers having different emission wavelengths can be stacked to generate white light. Photoluminescent layers having different emission wavelengths may be stacked in any order, including that illustrated in the figure.

When photoluminescent materials, such as fluorescent dyes, to be mixed with a matrix (host) material are used, photoluminescent materials having different emission wavelengths may be mixed with the matrix material to emit white light from a single photoluminescent layer. Such a photoluminescent layer that emits white light may be used in tiled unit periodic structures as illustrated in FIG. 49A and FIG. 49B.

11. Diffusion-Barrier Layer, Crystal Growth Layer, Thermally Conductive Layer, and Surface Protective Layer When an inorganic material (for example, YAG) is used as a material for a photoluminescent layer (for example, the photoluminescent layer 110), the inorganic material may be subjected to heat treatment at more than 1000° C. in the production process. During the production process, impurities may diffuse from an underlayer (typically, a substrate) and affect the light-emitting properties of the photoluminescent layer. In order to prevent impurities from diffusing into the photoluminescent layer, a diffusion-barrier layer (barrier layer) 108 may be disposed under the photoluminescent layer, as illustrated in FIGS. 52A to 52D. As illustrated in FIGS. 52A to 52D, the diffusion-barrier layer 108 is disposed under the photoluminescent layer in the structures described above.

Figure 52A:
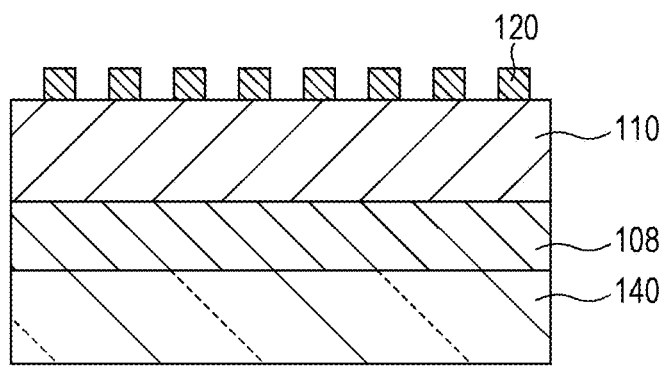
FIG. 52A is a schematic cross-sectional view of a light-emitting device that includes a diffusion-barrier layer (barrier layer) under a photoluminescent layer.
Figure 52B:
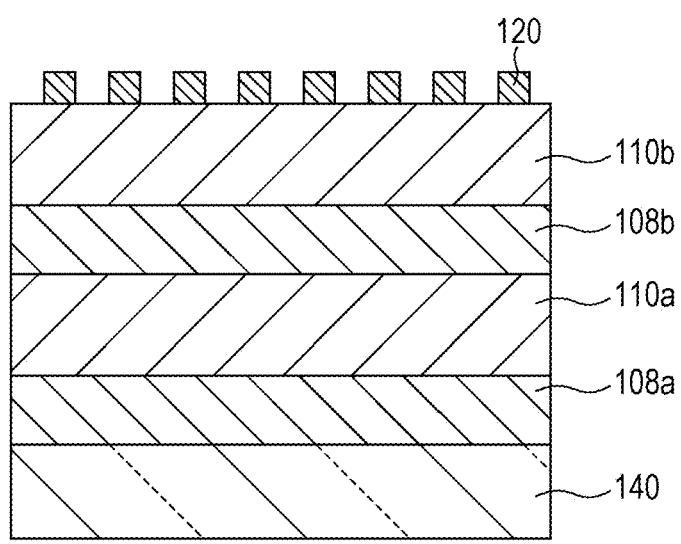
FIG. 52B is a schematic cross-sectional view of another light-emitting device that includes a diffusion-barrier layer (barrier layer) under a photoluminescent layer.

For example, as illustrated in FIG. 52A, the diffusion-barrier layer 108 may be disposed between a substrate 140 and a photoluminescent layer 110. As illustrated in FIG. 52B, when a light-emitting device includes photoluminescent layers 110a and 110b, diffusion-barrier layers 108a and 108b can be disposed under the photoluminescent layers 110a and 110b, respectively.

Figure 52C:
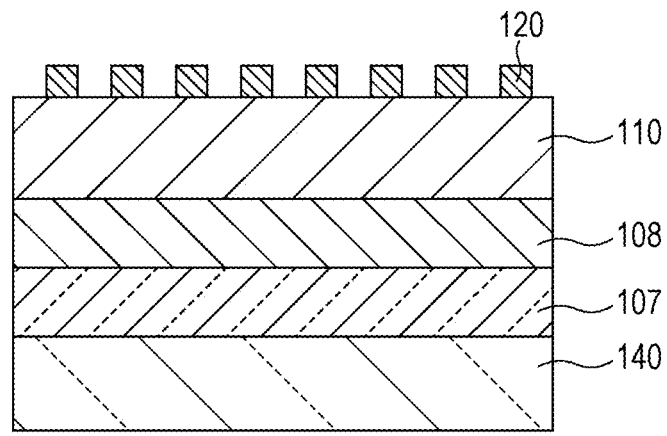
FIG. 52C is a schematic cross-sectional view of still another light-emitting device that includes a diffusion-barrier layer (barrier layer) under a photoluminescent layer.
Figure 52D:
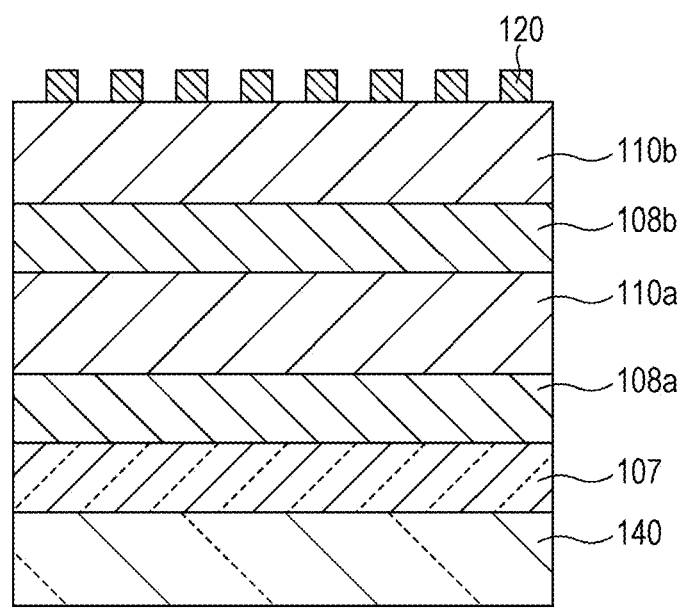
FIG. 52D is a schematic cross-sectional view of still another light-emitting device that includes a diffusion-barrier layer (barrier layer) under a photoluminescent layer.

When the substrate 140 has a higher refractive index than the photoluminescent layer 110, a low-refractive-index layer 107 may be formed on the substrate 140, as illustrated in FIGS. 52C and 52D. When the low-refractive-index layer 107 is disposed on the substrate 140, as illustrated in FIG. 52C, the diffusion-barrier layer 108 is formed between the low-refractive-index layer 107 and the photoluminescent layer 110. As illustrated in FIG. 52D, when a light-emitting device includes photoluminescent layers 110a and 110b, diffusion-barrier layers 108a and 108b are disposed under the photoluminescent layers 110a and 110b, respectively.

The low-refractive-index layer 107 is formed if the substrate 140 has a refractive index greater than or equal to the refractive index of the photoluminescent layer 110. The low-refractive-index layer 107 has a lower refractive index than the photoluminescent layer 110. The low-refractive-index layer 107 may be formed of $MgF_2$, LiF, $CaF_2$, $BaF_2$, $SrF_2$, quartz, a resin, or a room-temperature curing glass, such as hydrogen silsesquioxane (HSQ) spin-on glass (SOG). The thickness of the low-refractive-index layer 107 is typically greater than the wavelength of light. For example, the substrate 140 may be formed of $MgF_2$, LiF, $CaF_2$, $BaF_2$, $SrF_2$, glass, a resin, MgO, $MgAl_2O_4$, sapphire ($Al_2O_3$), $SrTiO_3$, $LaAlO_3$, $TiO_2$, $Gd_3Ga_5O_{12}$, $LaSrAlO_4$, $LaSrGaO_4$, $LaTaO_3$, SrO, YSZ ($ZrO_2 \cdot Y_2O_3$), YAG, or $Tb_3Ga_5O_{12}$.

The materials of the diffusion-barrier layers 108, 108a, and 108b can depend on the element to be prevented from diffusing. The materials of the diffusion-barrier layers 108, 108a, and 108b may be oxide crystals or nitride crystals with strong covalent bonding. Each of the diffusion-barrier layers 108, 108a, and 108b may have a thickness of 50 nm or less.

In structures that include a layer adjacent to the photoluminescent layer 110, such as the diffusion-barrier layer 108 or a crystal growth layer 106 described later, when the adjacent layer has a higher refractive index than the photoluminescent layer 110, the refractive index $n_{wav}$ is the average refractive index of the layer having the higher refractive index and the photoluminescent layer 110 weighted by their respective volume fractions. This situation is optically equivalent to a photoluminescent layer composed of layers of different materials. However, when a layer having a higher refractive index than the photoluminescent layer is adjacent to the photoluminescent layer and is disposed between the photoluminescent layer and the surface structure, the layer is differentiated from the photoluminescent layer, and the formula (37) is applied to the layer.

Figure 53A:
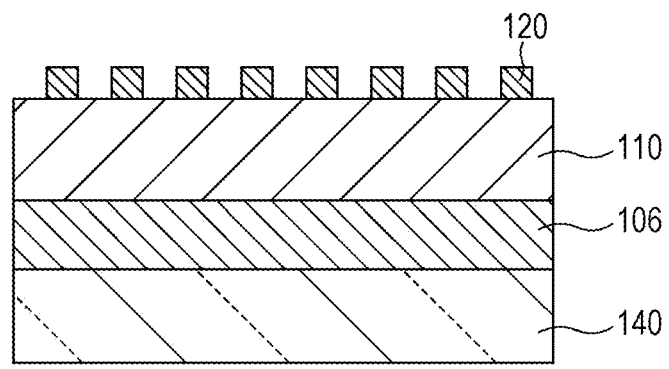
FIG. 53A is a schematic cross-sectional view of a light-emitting device that includes a crystal growth layer (seed layer) under a photoluminescent layer.

When a photoluminescent layer is formed of an inorganic material, the photoluminescent layer may have poor light-emitting properties due to low crystallinity of the inorganic material. In order to increase the crystallinity of the inorganic material constituting the photoluminescent layer, as illustrated in FIG. 53A, a crystal growth layer (hereinafter also referred to as a "seed layer") may be disposed under the photoluminescent layer (for example, the photoluminescent layer 110). The material of the crystal growth layer 106 is lattice-matched to the crystals of the overlying photoluminescent layer 110. The lattice matching may be within ±5%. If the substrate 140 has a higher refractive index than the photoluminescent layer 110, the crystal growth layer 106 has a lower refractive index than the photoluminescent layer 110.

Figure 53B:
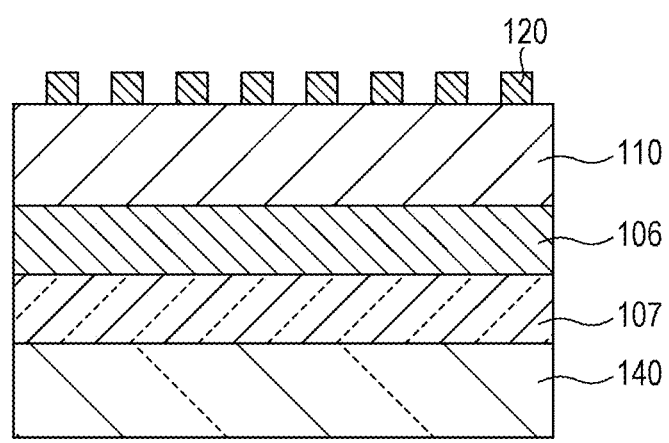
FIG. 53B is a schematic cross-sectional view of another light-emitting device that includes a crystal growth layer (seed layer) under a photoluminescent layer.
Figure 53C:
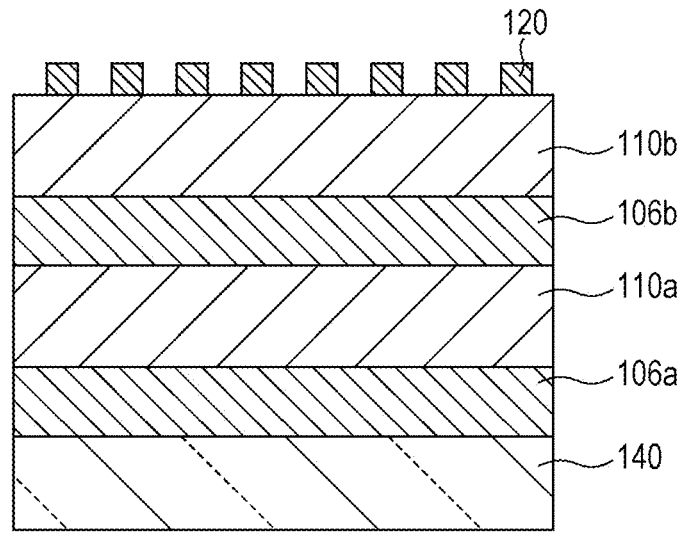
FIG. 53C is a schematic cross-sectional view of still another light-emitting device that includes a crystal growth layer (seed layer) under a photoluminescent layer.

If the substrate 140 has a higher refractive index than the photoluminescent layer 110, a low-refractive-index layer 107 is formed on the substrate 140, as illustrated in FIG. 53B. Because the crystal growth layer 106 is in contact with the photoluminescent layer 110, the crystal growth layer 106 is formed on the low-refractive-index layer 107, which is disposed on the substrate 140. In structures that include photoluminescent layers 110a and 110b, as illustrated in FIG. 53C, crystal growth layers 106a and 106b may be formed on the photoluminescent layers 110a and 110b, respectively. Each of the crystal growth layers 106, 106a, and 106b may have a thickness of 50 nm or less.

Figure 54A:
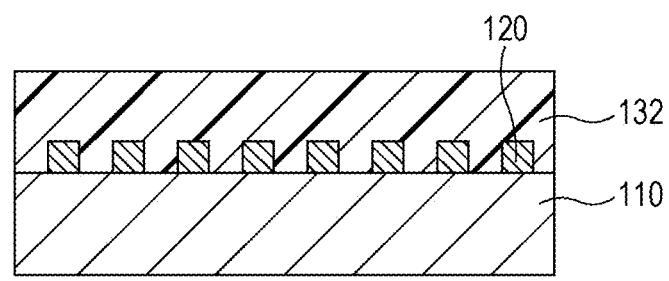
FIG. 54A is a schematic cross-sectional view of a light-emitting device that includes a surface protective layer for protecting a periodic structure.
Figure 54B:
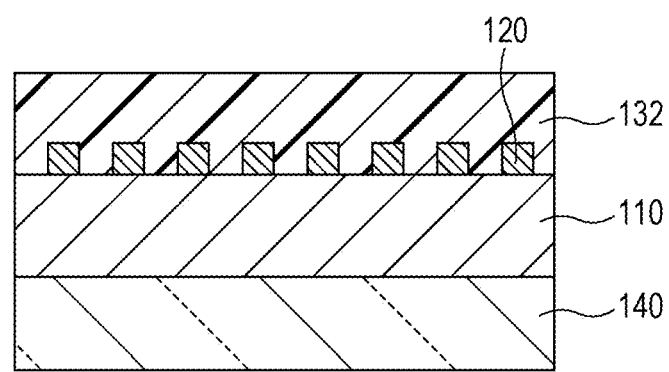
FIG. 54B is a schematic cross-sectional view of another light-emitting device that includes a surface protective layer for protecting a periodic structure.

As illustrated in FIGS. 54A and 54B, a surface protective layer 132 may be formed to protect a surface structure 120. The surface protective layer 132 may be formed in a light-emitting device with or without the substrate 140, as illustrated in FIGS. 54A and 54B. When the surface protective layer 132 is formed in a light-emitting device without a substrate, the surface protective layer 132 may be formed of a material having a refractive index different from the refractive index of a medium on a surface of the photoluminescent layer 110 opposite the surface protective layer 132. In the light-emitting device without the substrate illustrated in FIG. 54A, a surface protective layer may also be formed under the photoluminescent layer 110. When the surface protective layer 132 is formed in a light-emitting device with a substrate, the surface protective layer 132 is formed of a material having a refractive index different from the refractive index of the substrate 140. The surface protective layer 132 may be formed on any surface of the light-emitting devices described above. The surface structure 120 is not limited to those illustrated in FIGS. 54A and 54B and may be of any of the types described above.

The surface protective layer 132 may be formed of a resin, a hard coat material, $SiO_2$, alumina ($Al_2O_3$), silicon oxycarbide (SiOC), or diamond-like carbon (DLC). The surface protective layer 132 may have a thickness in the range of 100 nm to 10 μm.

The surface protective layer 132 can protect the light-emitting device from the external environment and suppress the degradation of the light-emitting device. The surface protective layer 132 can protect the surface of the light-emitting device from scratches, water, oxygen, acids, alkalis, or heat. The material and thickness of the surface protective layer 132 may be appropriately determined for each use.

Photoluminescent materials sometimes deteriorate due to heat. Heat is mostly generated by the nonradiative loss or Stokes loss of the photoluminescent layer. For example, the thermal conductivity of quartz (1.6 W/m·K) is lower by an order of magnitude than the thermal conductivity of YAG (11.4 W/m·K). Thus, when the substrate 140 is a quartz substrate, heat generated by the photoluminescent layer (for example, a YAG layer) is not fully dissipated via the substrate (the quartz substrate) and increases the temperature of the photoluminescent layer, thereby possibly causing thermal degradation.

Figure 55A:
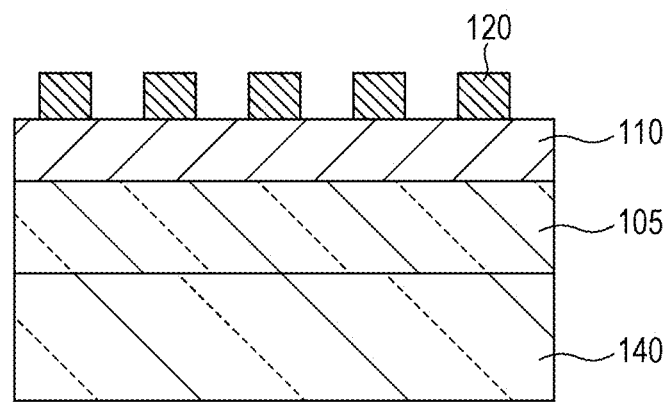
FIG. 55A is a schematic cross-sectional view of a light-emitting device having a transparent thermally conductive layer.
Figure 55B:
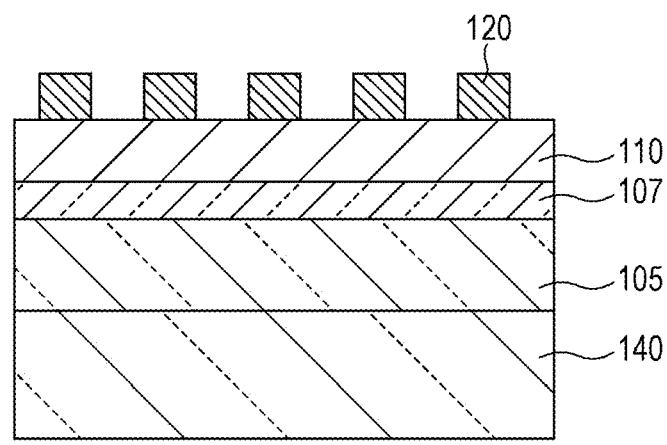
FIG. 55B is a schematic cross-sectional view of another light-emitting device having a transparent thermally conductive layer.

Thus, as illustrated in FIG. 55A, a transparent thermally conductive layer 105 may be formed between a photoluminescent layer (for example, the photoluminescent layer 110) and the substrate 140. The transparent thermally conductive layer 105 can efficiently dissipate the heat of the photoluminescent layer 110 and reduce the temperature rise. The transparent thermally conductive layer 105 has a lower refractive index than the photoluminescent layer 110. If the substrate 140 has a lower refractive index than the photoluminescent layer 110, the transparent thermally conductive layer 105 may have a higher refractive index than the photoluminescent layer 110. In such a case, the transparent thermally conductive layer 105, together with the photoluminescent layer 110, forms a waveguide structure. The transparent thermally conductive layer 105 typically has a thickness of 50 nm or less. As illustrated in FIG. 55B, in the presence of a low-refractive-index layer 107 between the photoluminescent layer 110 and the transparent thermally conductive layer 105, the transparent thermally conductive layer 105 may have an increased thickness.

Figure 55C:
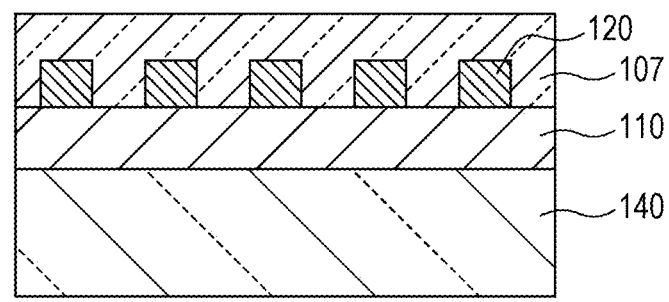
FIG. 55C is a schematic cross-sectional view of still another light-emitting device having a transparent thermally conductive layer.
Figure 55D:
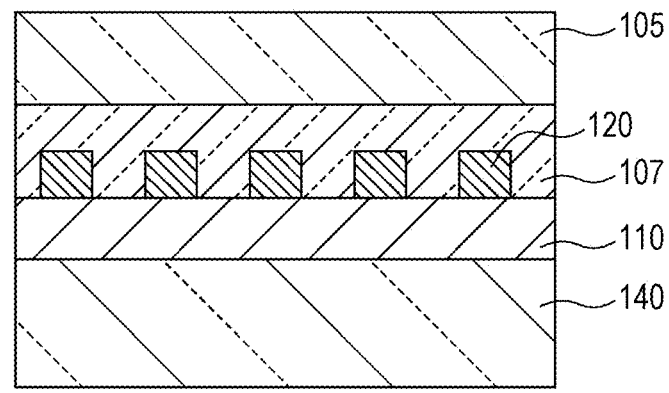
FIG. 55D is a schematic cross-sectional view of still another light-emitting device having a transparent thermally conductive layer.

As illustrated in FIG. 55C, the surface structure 120 may be covered with a low-refractive-index layer 107 having high thermal conductivity. As illustrated in FIG. 55D, a transparent thermally conductive layer 105 may be formed on the low-refractive-index layer 107 covering the surface structure 120. In this case, the low-refractive-index layer 107 does not necessarily have high thermal conductivity.

The material of the transparent thermally conductive layer 105 may be $Al_2O_3$, MgO, $Si_3N_4$, ZnO, AlN, $Y_2O_3$, diamond, graphene, $CaF_2$, or $BaF_2$. Among these, $CaF_2$ and $BaF_2$ can be used for the low-refractive-index layer 107 due to their low refractive indices.

12. Light-Emitting Apparatus with Improved Heat Dissipation Characteristics

A light-emitting apparatus that includes a light-emitting device and a light source and has high heat dissipation characteristics will be described below with reference to FIGS. 56A to 56D.

Figure 56A:
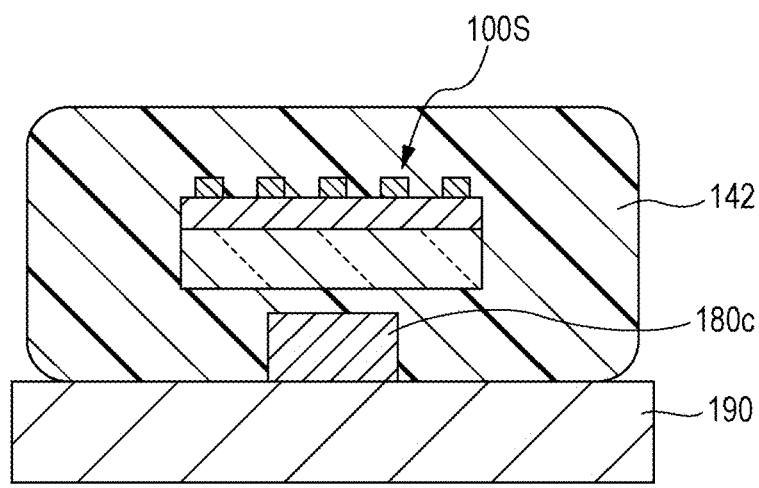
FIG. 56A is a schematic cross-sectional view of a light-emitting apparatus having improved heat dissipation characteristics.

A light-emitting apparatus illustrated in FIG. 56A includes an LED chip 180c as a light source and a light-emitting device. The light-emitting device may be of any of the types described above and is a light-emitting device 100S including the substrate 140 (see FIG. 1C, for example) in this embodiment. The LED chip 180c is disposed on a supporting substrate 190. The light-emitting device 100S is separated from the LED chip 180c by a predetermined distance. The light-emitting device 100S emits light upon receiving excitation light emitted from the LED chip 180c. The LED chip 180c and the light-emitting device 100S on the supporting substrate 190 are covered with a sealing component 142.

The sealing component 142 has high thermal conductivity and is transparent to light. The material of the sealing component 142 (hereinafter also referred to as a "sealing material") may be a composite material containing a thermally conductive filler and a resin material. The thermally conductive filler may be $Al_2O_3$, ZnO, $Y_2O_3$, graphene, or AlN. The resin material may be an epoxy resin or a silicone resin. In particular, the sealing material may be a nanocomposite material containing a thermally conductive filler of a nanometer size (for example, a submicron size). Use of the nanocomposite material can suppress the diffuse reflection (or scattering) of light. The nanocomposite material may contain ZnO or $Al_2O_3$ as filler and an epoxy resin or a silicone resin.

As illustrated in FIG. 56A, if the light-emitting device 100S is of a type in which the periodic structure is exposed at the surface, the refractive index of a medium around the periodic structure is typically lower than the refractive index of the periodic structure. For example, when the periodic structure is formed of the material of the photoluminescent layer, in order to efficiently extract light from the light-emitting device, the sealing component 142 advantageously has a lower refractive index than the photoluminescent layer.

Figure 56B:
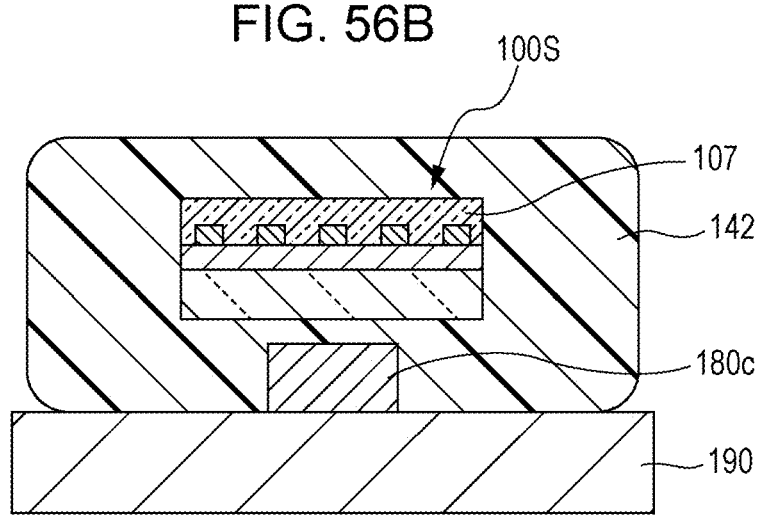
FIG. 56B is a schematic cross-sectional view of another light-emitting apparatus having improved heat dissipation characteristics.

As illustrated in FIG. 56B, if the light-emitting device 100S is of a type in which the periodic structure is covered with a low-refractive-index layer 107 (see FIG. 55C), the sealing component 142 may have a higher refractive index than the periodic structure. Such a structure can offer a wide selection of the material of the sealing component 142.

Figure 56C:
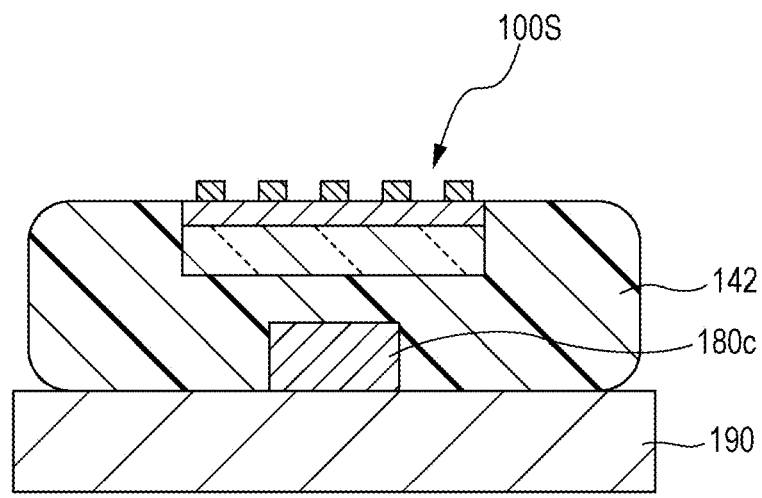
FIG. 56C is a schematic cross-sectional view of still another light-emitting apparatus having improved heat dissipation characteristics.

As illustrated in FIG. 56C, the sealing component 142 may be formed such that the vicinity of a surface (for example, the vicinity of the surface on which a periodic structure is disposed) of the light-emitting device 100S is exposed. In such a structure, the sealing component 142 may have any refractive index.

Figure 56D:
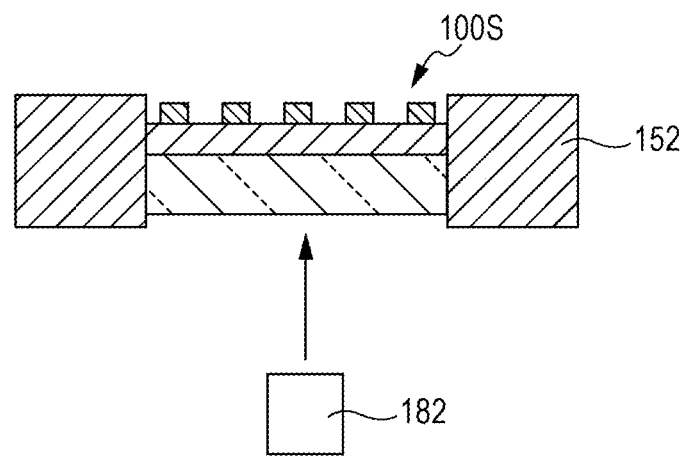

As illustrated in FIG. 56D, the periphery of the light-emitting device 100S may be fixed to a thermally conductive holder 152. The holder 152 may be made of a metal. For example, this structure can be used if the sealing material cannot be placed between the light-emitting device 100S and a light source as in the case where a laser diode 182 is used as a light source. For example, the light-emitting devices illustrated in FIGS. 55A to 55D, which include the transparent thermally conductive layer 105 or the thermally conductive low-refractive-index layer 107 and therefore have high in-plane thermal conductivity, can effectively dissipate heat via the holder 152.

As illustrated in FIGS. 57A to 57D, a thermally conductive member 144 or 146 may be disposed on a surface of the light-emitting device 100. The thermally conductive member 144 or 146 may be made of a metal.

Figure 57A:
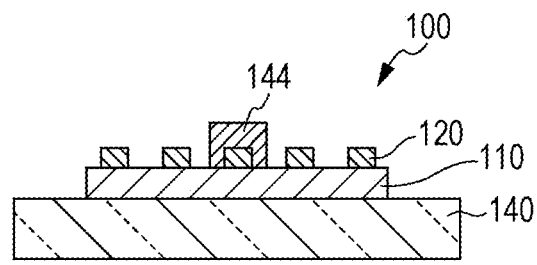
Figure 57B:
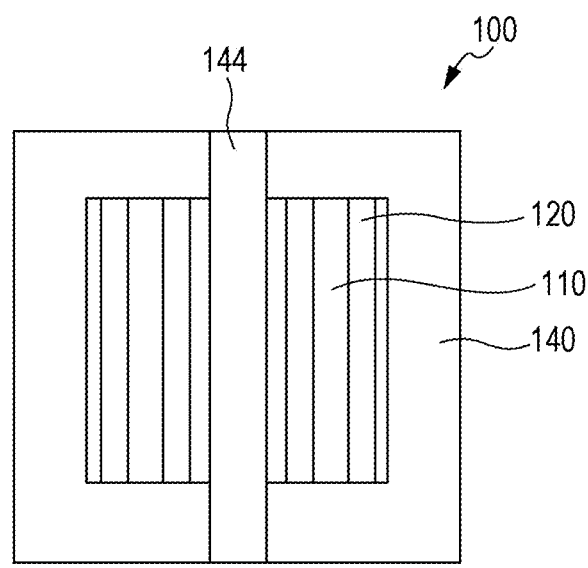

For example, as illustrated in a cross-sectional view of FIG. 57A and a plan view of FIG. 57B, the thermally conductive member 144 may partly cover a surface structure 120 of the light-emitting device 100. Although the linear thermally conductive member 144 covers one of the projections of a one-dimensional periodic structure in FIGS. 57A and 57B, the present disclosure is not limited to this.

Figure 57C:
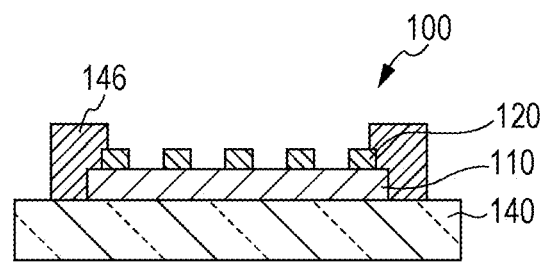
Figure 57D:
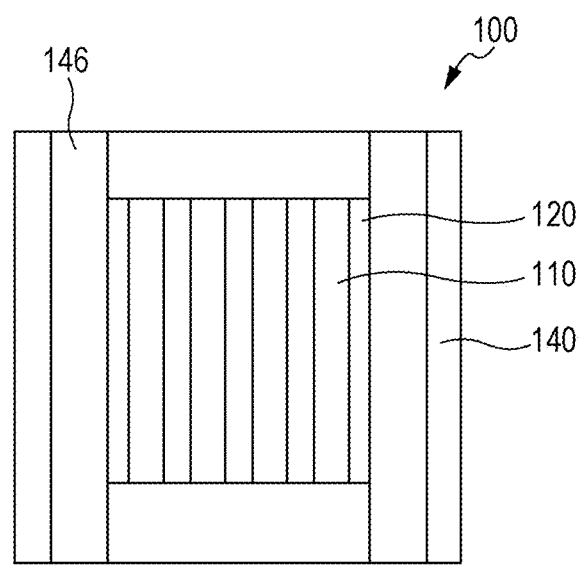

As illustrated in a cross-sectional view of FIG. 57C and a plan view of FIG. 57D, the thermally conductive member 146 may cover the outermost projections of the surface structure 120 and end surfaces of a photoluminescent layer 110. However, an increase in the area of the surface structure and the photoluminescent layer covered with the thermally conductive member 146 may affect the characteristics of the light-emitting device 100. Thus, the area of the thermally conductive member 146 on a surface of the light-emitting device 100 should be minimized.

Figure 58A:
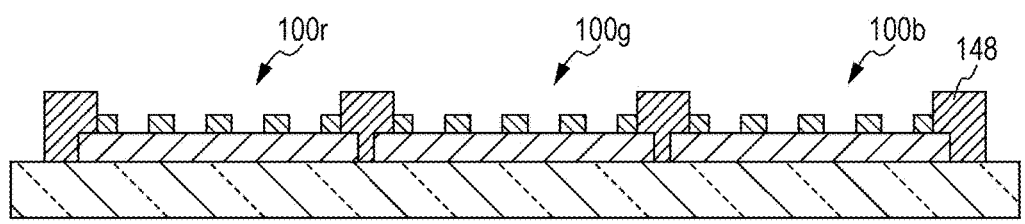
Figure 58B:
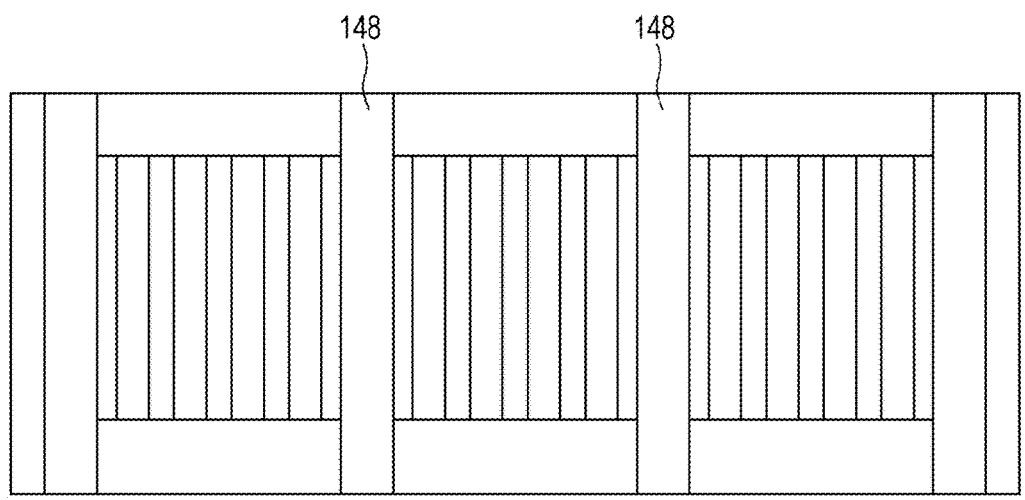

As illustrated in a cross-sectional view of FIG. 58A and a plan view of FIG. 58B, in tiled light-emitting devices 100r, 100g, and 100b having different structures, a thermally conductive member 148 may be disposed between adjacent light-emitting devices so as to cover end portions of the light-emitting devices. For example, as illustrated in these figures, in an array of the light-emitting device 100r that enhances red light, the light-emitting device 100g that enhances green light, and the light-emitting device 100b that enhances blue light, the thermally conductive member 148 made of a metal may be disposed between adjacent light-emitting devices. For example, the thermally conductive member 148 has the light-shielding effect and can reduce color mixing. Thus, the thermally conductive member 148 may be used as a black matrix in display panels.

13. Light-Emitting Apparatus with Interlock Circuit

Figure 59A:
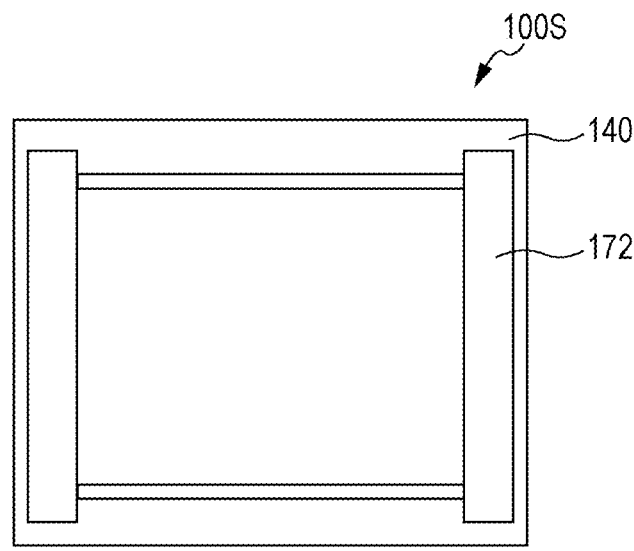
Figure 59B:
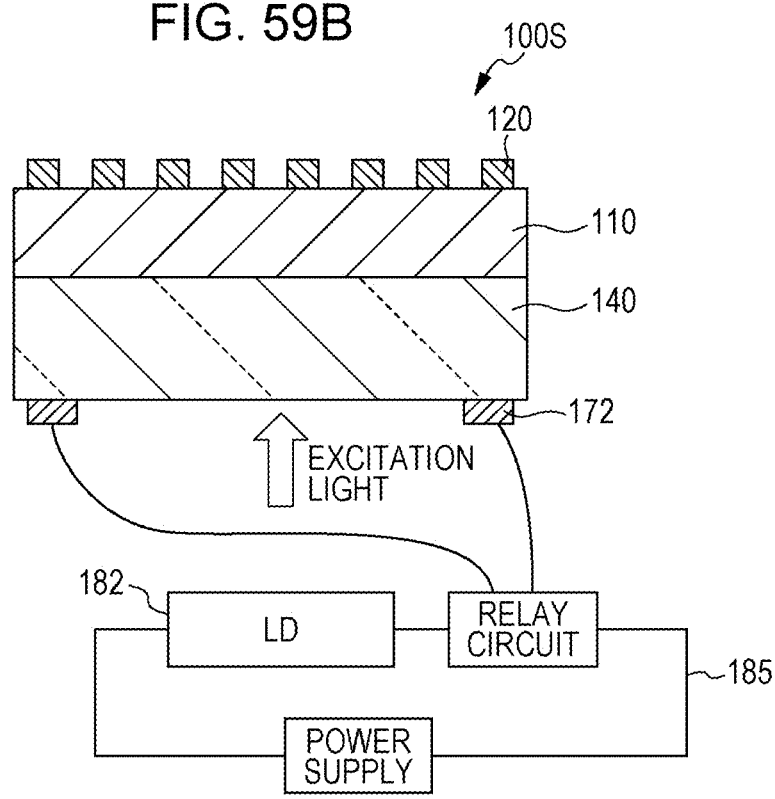

FIGS. 59A and 59B illustrate a light-emitting apparatus including an interlock circuit 185. FIG. 59A is a schematic view of the back side of the light-emitting device 100S in the light-emitting apparatus. FIG. 59B is a schematic view of the light-emitting apparatus, including a cross-sectional view of the light-emitting device 100S. As illustrated in FIGS. 59A and 59B, a closed electric wire 172 is disposed on the back side of the substrate 140 of the light-emitting device 100S. The closed electric wire 172 is disposed along the periphery of the back side of the light-emitting device 100S and is configured to break when the substrate 140 is broken. The closed electric wire 172 may be made of a metallic material. Two terminals of the closed electric wire 172 are electrically connected to a relay circuit of the interlock circuit 185. When the closed electric wire 172 is broken, the relay circuit will stop supplying an electric power to a laser diode 182 serving as a light source. In particular, in the case where the light source emits high-intensity light as in laser diodes, it is advantageous to provide the interlock circuit 185 from a safety standpoint.

14. Use of Beads

The surface structures of the light-emitting devices according to these embodiments may be periodic structures and may be formed by photolithography or nanoprinting. Other methods for forming a submicron structure will be described below with reference to FIGS. 60A to 60F.

As illustrated in FIG. 60A, beads 122 are disposed on a surface of a photoluminescent layer 110 supported by a substrate 140. Each of the beads 122 can be partly embedded at regular intervals in the photoluminescent layer 110 and thereby fixed to the photoluminescent layer 110. In this way, each of the beads 122 may be partly embedded in the photoluminescent layer 110 at regular intervals and partly protrude from the photoluminescent layer 110. In such a structure, the refractive index of the beads 122 may be equal to or lower than the refractive index of the photoluminescent layer 110. For example, if the beads 122 have a lower refractive index than the photoluminescent layer 110, a layer composed of the beads 122 (both the portions protruding from the photoluminescent layer 110 and the portions embedded in the photoluminescent layer 110) can function as a surface structure 120. If the beads 122 have substantially the same refractive index as the photoluminescent layer 110, the beads 122 and the photoluminescent layer 110 act as substantially one body, and the portions protruding from the photoluminescent layer 110 function as a surface structure 120.

Alternatively, as illustrated in FIG. 60B, beads 122 may be disposed on a substrate 140 and may be covered with a photoluminescent layer 110. The beads 122 typically have a lower refractive index than the photoluminescent layer 110.

The beads 122 may have a diameter smaller than or equal to the $D_{int}$. If the beads 122 are densely packed, the beads 122 have substantially the same diameter as the $D_{int}$. If the beads 122 have a gap therebetween, the sum of the diameter of the beads 122 and the length of the gap corresponds to the $D_{int}$. The beads 122 may be hollow beads or solid beads.

FIGS. 60C to 60F illustrate various packing of beads (the left side) and the light scattering pattern of packed beads (the right side). In the left figures of FIGS. 60C to 60F, black portions indicate solid portions of solid or hollow beads, and white portions indicate hollow beads or void portions of hollow beads.

FIG. 60C illustrates densely packed hollow beads having an egg-shaped external shape and a light scattering pattern of the hollow beads. The void portions of the hollow beads are generally spherical and are located at the bottom of the eggs. FIG. 60D illustrates densely packed hollow beads having a generally spherical external shape and a light scattering pattern of the hollow beads. The void portions of the hollow beads are generally spherical and are in contact with each external sphere. FIG. 60E illustrates densely packed hollow beads having a generally spherical external shape and a light scattering pattern of the hollow beads. Each void portion of the hollow beads includes two generally spherical voids, and the two spherical voids are arranged along the diameter of the external sphere. FIG. 60F illustrates dense packing of hollow beads each having a generally spherical external shape and solid beads each having a generally spherical external shape, and a light scattering pattern of the packed beads. The hollow beads and solid beads have substantially the same diameter and are mixed at a volume ratio of approximately 50:50. The hollow beads and solid beads are almost randomly arranged without regularity.

Hollow beads and solid beads made of various glasses and resins are commercially available. For example, these beads may be an alumina powder widely commercially available as an abrasive or hollow silica manufactured by Nittetsu Mining Co., Ltd. These beads and a dispersant may be dispersed in a solvent (for example, water or an alcohol), and the dispersion liquid may be applied to a substrate 140 or a photoluminescent layer 110 and dried to form a layer of densely packed beads.

15. Application Examples

As described above, light-emitting devices and light-emitting apparatuses including the light-emitting devices according to the present disclosure have various advantages and can be used with advantageous effects in various optical devices. Some application examples will be described below.

A light-emitting device according to the present disclosure can emit directional light in a particular direction. Such high directionality can be utilized in edge-light backlight units that include a light guide plate of a liquid crystal display unit. For example, when a known light source having low directionality is used, light from the light source is directed to a light guide plate through a reflector and/or a diffuser. In the case of a light source having high directionality in a particular direction, light can be efficiently directed to a light guide plate without these optical components.

In optical devices, light from a light source must be efficiently directed in a predetermined direction. Thus, optical devices include a lens, a prism, and/or a reflector, for example. For example, it is known that a projector includes a light guide to direct light from a light source to a display panel (for example, Japanese Unexamined Patent Application Publication No. 2010-156929). The content of Japanese Unexamined Patent Application Publication No. 2010-156929 is incorporated herein by reference in its entirety. The use of a light-emitting device according to the present disclosure as a light source can remove the light guide.

Known lighting fixtures include an optical component, including a lens and/or a reflector, to direct isotropic light in a desired direction. The use of a light-emitting device according to the present disclosure can remove such an optical component. The use of a light-emitting device according to the present disclosure allows for a simple design for directional light instead of a complex design for isotropic light. Consequently, lighting fixtures can be reduced in size, or the process of designing lighting fixtures can be simplified.

A light-emitting device according to the present disclosure can selectively enhance light having a particular wavelength. Thus, a light source that emits light having a required wavelength can be relatively easily provided. The wavelength of output light can be adjusted by changing the periodic structure without changing the material of the photoluminescent layer. Furthermore, the wavelength of output light can be changed with the angle relative to the periodic structure. Such wavelength selectivity can be used for a narrow-band imaging (NBI, registered trademark) technique, for example. A light-emitting device according to the present disclosure can also be used for visible light communication.

In the field of illumination, color-enhancing light color illumination and beautifying light color illumination techniques have been developed. Such illumination can finely produce the color of an object to be illuminated. The color-enhancing light color illumination is effective in making foods, such as vegetables, look more delicious. The beautifying light color illumination is effective in ensuring natural-looking skin tones. Such illumination is performed by controlling the spectrum of the light source (the intensity distribution as a function of light wavelength) for each object. Hitherto, the spectrum of illumination light has been controlled by selective transmission of light emitted from a light source using an optical filter. The optical filter absorbs unnecessary light and consequently decreases light-use efficiency. In contrast, a light-emitting device according to the present disclosure can enhance light having a particular wavelength and requires no optical filter, thus improving light-use efficiency.

A light-emitting device according to the present disclosure can emit polarized light (linearly polarized light). When unpolarized light including two linearly polarized light components intersecting at right angles is emitted from a light source, linearly polarized light has hitherto been produced by absorbing one of the two linearly polarized light components with a polarizing filter, such as a polarizer. Thus, the light-use efficiency is 50% or less. The use of a light-emitting device according to the present disclosure as a polarized light source can obviate the need for a polarizing filter and improve light-use efficiency. Polarized illumination is used to reduce reflected light, for example, from windowpanes of shop windows and view restaurants. Polarized illumination is also used as washstand illumination, which utilizes the dependence of the reflection characteristics of the skin surface on polarized light, and is used to facilitate the observation of lesion sites with an endoscope.

A polarized light source can be used as a backlight for liquid crystal display units and as a light source for liquid crystal projectors. When a light-emitting device according to the present disclosure is used as a light source for liquid crystal projectors, in combination with the use of the wavelength selectivity, the light-emitting device can constitute a three-primary-color polarized light source. For example, a light-emitting device that emits red linearly polarized light, a light-emitting device that emits green linearly polarized light, and a light-emitting device that emits blue linearly polarized light may be joined together to form a disk. While the disk is irradiated with excitation light, the disk may be rotated to form a light source that successively emits red, green, and blue three-primary-color polarized light beams.

As illustrated in FIG. 61, a light-emitting device according to the present disclosure may also be used as a screen 300S of a transparent display apparatus. For example, the screen 300S includes pixels arranged in a matrix. Each of the pixels is composed of a light-emitting device that can enhance red light (R), a light-emitting device that can enhance green light (G), and a light-emitting device that can enhance blue light (B). These light-emitting devices can emit light of a predetermined color upon receiving their respective excitation light (for example, ultraviolet light) emitted from an excitation light source 180S1, thereby displaying an image. Because the light-emitting devices transmit visible light, observers can observe the background through the screen 300S. When the screen 300S is not irradiated with excitation light, the screen 300S looks like a transparent window. Scanning a laser diode as the excitation light source 180S1 while adjusting its output for image data enables high resolution display. Since a laser beam is coherent light, its excitation efficiency can also be increased by interference with a periodic structure. When ultraviolet light is used as excitation light, a leakage of the undesirable light can be prevented by placing an excitation light source on the opposite side of the screen 300S from the observer and placing a filter for removing the excitation light on the observer side of the screen 300S.

The screen 300S may have high directionality. Thus, only observers in a predetermined direction can observe images.

The excitation light source 180S1 may be replaced with an excitation light source 180S2. A light guide sheet S is placed on the back side of the screen 300S (that is, opposite the observer) and is irradiated with excitation light from the excitation light source 180S2. Excitation light incident on the light guide sheet S propagates through the light guide sheet S and is applied to the back side of the screen 300S. When light-emitting devices are arranged according to a desired image, the screen 300S can be transparent like a window in the absence of excitation light and can display images, figures, and letters when irradiated with excitation light.

As described above with reference to FIGS. 7 and 8, a change in the refractive index of a periodic structure of a light-emitting device according to the present disclosure results in a different wavelength and output direction of enhanced light. The wavelength and output direction of enhanced light also change with the refractive index of a photoluminescent layer. Thus, a change in the refractive index of a medium around the light-emitting device can be easily detected with high sensitivity. For example, a sensor for detecting various substances can be provided using a light-emitting device according to the present disclosure, as described below.

A substance (such as an enzyme) that selectively binds to a substance to be measured (such as a protein, odorant molecule, or virus) is located on or near a periodic structure of a light-emitting device according to the present disclosure. When the substance to be measured binds to the substance located on or near the periodic structure, this changes the refractive index of a medium around the light-emitting device. The change in the refractive index can be detected as a change in the wavelength or output direction of enhanced light, as described above. Thus, the presence of various substances can be detected.

These embodiments can be combined as long as no contradiction arises. Application examples of a light-emitting device according to the present disclosure are not limited to those described above. A light-emitting device according to the present disclosure can be applied to various optical devices.

Light-emitting devices and light-emitting apparatuses according to the present disclosure can be applied to various optical devices, such as lighting fixtures, displays, and projectors.

What is claimed is:

1. A light-emitting device comprising a layered structure between a first layer and a second layer, the first layer having a refractive index n1 for first light having a wavelength $\lambda_a$ in air, the second layer having a refractive index n2 for the first light, the layered structure comprising:

a photoluminescent layer having a first surface facing the first layer and a second surface facing the second layer; and a surface structure disposed on at least one selected from the group consisting of the first surface and the second surface of the photoluminescent layer, the surface structure having projections and recesses, wherein the photoluminescent layer emits the first light upon receiving excitation light, the refractive index n1 and the refractive index n2 are lower than a refractive index $n_{wav-a}$ of the photoluminescent layer for the first light and satisfy a relationship n1>n2, and the layered structure has an effective thickness to more strongly emit TE polarized light than TM polarized light.

2. The light-emitting device according to claim 1, wherein at least one selected from the group consisting of a portion of the first layer and a portion of the second layer is disposed in the recesses of the surface structure, and an effective thickness $t_{eff}$ satisfies the following relational expressions (1) and (2), wherein $t_{wav}$ denotes a thickness of the photoluminescent layer, h denotes a thickness of the surface structure, $n_p$ denotes a refractive index of the surface structure for the first light, $R_v$ denotes a ratio of a volume of the recesses to a volume of the projections and the recesses, and m is an integer.

$$\frac{\lambda_a}{2\pi\sqrt{n_{wav-a}^2 - n1^2}}\left[\tan^{-1}\left(\sqrt{\frac{n1^2 - n2^2}{n_{wav-a}^2 - n1^2}}\right) + m\pi\right] < t_{eff} < \quad (1)$$

$$\frac{\lambda_a}{2\pi\sqrt{n_{wav-a}^2 - n1^2}}\left[\tan^{-1}\left(\frac{n_{wav-a}^2}{n2^2}\sqrt{\frac{n1^2 - n2^2}{n_{wav-a}^2 - n1^2}}\right) + m\pi\right]$$

$$t_{eff} = t_{wav} + (1 - R_v) \cdot h \cdot \frac{n_p}{n_{wav-a}}. \quad (2)$$

3. The light-emitting device according to claim 1, wherein the photoluminescent layer includes discrete belt-like portions, the surface structure is disposed on the belt-like portions, at least one selected from the group consisting of a portion of the first layer and a portion of the second layer is disposed in the recesses of the surface structure, and an effective thickness $t_{eff}$ satisfies the following relational expressions (3) and (4), wherein $t_{wav}$ denotes a thickness of the belt-like portions, h denotes a thickness of the surface structure, $n_p$ denotes a refractive index of the surface structure for the first light, $R_v$ denotes a ratio of a volume of the recesses to a volume of the projections and the recesses, and m is an integer.

$$\frac{\lambda_a}{2\pi\sqrt{n_{wav-a}^2 - n1^2}}\left[\tan^{-1}\left(\sqrt{\frac{n1^2 - n2^2}{n_{wav-a}^2 - n1^2}}\right) + m\pi\right] < t_{eff} < \quad (3)$$

$$\frac{\lambda_a}{2\pi\sqrt{n_{wav-a}^2 - n1^2}}\left[\tan^{-1}\left(\frac{n_{wav-a}^2}{n2^2}\sqrt{\frac{n1^2 - n2^2}{n_{wav-a}^2 - n1^2}}\right) + m\pi\right]$$

$$t_{eff} = t_{wav} + (1 - R_v) \cdot h \cdot \frac{n_p}{n_{wav-a}}. \quad (4)$$

4. A light-emitting device comprising a layered structure between a first layer and a second layer, the first layer having a refractive index n1 for first light having a wavelength $\lambda_a$ in air, the second layer having a refractive index n2 for the first light, the layered structure comprising:

a light guiding layer having a first surface facing the first layer and a second surface facing the second layer; and a surface structure disposed on at least one selected from the group consisting of the first surface and the second surface of the light guiding layer, the surface structure having projections and recesses, wherein the light guiding layer includes a photoluminescent layer that emits the first light upon receiving excitation light and that has a refractive index $n_{wav-a}$ for the first light, and an intermediate layer disposed between the surface structure and the photoluminescent layer, the intermediate layer having a refractive index $n_m$ for the first light, the refractive index n1 and the refractive index n2 are lower than a refractive index of the light guiding layer for the first light and satisfy a relationship n1>n2, and the layered structure has an effective thickness to more strongly emit TE polarized light than TM polarized light.

5. The light-emitting device according to claim 4, wherein at least one selected from the group consisting of a portion of the first layer and a portion of the second layer is disposed in the recesses of the surface structure, and an effective thickness $t_{eff}$ satisfies the following relational expressions (5) and (6), wherein $t_{wav}$ denotes a thickness of the photoluminescent layer, h denotes a thickness of the surface structure, $t_m$ denotes a thickness of the intermediate layer, $n_p$ denotes a refractive index of the surface structure for the first light, $R_v$ denotes a ratio of a volume of the recesses to a volume of the projections and the recesses, and m is an integer.

$$\frac{\lambda_a}{2\pi\sqrt{n_{wav-a}^2 - n1^2}}\left[\tan^{-1}\left(\sqrt{\frac{n1^2 - n2^2}{n_{wav-a}^2 - n1^2}}\right) + m\pi\right] < t_{eff} < \tag{5}$$

$$\frac{\lambda_a}{2\pi\sqrt{n_{wav-a}^2 - n1^2}}\left[\tan^{-1}\left(\frac{n_{wav-a}^2}{n2^2}\sqrt{\frac{n1^2 - n2^2}{n_{wav-a}^2 - n1^2}}\right) + m\pi\right]$$

$$t_{eff} = t_{wav} + (1 - R_v) \cdot h \cdot \frac{n_p}{n_{wav-a}} + t_m \cdot \frac{n_m}{n_{wav-a}}. \tag{6}$$

6. The light-emitting device according to claim 4, wherein the photoluminescent layer includes discrete belt-like portions,
the surface structure is disposed on the belt-like portions,
at least one selected from the group consisting of a portion of the first layer and a portion of the second layer is disposed in the recesses of the surface structure, and
the effective thickness $t_{eff}$ satisfies the following relational expressions (7) and (8), wherein $t_{wav}$ denotes a thickness of the belt-like portions, h denotes a thickness of the surface structure, $t_m$ denotes a thickness of the intermediate layer, $n_p$ denotes a refractive index of the surface structure for the first light, $R_v$ denotes a ratio of a volume of the recesses to a volume of the projections and the recesses, and m is an integer.

$$\frac{\lambda_a}{2\pi\sqrt{n_{wav-a}^2 - n1^2}}\left[\tan^{-1}\left(\sqrt{\frac{n1^2 - n2^2}{n_{wav-a}^2 - n1^2}}\right) + m\pi\right] < t_{eff} < \tag{7}$$

$$\frac{\lambda_a}{2\pi\sqrt{n_{wav-a}^2 - n1^2}}\left[\tan^{-1}\left(\frac{n_{wav-a}^2}{n2^2}\sqrt{\frac{n1^2 - n2^2}{n_{wav-a}^2 - n1^2}}\right) + m\pi\right]$$

$$t_{eff} = t_{wav} + (1 - R_v) \cdot h \cdot \frac{n_p}{n_{wav-a}} + t_m \cdot \frac{n_m}{n_{wav-a}}. \tag{8}$$

7. The light-emitting device according to claim 3, wherein the belt-like portions are separately arranged in a first direction, and
the projections and the recesses extend in the first direction.

8. The light-emitting device according to claim 7, wherein the projections and the recesses are arranged perpendicularly to the first direction.

9. The light-emitting device according to claim 7, wherein a length of the belt-like portions in the first direction is not more than four times a distance $D_{int}$ between two adjacent projections or between two adjacent recesses.

10. The light-emitting device according to claim 7, wherein a length of the belt-like portions in the first direction is 2 μm or less.

11. The light-emitting device according to claim 1, wherein the first layer or the second layer is a substrate that supports the photoluminescent layer.

12. The light-emitting device according to claim 11, wherein the photoluminescent layer is in direct contact with the substrate.

13. The light-emitting device according to claim 1, wherein the first layer or the second layer is air.

14. The light-emitting device according to claim 1, wherein a distance $D_{int}$ between two adjacent projections or between two adjacent recesses in the surface structure satisfies a relationship $(\lambda_a/n_{wav-a}) < D_{int} < \lambda_a$.

15. The light-emitting device according to claim 1, wherein
the projections or the recesses constitute at least one periodic structure, and
the at least one periodic structure has a period p that satisfies a relationship $(\lambda_a/n_{wav-a}) < p < \lambda_a$.

16. The light-emitting device according to claim 6, wherein
the belt-like portions are separately arranged in a first direction, and
the projections and the recesses extend in the first direction.

17. The light-emitting device according to claim 16, wherein the projections and the recesses are arranged perpendicularly to the first direction.

18. The light-emitting device according to claim 16, wherein a length of the belt-like portions in the first direction is not more than four times a distance $D_{int}$ between adjacent projections or between adjacent recesses.

19. The light-emitting device according to claim 1, wherein the photoluminescent layer and the surface structure are integrated.

20. The light-emitting device according to claim 4, wherein the photoluminescent layer and the surface structure are integrated.

21. The light-emitting device according to claim 3, wherein the belt-like portions include the first surface and the second surface.

22. The light-emitting device according to claim 6, wherein the belt-like portions include the first surface and the second surface.

* * * * *